United States Patent
Matsuura et al.

(10) Patent No.: US 8,686,885 B2
(45) Date of Patent: Apr. 1, 2014

(54) SEMICONDUCTOR INTEGRATED CIRCUIT DEVICE

(71) Applicant: Renesas Electronics Corporation, Kawasaki (JP)

(72) Inventors: Tatsuji Matsuura, Kawasaki (JP); Hideo Nakane, Kawasaki (JP); Masumi Kasahara, Kawasaki (JP); Ryuichi Ujiie, Kawasaki (JP); Keisuke Kimura, Kawasaki (JP); Oshima Takashi, Moriya (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/744,284

(22) Filed: Jan. 17, 2013

(65) Prior Publication Data
US 2013/0249720 A1    Sep. 26, 2013

(30) Foreign Application Priority Data
Jan. 20, 2012   (JP) ................................ 2012-009657

(51) Int. Cl.
*H03M 1/10*        (2006.01)

(52) U.S. Cl.
USPC ........................... 341/120; 341/118; 341/155

(58) Field of Classification Search
USPC ........................................ 341/118, 120, 155
See application file for complete search history.

(56) References Cited

U.S. PATENT DOCUMENTS 6,670,900 B1 *  12/2003  Zhang ........................... 341/118
6,700,514 B2 *   3/2004  Soltanian et al. ............. 341/118
7,843,369 B2 *  11/2010  Takahashi et al. ............ 341/120

OTHER PUBLICATIONS

T. Oshima, et al., "Fast nonlinear deterministic calibration of pipelined A/D converters," IEEE 2008 Midwest Symposium on Circuits and Systems, Session C2L-C-1, Aug. 2008.
T. Oshima, et al., "23-mW 50-MS/s 10-bit pipeline A/D converter with nonlinear LMS foreground calibration," 2009 International Symposium on Circuits and Systems, pp. 960-963, May 2009.
J. Mcneill, et al., "A split-ADC architecture for deterministic digital background calibration of a 16b 1MS/s ADC," IEEE 2005 International Solid-State Circuits Conference, pp. 276-277, Feb. 2005.
W. Liu et al., "A 12b 22.5/45MS/s 3.0mW 0.059mm2 CMOS SAR ADC achieving over 90dB SFDR," IEEE 2010 International Solid-State Circuits Conference, pp. 380-381, Feb. 2010.

* cited by examiner

*Primary Examiner* — Khai M Nguyen
(74) *Attorney, Agent, or Firm* — McGinn IP Law Group, PLLC

(57) ABSTRACT

A semiconductor integrated circuit device having A/D converters for converting, by means of digital correction processing, analog input signals into digital signals is reduced in area. The semiconductor integrated circuit device has a first A/D converter and a second A/D converter. In a first mode, a first test signal is inputted to both the first and second A/D converters, and a first correction coefficient for the first A/D converter and a second correction coefficient for the second A/D converter are calculated. In a second mode, the first A/D converter converts a first analog signal into a first digital signal by subjecting the first analog signal to a first digital correction processing and the second A/D converter converts a second analog signal into a second digital signal by subjecting the second analog signal to a second digital correction processing.

20 Claims, 16 Drawing Sheets

SEMICONDUCTOR INTEGRATED CIRCUIT DEVICE

CROSS-REFERENCE TO RELATED APPLICATIONS

The disclosure of Japanese Patent Application No. 2012-009657 filed on Jan. 20, 2012 including the specification, drawings and abstract is incorporated herein by reference in its entirety.

BACKGROUND

The present invention relates to a semiconductor integrated circuit device and, more particularly, to a semiconductor integrated circuit device for communication processing and to a semiconductor integrated circuit device having an A/D (analog-to-digital) converter.

An A/D converter (ADC) is disclosed in each of the following four non-patent documents: T. Oshima, et al., "Fast nonlinear deterministic calibration of pipelined A/D converters," IEEE 2008 Midwest Symposium on Circuits and Systems, Session C2L-C-1, August 2008; T. Oshima, et al., "23-mW 50-MS/s 10-bit pipeline A/D converter with nonlinear LMS foreground calibration," 2009 International Symposium on Circuits and Systems, pp. 960-963, May 2009; J. Mcneill, et al., "A split-ADC architecture for deterministic digital background calibration of a 16b 1 MS/s ADC," IEEE 2005 International Solid-State Circuits Conference, pp. 276-277, February 2005; W. Liu et al., "A 12b 22.5/45 MS/s 3.0 mW 0.059 mm2 CMOS SAR ADC achieving over 90 dB SFDR," IEEE 2010 International Solid-State Circuits Conference, pp. 380-381, February 2010. An ADC includes an A/D conversion unit (ADCU) which receives an analog signal and a digital correction unit (DCU) which receives the output of the ADCU. An ADC including such an ADCU and a DCU can operate at high speed with high accuracy with low power consumption.

SUMMARY

The present inventors have studied the configuration and operation of each ADC disclosed in the above four non-patent documents. Prior to studying the four ADCs, the present inventors drew the configurations of the four ADCs as shown in FIGS. 1 to 4 for easy comprehension. Namely, FIGS. 1 to 4 do not represent related art technologies, but they are reference drawings. In the following, FIGS. 1 to 4 will be referred to as reference drawings FIGS. 1 to 4.

The ADC 11 shown in reference drawing FIG. 1 includes an A/D conversion unit for reference (RADCU) 13, an ADCU 12, a DCU 14, and an error calculation unit (ECU) 15.

The ADC 11 is configured to allow an analog signal (Input) to be inputted to both the RADCU 13 and the ADCU 12. Compared with the ADCU 12, the RADCU 13 performs analog-to-digital conversion (A/D conversion) at low speed with high accuracy. Compared with the RADCU 13, the ADCU 12 performs A/D conversion processing at high speed with low accuracy.

The ADCU 12 has a predetermined clock (CK) signal to be a reference signal for A/D conversion processing inputted thereto. The RADCU 13 has a clock signal generated by dividing the predetermined clock signal using a frequency divider (DIV) 18 inputted thereto. A digital output outputted from the ADCU 12 as the result of A/D conversion processing performed therein is inputted to the DCU 14. The DCU 14 digitally corrects the output from the ADCU 12 using a correction coefficient and outputs a digital signal (Output) as the result of A/D conversion processing performed on the analog signal (Input) at the ADC 11.

The ECU 15 calculates the difference between the digital signal outputted from the DCU 14 and the digital signal outputted from the RADCU 13 and outputs the calculated difference as a conversion error (e) to the DCU 14. Based on the conversion error (e), the DCU 14 searches for a correction efficient using an LMS (Least Means Square) algorithm which is an adaptive control method. In cases in which it is known that expression (A=ΣWi·Di) is satisfied where Di is input data, A is output, and Wi is a coefficient, the LMS algorithm is used to estimate Wi based on many samples of Di and A.

The ADC 11 can perform background correction. In background correction, calculation of a correction coefficient for digital correction processing is performed simultaneously with A/D conversion processing by use of the calculated correction coefficient, thereby causing a correction coefficient to be calculated. Since the output of the ADCU 12 operating at high speed with low accuracy is digitally corrected at the DCU 14, a high-speed, high-accuracy digital output signal (Output) can be obtained.

In the case of the ADC 11, however, it is necessary to have both the ADCU 12 and the RADCU 13 provided in the semiconductor integrated circuit device. This causes such problems as: increases in design man-hours and design cost; and an increase in space requirement resulting in a cost increase or resulting in hindering reducing the area occupied by the semiconductor integrated circuit device.

The ADC 21 shown in reference drawing FIG. 2 includes a switch circuit SC, a digital/analog (D/A) conversion unit (RDACU) 23, an ADCU 22, a DCU 24, and an error calculation unit (ECU) 25.

When, in the switch circuit SC, switch SW1 is off and switch SW2 is on, a digital test signal (Test Input) is inputted to the RDACU 23 to be processed for D/A conversion therein and, as the result of the D/A conversion processing, an analog test signal is outputted from the RDACU 23 to the ADCU 22 to be processed for A/D conversion therein. Compared with the ADCU 22, the RDACU 23 performs D/A conversion processing at low speed with high accuracy. Compared with the RDACU 23, the ADCU 22 performs A/D conversion processing at high speed with low accuracy. The ADCU 22 has a predetermined clock (CK) signal to be used as a reference signal for A/D conversion processing inputted thereto. The RDACU 23 has a clock signal generated by dividing the predetermined clock signal using a frequency divider (DIV) 28 inputted thereto. The ECU 25 calculates the difference between the digital signal outputted from the DCU 24 as the result of digital correction processing and the digital test signal (Test Input) and outputs the calculated difference as a conversion error (e) to the DCU 24. Based on the conversion error (e), the DCU 24 searches for a correction coefficient using an LMS algorithm.

When, in the switch circuit SC, switch SW1 is on and switch SW2 is off, an analog signal (Input) is inputted to the ADCU 22. The digital output of the ADCU 22 is inputted to the DCU 24 as the result of A/D conversion processing performed at the ADCU 22. The DCU 24 digitally corrects the digital output from the ADCU 22 using a correction coefficient and outputs a digital signal (Output) as the result of A/D conversion processing performed on the analog signal (Input) by the ADC 21. In doing this, the DCU 24 uses a correction coefficient obtained when, in the switch circuit SC, switch SW1 is off and SW2 is on.

In the ADC 21, foreground correction is performed. In foreground processing, a correction coefficient for digital correction processing is calculated in a first mode whereas A/D conversion processing is performed using the calculated correction coefficient in a second mode temporally separated from the first mode, thereby causing a correction coefficient to be calculated. The mode entered when, in the switch circuit SC, switch SW1 is off and switch SW2 is on is the first mode. The mode entered when, in the switch circuit SC, switch SW1 is on and switch SW2 is off is the second mode. Since the output of the ADCU 22 operating at high speed with low accuracy is digitally corrected at the DCU 24, a high-speed, high-accuracy digital output signal (Output) can be obtained.

In the case of the ADC 21, however, it is necessary to have both the ADCU 22 and the RDACU 23 provided in the semiconductor integrated circuit device. This causes such problems as: increases in design man-hours and design cost; and an increase in space requirement resulting in a cost increase or resulting in hindering reducing the area occupied by the semiconductor integrated circuit device.

The ADC 31 shown in reference drawing FIG. 3 includes a first A/D conversion unit (ADCU(1)) 32a, a second A/D conversion unit (ADCU(2)) 32b, a first digital correction unit (DCU (1)) 34a, a second digital correction unit (DCU(2)) 34b, an error calculation unit (ECU) 35, an output signal addition/averaging unit (OAAU) 36, and a dither difference unit (DDU) 37.

An analog signal (Input) is inputted to each of the ADCU (1) 32a and the ADCU(2) 32b. A first dither signal (Dither1) is inputted to the ADCU(1) 32a. A second dither signal (Dither2) differing from Dither1 in sign and equaling Dither1 in absolute value is inputted to the ADCU(2) 32b. The dither signals are each a DC offset voltage used to effectively calculate a correction coefficient. The digital outputs representing the results of A/D conversion processing performed at the ADCU(1) 32a and ADCU(2) 32b are inputted to the DCU(1) 34a and DCU(2) 34b, respectively.

The DCU(1) 34a and the DCU(2) 34b digitally correct the digital outputs of the ADCU(1) 32a and ADCU(2) 32b using correction coefficients and output the digitally corrected results to the OAAU 36. The OAAU 36 adds the outputs of the DCU(1) 34a and DCU(2) 34b, divides the sum by two for averaging, and outputs a digital signal (Output) as the result of A/D conversion processing performed on the analog signal (Input) by the ADC 31.

The ECU 35 calculates the difference between the digital signal from the DCU(1) 34a and the digital signal from the DCU(2) 34b and outputs the calculated difference to the DDU 37. The DDU 37 subtracts 2α from the output of the ECU 35, where 2α=Dither1−Dither2, and outputs the result to each of the DCU(1) 34a and the DCU(2) 34b as a conversion error (e). Based on the conversion error (e), the DCU(1) 34a and the DCU(2) 34b each search for a correction coefficient using an LMS algorithm.

The ADC 31 can perform background correction. Background correction is performed because, with Dither1 and Dither2 differing from each other in sign and equaling each other in absolute value, the dither signal components cancel each other at the OAAU 36. Furthermore, since the outputs of the ADCU(1) 32a and ADCU(2) 32b operating at high speed with low accuracy are digitally corrected at the DCU(1) 34a and the DCU(2) 34b, a high-speed, high-accuracy digital output signal (Output) can be obtained.

The ADC 31, however, requires one pair each of A/D conversion units and digital correction units, i.e. the ADCU (1) 32a, ADCU(2) 32b, DCU(1) 34a and DCU(2) 34b, so that, compared with a configuration requiring one each of A/D conversion unit and digital correction unit, the configuration of the ADC 31 requires larger space resulting in a cost increase and in hindering reducing the area occupied by the semiconductor integrated circuit device.

The ADC 41 shown in reference drawing FIG. 4 includes an ADCU 42, a DCU(1) 44a, a DCU(2) 44b, a delay unit (Delay) 49, an error calculation unit (ECU) 45, an output signal addition/averaging unit (OAAU) 46, and a dither difference unit (DDU) 47.

An analog signal (Input) is inputted to the ADCU 42. A first dither signal (Dither1) and a second dither signal (Dither2) differing from Dither1 in sign and equaling Dither1 in absolute value are also inputted to the ADCU 42.

The operation of the ADCU 42 will be described below with reference to the A/D conversion unit sequence (ADCU Sequence) shown in reference drawing FIG. 4. In a sampling period (S), an analog signal (Input) is sampled. In the subsequent first A/D conversion period (A/D1), the ADCU 42 converts the sampled analog signal (Input) and Dither1 added to the ADCU 42 into a digital signal and outputs the digital signal as the result of a first A/D conversion (A/D1R). In the subsequent second A/D conversion period (A/D2), the ADCU 42 converts the sampled analog signal (Input) and Dither2 added to the ADCU 42 into a digital signal and outputs the digital signal as the result of a second A/D conversion (A/D2R). The Delay 49 outputs A/D1R to the DCU(1) 44a after delaying it by the second A/D conversion period (A/D2), causing A/D1R to be inputted to the DCU(1) 44a at the same time as A/D2R is inputted to the DCU(2).

The DCU(1) 44a and DCU(2) 44b digitally correct A/D1R and A/D2R using correction coefficients, respectively, and output the results of digital correction to the OAAU 46. The OAAU 46 adds the outputs of the DCU(1) 43 and DCU(2) 44b, divides the sum by two for averaging, and outputs an averaged digital signal (Output) as the result of A/D conversion processing performed by the ADCU 41.

The ECU 45 calculates the difference between A/D1R received from the DCU(i) 44a and A/D2R received from the DCU(2) 44b and outputs the calculated difference to the dither difference unit (DDU) 47. The DDU 47 subtracts 2α from the output of the ECU 45 and outputs the result of the subtraction as a conversion error (e) to both the DCU(1) 44a and the DCU(2) 44b. Based on the conversion error (e), the DCU(i) 44a and the DCU(2) 44b each search for a correction coefficient using an LSM algorithm.

The ADC 41 can perform background correction. Background correction is performed because, with Dither1 and Dither2 differing from each other in sign and equaling each other in absolute value, the dither signal components cancel each other at the OAAU 46. Furthermore, since the output of the ADCU 42 operating at high speed with low accuracy is digitally corrected at the DCU(1) 44a and the DCU(2) 44b, a high-speed, high-accuracy digital output signal (Output) can be obtained.

The ADC 41, however, requires one pair of digital correction units, i.e. the DCU(1) 44a and DCU(2) 44b, so that, compared with a configuration requiring one each of A/D conversion unit and digital correction unit, the configuration of the ADC 41 requires larger space resulting in a cost increase and in hindering reducing the area occupied by the semiconductor integrated circuit device.

The semiconductor integrated circuit device according to an embodiment of the present invention has a first A/D converter and a second A/D converter. In a first mode, a first test signal is inputted to both the first A/D converter and the second A/D converter and a first correction coefficient for the first A/D converter and a second correction coefficient for the second A/D converter are calculated. In a second mode, the first A/D converter performs first digital correction processing using the first correction coefficient thereby converting a first analog signal into a first digital signal and the second A/D converter performs second digital processing using the second correction coefficient thereby converting a second analog signal into a second digital signal.

According to the above embodiment, the space required for a semiconductor integrated circuit device can be reduced.

DETAILED DESCRIPTION

The present inventors came up with a configuration (hereinafter referred to as the "basic configuration") of an A/D converter operable at high speed with high accuracy and with low power consumption in a semiconductor integrated circuit device for communication processing.

The basic configuration includes an A/D converter for I signal to perform A/D conversion processing in which an analog I signal is converted into a digital signal and then undergoes digital correction processing and an A/D converter for Q signal to perform A/D conversion processing in which an analog Q signal is converted into a digital signal and then undergoes digital correction processing.

The present inventors considered that, in the basic configuration, either background correction or foreground correction is to be performed as digital correction processing.

When a semiconductor integrated circuit device having the above basic configuration in which foreground correction is performed as digital correction processing is to be designed, one of the foregoing four A/D converters ADC 11, ADC 21, ADC 31, and ADC 41 is considered applicable to each of the A/D converter for I signal and the A/D converter for Q signal. When any of the foregoing four A/D converters is applied, a large-area circuit for use in the first mode only is required. This hinders reducing the area occupied by the semiconductor integrated circuit device as follows.

Figure 1:
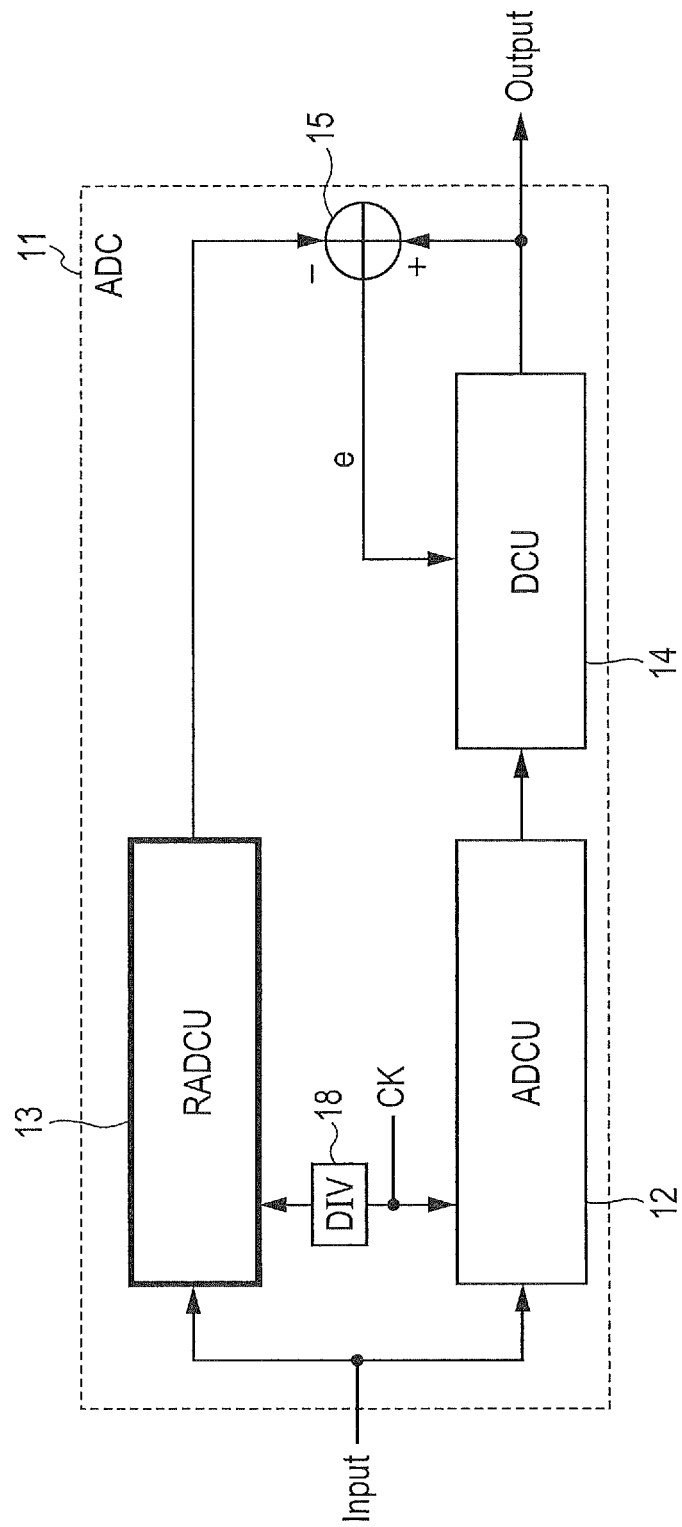
FIG. 1 is a configuration diagram, modified for easy comprehension, showing the A/D converter described in the first non-patent literature referred to above.
Figure 2:
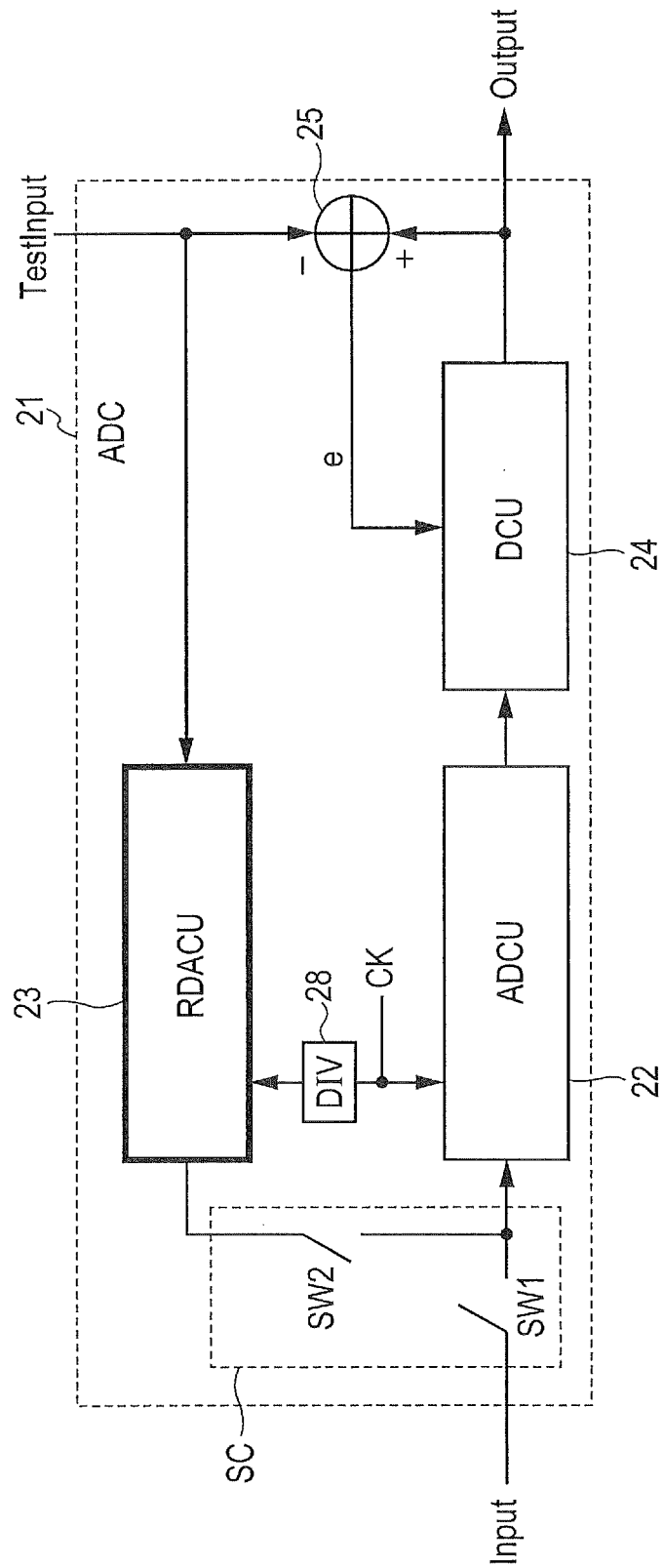
FIG. 2 is a configuration diagram, modified for easy comprehension, showing the A/D converter described in the second non-patent literature referred to above.
Figure 3:
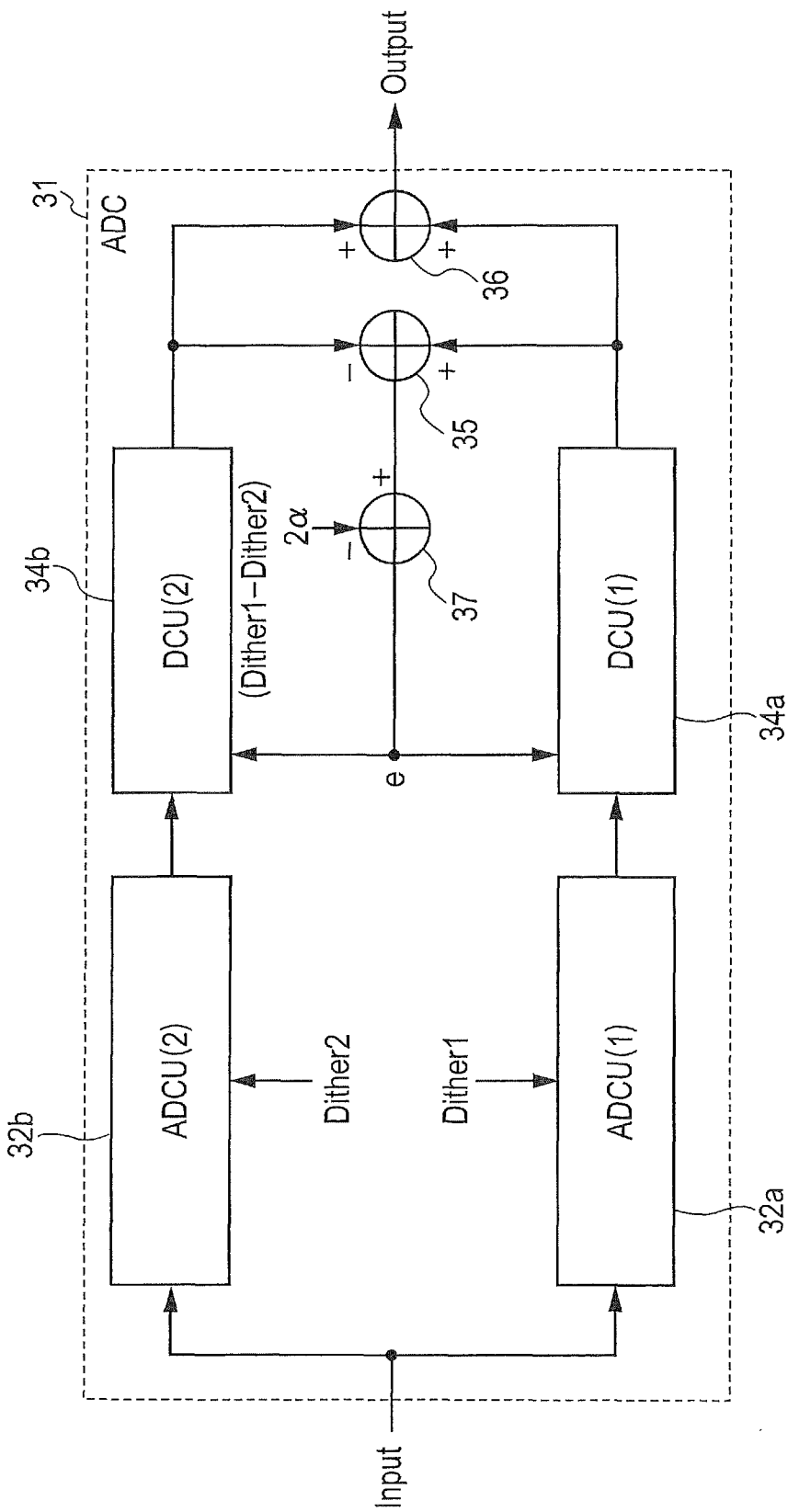
FIG. 3 is a configuration diagram, modified for easy comprehension, showing the A/D converter described in the third non-patent literature referred to above.
Figure 4:
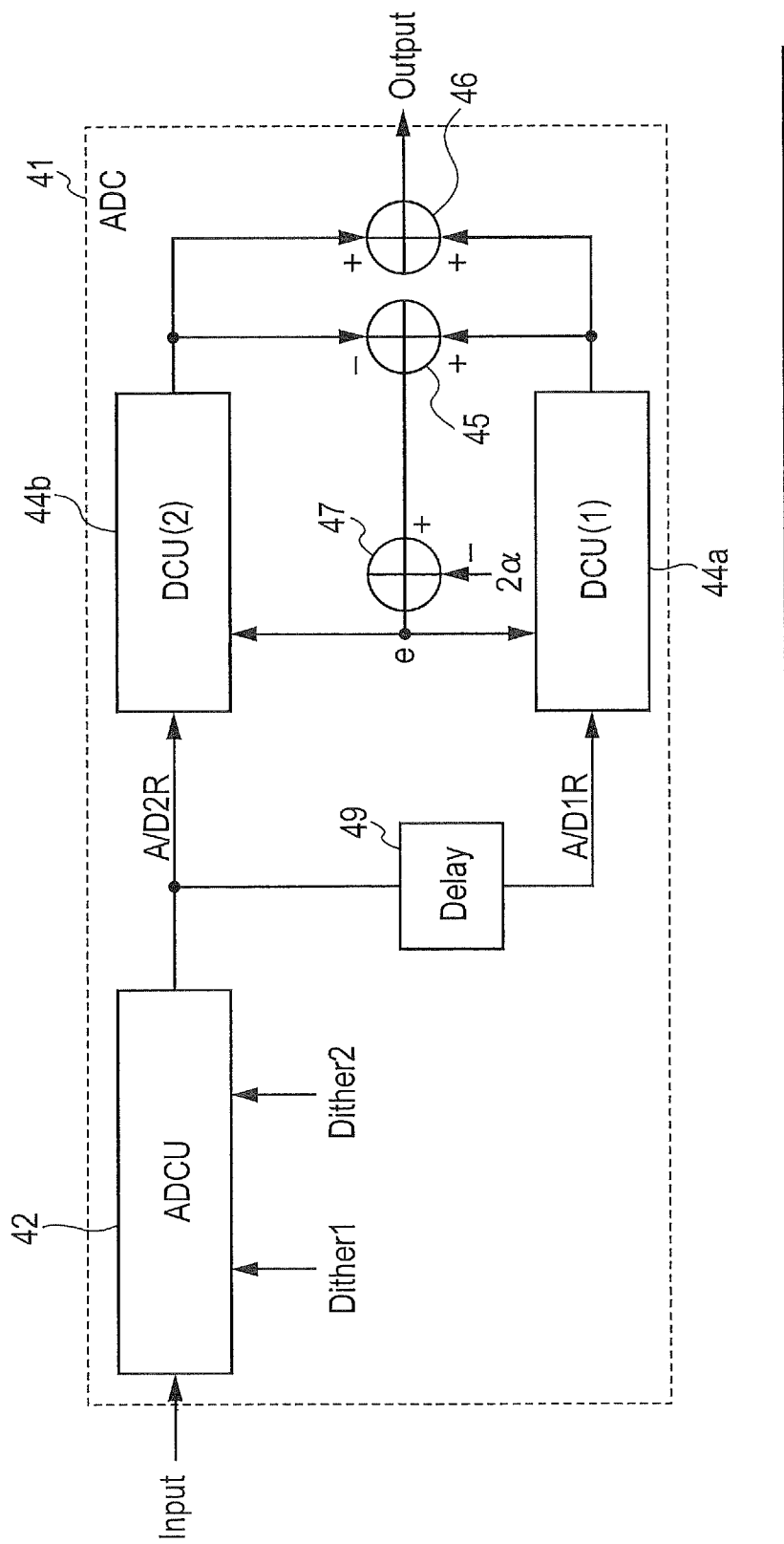
FIG. 4 is a configuration diagram, modified for easy comprehension, showing the A/D converter described in the fourth non-patent literature referred to above along with a corresponding operation sequence chart.

When the ADC 11, 21, 31, or 41 is applied to the basic configuration, two ADCs, one each for I signal and for Q signal, are required. In a case where the ADC 11 shown in reference drawing FIG. 1 is applied, it is not necessary to use two RADCUs 13 in the second mode in which the conversion error (e) need not be calculated. Namely, only in the first mode, it is necessary to use two RADCUs 13. In a case where the ADC 21 shown in reference drawing FIG. 2 is applied, it is not necessary to use two RDACUs 23 in the second mode in which the conversion error (e) need not be calculated. Namely, only in the first mode, it is necessary to use two RDACUs 23. When the ADC 31 shown in reference drawing FIG. 3 is applied, as many as four ADCUs and four DCUs are included, but two ADCUs and two DCUs among them are not used in the second mode. Namely, in the second mode in which the conversion error (e) need not be calculated, only one pair of the ADC and ADCU is required for I signal and another pair of the ADC and ADCU is required for Q signal. When the ADC 41 shown in reference drawing FIG. 4 is applied, the DCU(1) 44a or the DCU(2) 44b is not required in the second mode in which the conversion error (e) need not be calculated. Because, in the second mode, it is possible to stop inputting the dither signals to the ADCU 42 and to use the output of either the DCU(1) 44a or the DCU(2) 44b as the output of the ADC 41 as it is, so that the DCU(1) 44a or the DCU(2) 44b need not be operated. Namely, the DCU(1) 44a or the DCU(2) 44b is a circuit to be used in the first mode only.

The circuits described above as not required in the second mode occupy large areas to hinder reducing the area occupied by the semiconductor integrated circuit device.

Furthermore, when a semiconductor integrated circuit device having the above basic configuration and being capable of foreground correction is to be designed by applying the ADC 11, ADC 21, ADC 31 or ADC 41 to each of the A/D converters for I signal and for Q signal, an additional problem is posed. Namely, in the first mode, the circuits occupying a large area and required in the first mode only as well as the circuits occupying a large area and required in both the first mode and the second mode operate. This hinders reducing the power consumption by the semiconductor integrated circuit device. This is further described below.

As described above, two ADCUs are required. Therefore, when the ADC 11 shown in reference drawing FIG. 1 is applied, two each of RADCUs, ADCUs, and DCUs operate in the first mode. When the ADC 21 shown in reference drawing FIG. 2 is applied, two each of RDACUs, ADCUs, and DCUs operate in the first mode. When the ADC 31 shown in reference drawing FIG. 3 is applied, four each of ADCUs and DCUs operate in the first mode. In all cases, power consumption increases. The RADCU, RDACU and ADCU, in particular, are analog circuits which are, in many cases, used along with operational amplifiers so as to obtain satisfactory performance. Since such operational amplifiers are configured with circuits to consume large power, the power consumption of the ADC 31 increases in the first mode. When the ADC 41 shown in reference drawing FIG. 4 is applied, two ADCUs and four DCUs operate in the first mode. This increases power consumption. Also, at least in the first mode, every time an analog signal is sampled, it becomes necessary to perform A/D conversion processing twice at ADCUs in order to calculate a conversion error (e). Since this makes it necessary to perform A/D conversion processing at ADCUs at high speed, power consumption increases in the first mode. Particularly, when the ADCUs include operational amplifiers, it becomes necessary to operate the operational amplifiers at high speed, resulting in correspondingly large power consumption. This hinders reducing the power consumption of the semiconductor integrated circuit device.

The ADC 11, ADC 31, and ADC 41 can perform background correction. Assume that background correction is to be performed in a semiconductor integrated circuit device having the above basic configuration and that the ADC 11, ADC 31 or ADC 41 is applied to each of the A/D converters for I signal and for Q signal. In this case, reducing the power consumption of the semiconductor integrated circuit device is hindered as follows.

Background correction has nothing to do with such modes as the first mode and the second mode, so that the following occurs whenever A/D conversion processing is performed.

Two ADCUs, i.e. one each for I signal and for Q signal, are required. Therefore, when the ADC 11 shown in reference drawing FIG. 1 is applied, two each of RADCUs, ADCUs, and DCUs operate whenever A/D conversion processing is performed. When the ADC 31 shown in reference drawing FIG. 3 is applied, four each of ADCUs and DCUs operate whenever A/D conversion processing is performed. In these cases, therefore, the power consumption is larger than the power consumption of a semiconductor integrated circuit device in which foreground correction is performed using the first mode and the second mode. Particularly, as described above, the power consumption of the RADCUs, RDACUs, and ADCUs at the time of conversion processing poses a problem. When the ADC 41 shown in reference drawing FIG. 4 is applied, two ADCUs and four DCUs operate whenever conversion processing is performed, so that the power consumption becomes larger than in a semiconductor integrated circuit device which uses the first mode and the second mode and is capable of foreground correction. Furthermore, as described above, in order to calculate a conversion error (e) whenever A/D conversion processing is performed, it is necessary, every time an analog signal is sampled, to perform A/D conversion processing twice at ADCUs. Since this makes it necessary to perform A/D conversion processing at ADCUs at high speed, power consumption increases.

In view of the above description, for the following configuration (1) and function (2), it is preferable performance-wise to apply the ADC 11, ADC 21, ADC 31, or ADC 41 to each of the A/D converters for I signal and for Q signal.

(1) A semiconductor integrated circuit device having an A/D converter for I signal which effects A/D conversion processing by digitally correcting a digital signal generated by subjecting an analog I signal to A/D conversion and an A/D converter for Q signal which effects A/D conversion processing by digitally correcting a digital signal generated by subjecting an analog Q signal to A/D conversion.

(2) Foreground correction performed in an A/D converter for I signal and an A/D converter for Q signal Still, a semiconductor integrated circuit device having an A/D converter for I signal and an A/D converter for Q signal poses a problem in terms of reducing the area occupied by the semiconductor integrated circuit device and reducing the power consumption of the semiconductor integrated circuit device.

Because, when the ADC 11, ADC 21, ADC 31, or ADC 41 is applied to the foregoing basic configuration to perform either background correction or foreground correction, it becomes necessary to add a large-area, power-consuming circuit for calculating correction coefficients. This results in hindering reducing the area occupied by and the power consumption of the semiconductor integrated circuit device.

The embodiments being described below have been devised in view of what has been described above.

In the following, the description will be divided into two or more sections or will range over two or more embodiments as required for the sake of convenience. Unless otherwise expressed, such sections and embodiments are not mutually irrelevant. For example, among such sections and embodiments, one is a partial or total modification or application of another, or one elaborates or supplements the description of another. Also, numbers referred to in the following description of embodiments (for example, numbers representing counts, values, amounts, or ranges) are not defined values, that is, they may be smaller or larger unless otherwise expressed or except when they are apparently defined in principle.

Furthermore, the constituent elements (including operations, timing charts and operation steps) of the following embodiments are not necessarily indispensable unless otherwise expressed or except when they are considered apparently indispensable in principle. Similarly, the shapes of and positional relationships between constituent elements referred to in the following description are inclusive of those substantially close to or similar to them unless otherwise expressed or except when such shapes and positional relationships are apparently considered strictly defined in principle. This also applies to the numbers (for example, numbers representing counts, values, amounts, or ranges).

The embodiments of the present invention will be described in the following based on drawings. Note that, in all drawings referred to in describing the following embodiments, parts and members having identical functions are denoted by identical or related reference numerals and that duplicate descriptions of such parts and members are omitted. Also, in principle, the descriptions of identical or similar parts of the following embodiments will not be repeated unless such descriptions are considered required.

First Embodiment

Figure 5:
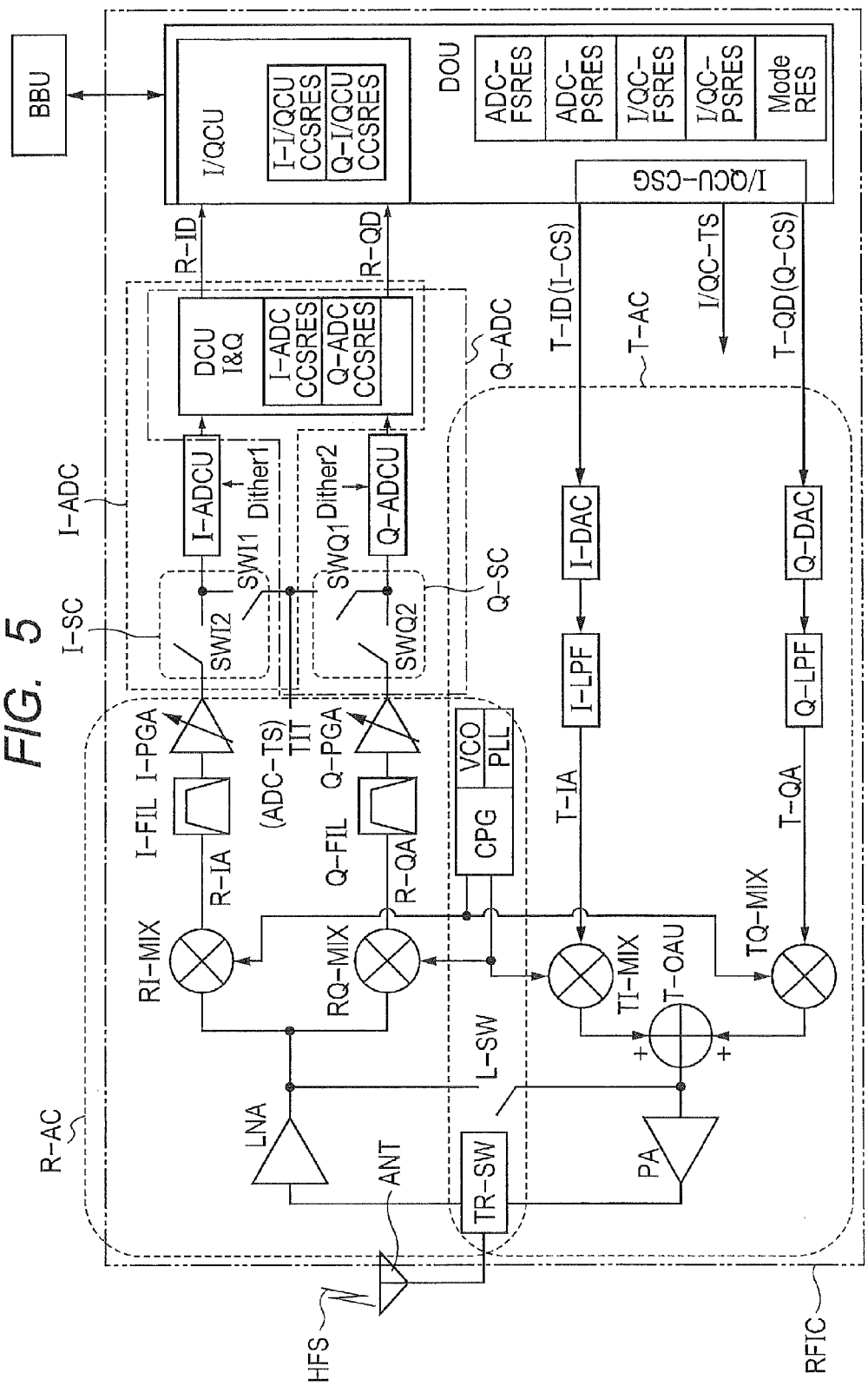
FIG. 5 is a configuration diagram of a communication system including a semiconductor integrated circuit device according to a first embodiment of the present invention.
Figure 6:
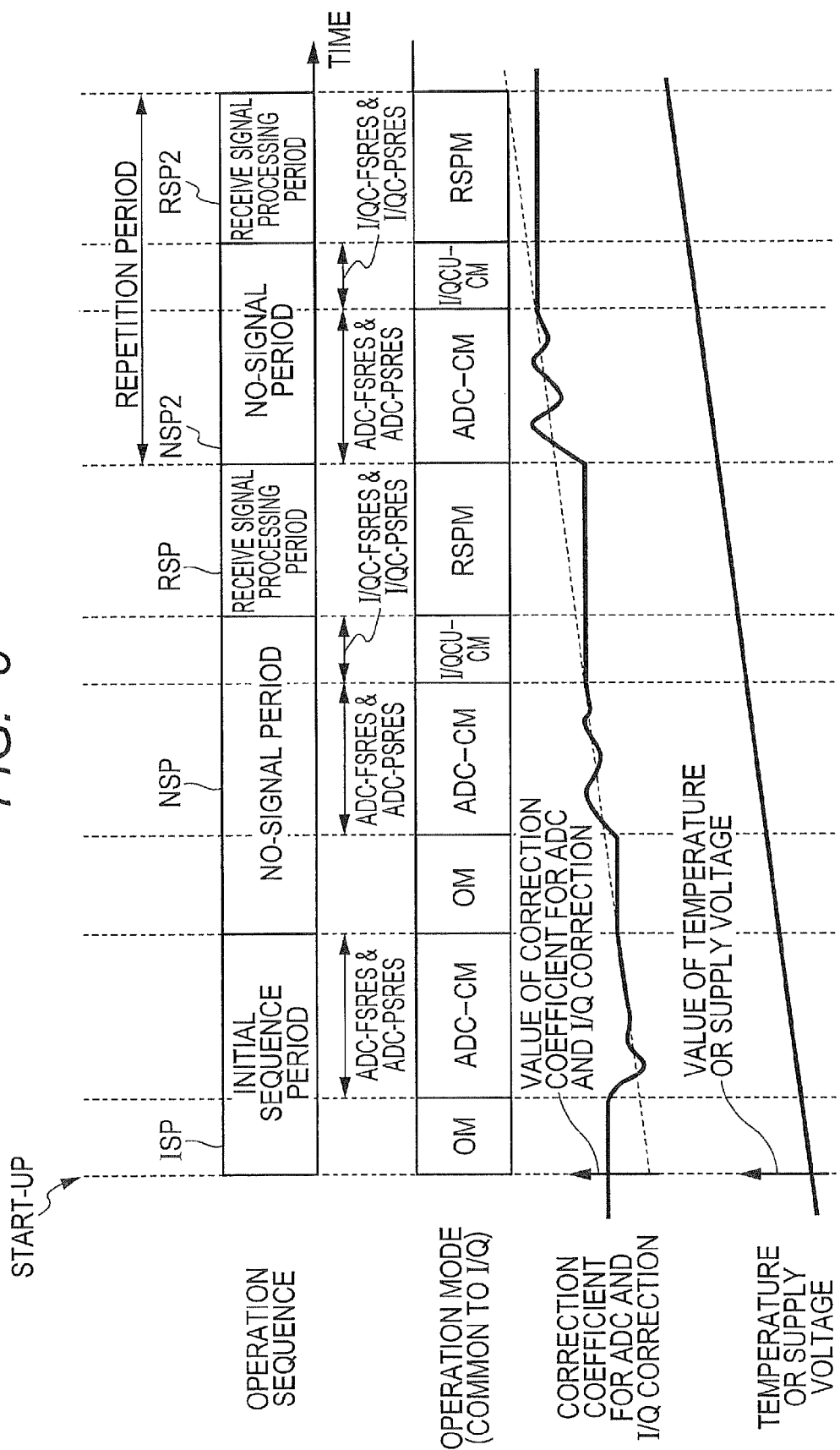
FIG. 6 is an operation chart of a communication system including the semiconductor integrated circuit device according to the first embodiment of the present invention.
Figure 7:
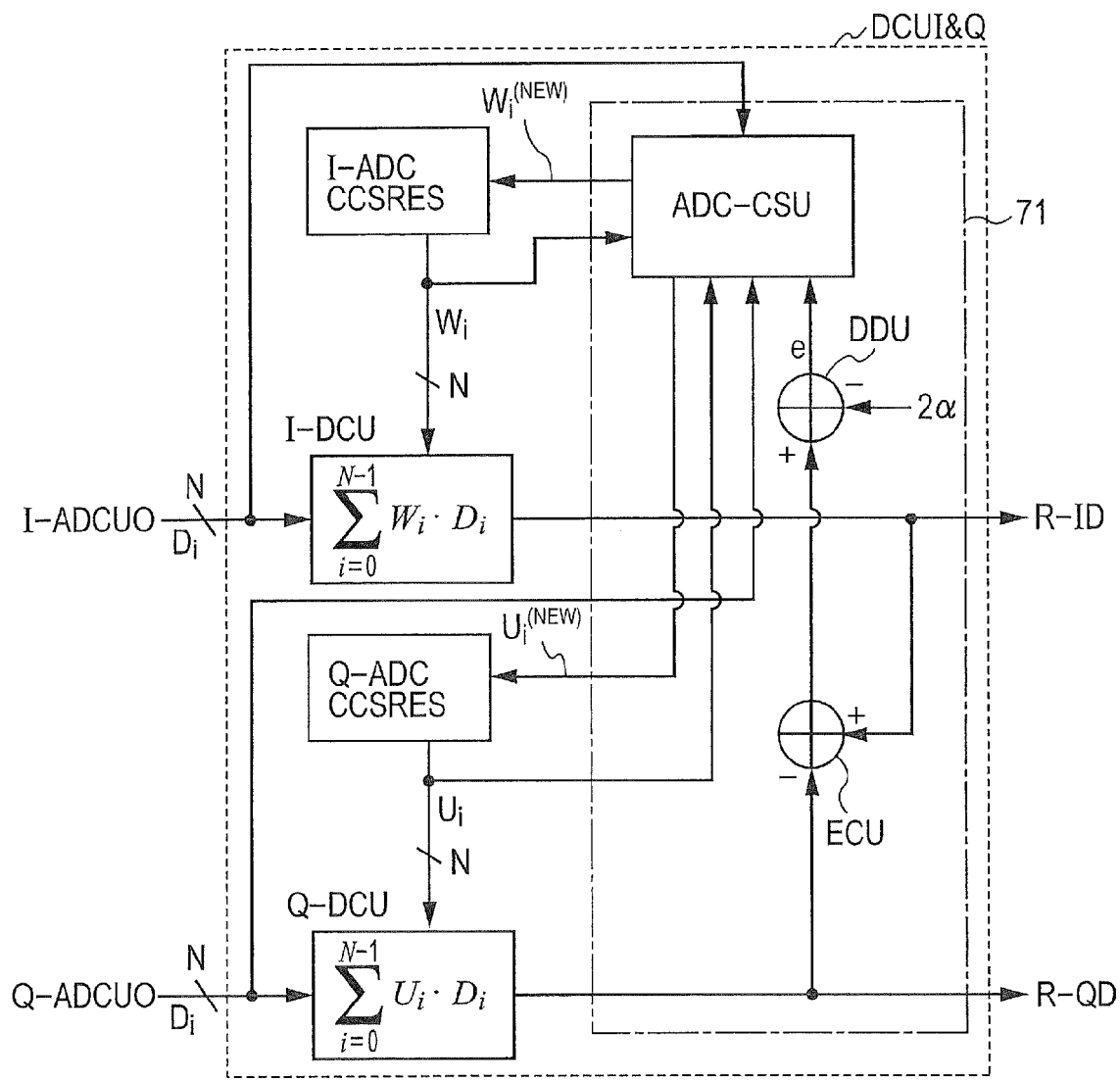
FIG. 7 is a configuration diagram showing a digital correction unit for I/Q signal according to the first embodiment of the present invention.
Figure 8:
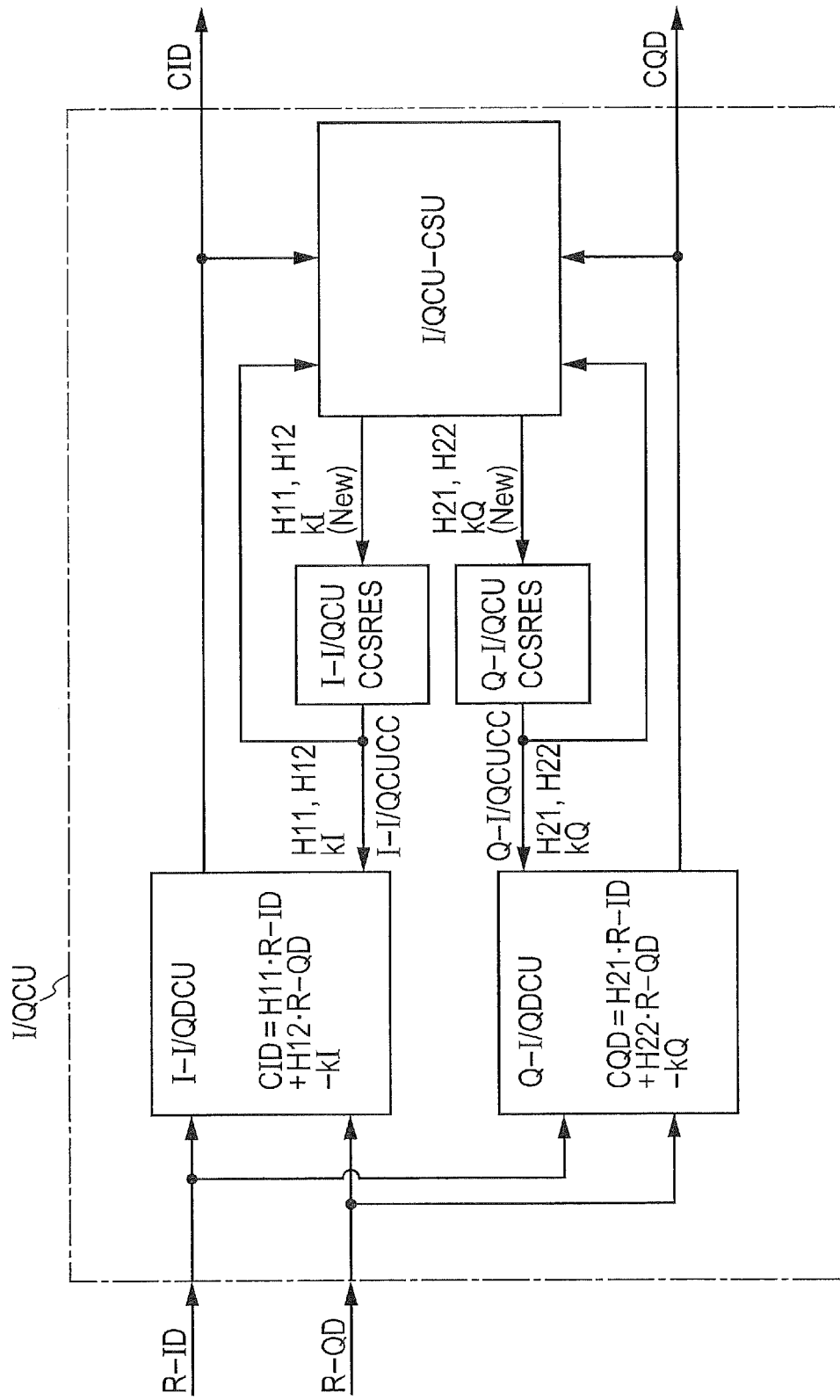
FIG. 8 is a configuration diagram showing an I/Q correction unit according to the first embodiment of the present invention.

The configuration and operation of a semiconductor integrated circuit device and a communication system including the semiconductor integrated circuit device according to a first embodiment of the present invention will be described in detail below. FIG. 5 is a diagram showing the configuration of the communication system including the semiconductor integrated circuit device. FIG. 6 is a diagram showing operation of the communication system including the semiconductor integrated circuit device. FIG. 7 is a diagram showing the configuration of a digital correction unit for I and Q signals included in the semiconductor integrated circuit device. FIG. 8 is a diagram showing the configuration of an I/Q correction unit included in the semiconductor integrated circuit device.

1. Configuration

With reference to FIG. 5, the configurations of the semiconductor integrated circuit device and the communication system including the semiconductor integrated circuit device will be described below.

(1) Communication System

The communication system according to the present embodiment has an antenna ANT, a semiconductor integrated circuit device RFIC for wireless communication and a base-band processing unit BBU. The antenna ANT receives a high-frequency signal HFS as a communication signal from outside. The semiconductor integrated circuit device RFIC for wireless communication, enclosed by a two-dot chain line in FIG. 5, demodulates, by downward conversion, the high-frequency signal HFS into base-band signals. The base-band processing unit BBU receives the base-band signals, then, by digitally processing the received base-band signals, analyzes the communication signal and performs required data processing. The semiconductor integrated circuit device RFIC is compatible with GSM (Global System Mobile Communication), WCDMA (Wide Band CDMA) and LTE (Long Term Evolution).

(2) Semiconductor Integrated Circuit Device

The semiconductor integrated circuit device RFIC has an analog circuit R-AC, an A/D converter I-ADC, an A/D converter Q-ADC, a digital processing unit DOU, and an analog circuit T-AC. In FIG. 5, the analog circuit R-AC is enclosed by a chain line. The analog circuit R-AC receives a high-frequency signal HFS via the antenna ANT and generates an analog I signal R-IA and an analog Q signal R-QA which is 90 degrees apart in phase from the analog I signal R-IA. The analog I signal R-IA and the analog Q signal R-QA are also said to be orthogonal to each other. In reality, however, due to process variations involved, they are not strictly 90 degrees apart from each other. The A/D converter I-ADC, enclosed by a chain line in FIG. 5, receives an analog I signal R-IA and, by processing the received analog I signal R-IA for A/D conversion, generates a digital I signal R-ID. The A/D converter Q-ADC, enclosed by a chain line in FIG. 5, receives an analog Q signal R-QA and, by processing the received analog Q signal R-QA for A/D conversion, generates a digital Q signal R-QD. The digital processing unit DOU receives a digital I signal R-ID and a digital Q signal R-QD, then, by digitally processing the received digital I signal R-ID and digital Q signal R-QD, generates base-band signals and outputs the generated base-band signals to the base-band processing unit BBU. The analog circuit T-AC, enclosed by a chain line in FIG. 5, receives a digital I signal T-ID and a digital Q signal T-QD, which are based on the base-band signals outputted from the base-band processing unit BBU, from the digital processing unit DOU and, by modulating the digital I signal T-ID and digital Q signal T-QD, generates a high-frequency signal to be outputted.

The I signal is an in-phase signal and the Q signal is a quadrature-phase signal.

The analog circuit R-AC, the A/D converter I-ADC, the AD converter Q-ADC, the digital processing unit DOU, and the analog circuit T-AC excepting the power amplifier PA being described later are formed over a first semiconductor substrate. The power amplifier PA is formed over a second semiconductor substrate. The first semiconductor substrate and the second semiconductor substrate are sealed into a single package making up the semiconductor integrated circuit device RFIC. The power amplifier PA may be made discrete from the semiconductor integrated circuit device RFIC and the second semiconductor substrate may be removed. Each of the base-band processing unit BBU and the antenna ANT is a semiconductor integrated circuit device discrete from the semiconductor integrated circuit device RFIC.

(a) Analog Circuit for Reception

The analog circuit R-AC has a transmission/reception changeover switch TR-SW, a low-noise amplifier LNA, a mixer RI-MIX, a mixer RQ-MIX, a filter I-FIL, and a filter Q-FIL. The analog circuit R-AC also has an I-variable amplifier I-PGA, a Q-variable amplifier Q-PGA, a clock pulse generator CPG, and a loop switch L-SW. The transmission/reception changeover switch TR-SW operates to input necessary components of the high-frequency signal HFS coming in via the antenna ANT to the analog circuit R-AC. The transmission/reception changeover switch TR-SW also operates to prevent unnecessary signal components from entering the analog circuit R-AC from the analog circuit T-AC. The low-noise amplifier LNA amplifies, with low noise, the high-frequency signal HFS received via the transmission/reception changeover switch TR-SW with a multiplying factor specified by the base-band processing unit BBU. The mixer RI-MIX down-converts, for conversion to a low frequency, the high-frequency signal HFS received from the low-noise amplifier LNA by mixing the high-frequency signal HFS with a first mixer signal which is a high-frequency signal of a predetermined frequency and thereby generates an analog I signal R-IA. The mixer RQ-MIX down-converts, for conversion to a low frequency, the high-frequency signal HFS received from the low-noise amplifier LNA by mixing the high-frequency signal HFS with a second mixer signal which is a high-frequency signal of a predetermined frequency shifted in phase 90 degrees from the first mixer signal and thereby generates an analog Q signal R-QA. The filter I-FIL receives the analog I signal R-IA from the mixer RI-MIX and, by passing a frequency band specified by the base-band processing unit BBU, outputs the analog I signal R-IA. The filter Q-FIL receives the analog Q signal R-QA from the mixer RQ-MIX and, by passing a frequency band specified by the base-band processing unit BBU, outputs the analog Q signal R-QA. The variable amplifier I-PGA receives the analog I signal R-IA from the filter I-FIL and outputs the analog I signal R-IA after amplifying it by a factor specified by the base-band processing unit BBU. The variable amplifier Q-PGA receives the analog Q signal R-QA from the filter Q-FIL and outputs the analog Q signal R-QA after amplifying it by a factor specified by the base-band processing unit BBU. The clock pulse generator CPG has a phase-locked loop PLL used to generate the first mixer signal and the second mixer signal and a voltage-controlled oscillator VCO which generates, based on the output from the phase-locked loop PLL, the first and second mixer signals each of which is a high-frequency signal matching in phase with a predetermined clock signal.

(b) A/D Converter for I Signal and A/D Converter for Q Signal (b-1) Configuration The A/D converter I-ADC has a test input terminal TIT, a switch circuit I-SC, an A/D conversion unit I-ADCU, and a digital correction unit DCUI&Q.

The A/D converter Q-ADC has the test input terminal TIT, a switch circuit Q-SC, an A/D conversion unit Q-ADCU, and the digital correction unit DCUI&Q. The test input terminal TIT and the digital correction unit DCUI&Q are shared with the A/D converter I-ADC.

(b-2) A/D Conversion Testing

The operation to take place with switch SWI1 on and switch SWI2 off in the switch circuit I-SC and with switch SWQ1 on and switch SWQ2 off in the switch circuit Q-SC will be described in the following. The operation will be referred to as "A/D conversion testing" in the following description of the present embodiment. In the present specification as a whole, the "A/D conversion testing" refers to operation to generate a correction coefficient for A/D conversion using a test signal ADC-TS.

The test signal ADC-TS is inputted to the A/D conversion unit I-ADCU via the switch circuit I-SC and to the A/D conversion unit Q-ADCU via the switch circuit Q-SC. In addition to the test signal ADC-TS, the A/D conversion unit I-ADCU also receives a first dither signal Dither1. The A/D conversion unit I-ADCU processes these input signals for A/D conversion and outputs the result to the digital correction unit DCUI&Q. The A/D conversion unit Q-ADCU receives a second dither signal Dither2 in addition to the test signal ADC-TS. The A/D conversion unit Q-ADCU processes these input signals for A/D conversion and outputs the result to the digital correction unit DCUI&Q.

The digital correction unit DCUI&Q has a correction coefficient setting register I-ADCCCSRES and a correction coefficient setting register Q-ADCCCSRES. The correction coefficient setting register I-ADCCCSRES is for storing a correction coefficient for use in digital correction processing performed at the A/D converter I-ADC. The correction coefficient setting register Q-ADCCCSRES is for storing a correction coefficient for use in digital correction processing performed at the A/D converter Q-ADC. The digital correction unit DCUI&Q holds the result of digital correction of the output from the A/D conversion unit I-ADCU and the result of digital correction of the output from the A/D conversion unit Q-ADCU. Based on these results of digital correction, a correction coefficient I-ADCCC to be stored in the correction coefficient setting register I-ADCCCSRES is determined and is stored in the correction coefficient setting register I-ADCCSRES. The correction coefficient I-ADCCC is represented by $W_i$ in FIG. 7. Similarly, a correction coefficient Q-ADCCC to be stored in the correction coefficient setting register Q-ADCCCSRES is determined and is stored in the correction coefficient setting register Q-ADCCCSRES. The correction coefficient Q-ADCCC is represented by $U_i$ in FIG. 7.

(b-3) A/D Conversion Operation

The operation to take place with switch SWI1 off and switch SWI2 on in the switch circuit I-SC and with switch SWQ1 off and switch SWQ2 on in the switch circuit Q-SC will be described in the following. The operation will be referred to as "A/D conversion operation" in the following description of the present embodiment. In the present specification as a whole, the "A/D conversion operation" refers to operation to subject an analog signal received from an analog circuit for reception to A/D conversion performed using a correction coefficient for A/D conversion determined in A/D conversion testing.

An analog I signal R-IA is inputted to the A/D conversion unit I-ADCU via the switch circuit I-SC. An analog Q signal R-QA is inputted to the A/D conversion unit Q-ADCU via the switch circuit Q-SC. The analog I signal R-IA inputted to the A/D conversion unit I-ADCU undergoes A/D conversion and the result is outputted to the digital correction unit DCUI&Q. The analog Q signal R-QA inputted to the A/D conversion unit Q-ADCU undergoes A/D conversion and the result is outputted to the digital correction unit DCUI&Q. The digital correction unit DCUI&Q digitally corrects the output from the A/D conversion unit I-ADCU using the correction coefficient I-ADCCC stored in the correction coefficient setting register I-ADCCCSRES. The digital correction unit DCUI&Q then outputs a digital I signal R-ID as the result of A/D conversion processing performed at the A/D converter I-ADC. Also, the digital correction unit DCUI&Q digitally corrects the output from the A/D conversion unit Q-ADCU using the correction coefficient Q-ADCCC stored in the correction coefficient setting register Q-ADCCCSRES. The digital correction unit DCUI&Q then outputs a digital Q signal R-QD as the result of A/D conversion processing performed at the A/D converter Q-ADC.

(c) Digital Processing Unit

The digital processing unit DOU has an I/Q correction unit I/QCU, a calibration signal generation circuit I/QCU-CSG, and a frequency setting register ADC-FSRES. The digital processing unit DOU further has a period setting register ADC-PSRES, a frequency setting register I/QC-FSRES, a period setting register I/QC-PSRES, and a mode setting register MRES. The I/Q correction unit I/QCU detects and corrects gain, phase and DC offset mismatches caused over the path between the mixer RI-MIX and the variable amplifier I-PGA in the analog circuit R-AC. The I/Q correction unit I/QCU also detects and corrects gain, phase and DC offset mismatches caused over the path between the mixer RQ-MIX and the variable amplifier Q-PGA in the analog circuit R-AC. The calibration signal generation circuit I/QCU-CSG generates a test signal I/QC-TS used to calculate a correction coefficient for the I/Q correction unit I/QCU.

The I/Q correction unit I/QCU has a correction coefficient setting register I-I/QCUCCSRES for storing correction coefficients I-I/QCUCC used to process the digital I signal R-ID. The correction coefficients I-I/QCUCC are represented by H11, H12, and kI in FIG. 8. The I/Q correction unit I/QCU also has a correction coefficient setting register Q-I/QCUCCSRES for storing correction coefficients Q-I/QCUCC used to process the digital Q signal R-QD. The correction coefficients Q-I/QCUCC are represented by H21, H22, and kQ in FIG. 8.

(d) Analog Circuit for Transmission

The analog circuit T-AC has a D/A converter I-DAC, a D/A converter Q-DAC, a low-pass filter I-LPF, and a low-pass filter Q-LPF. The analog circuit T-AC further has a mixer TI-MIX, a mixer TQ-MIX, an output addition unit T-OAU, and a power amplifier PA. The D/A converter I-DAC receives the digital I signal T-ID outputted, based on a base-band signal from the base-band processing unit BBU, from the digital processing unit DOU and, by processing the digital I signal T-ID for D/A conversion, generates an analog I signal T-IA. The D/A converter Q-DAC receives the digital Q signal T-QD outputted, based on a base-band signal from the base-band processing unit BBU, from the digital processing unit DOU and, by processing the digital Q signal T-QD for D/A conversion, generates an analog Q signal T-QA. The low-pass filter I-LPF receives the analog I signal T-IA from the D/A converter I-DAC and passes the signal component lower in frequency than a frequency specified by the base-band processing unit BBU. The low-pass filter Q-LPF receives the analog Q signal T-QA from the D/A converter Q-DAC and passes the signal component lower in frequency than a frequency specified by the base-band processing unit BBU. The mixer TI-MIX up-converts, for conversion to a high frequency, the analog I signal T-IA received from the low-pass filter I-LPF by mixing the analog I signal T-IA with a third mixer signal, which is a high-frequency signal of a predetermined frequency, and outputs the up-converted analog I signal T-IA. The mixer TQ-MIX up-converts, for conversion to a high frequency, the analog Q signal T-QA received from the low-pass filter Q-LPF by mixing the analog Q signal T-QA with a fourth mixer signal, which is a high-frequency signal of a predetermined frequency shifted in phase 90 degrees from the third mixer signal, and outputs the up-converted analog Q signal T-QA. The output addition unit T-OAU adds up the output from the mixer TI-MIX and the output from the mixer TQ-MIX thereby generating a high-frequency signal for transmission. The power amplifier PA amplifies the output from the output addition unit T-OAU.

The clock pulse generator CPG, the loop switch L-SW, and the transmission/reception changeover switch TR-SW are shared with the analog circuit R-AC. A predetermined frequency range of the signal outputted from the power amplifier PA is cut off by the transmission/reception changeover switch TR-SW to prevent noise from entering the analog circuit R-AC. The transmission/reception changeover switch TR-SW also cuts off a predetermined frequency range of the high-frequency signal HFS coming in via the antenna ANT to prevent noise from entering the power amplifier PA. Of the high-frequency signal for transmission, the component outputted from the power amplifier PA and transmitted via the transmission/reception changeover switch TR-SW is outwardly transmitted from the antenna ANT.

(e) I/Q Correction Testing

The operation to take place when a correction coefficient I-I/QCUCC and a correction coefficient Q-I/QCUCC are calculated will be described in the following. The operation will be referred to as "I/Q correction testing" in the following description of the present embodiment. In the present specification as a whole, the "I/Q correction testing" refers to operation to generate an I/Q correction coefficient based on an output from a calibration signal generation circuit I/QCU-CSG.

The loop switch L-SW turns on. A calibration signal I-CS is outputted from the calibration signal generation circuit I/QCU-CSG to the D/A converter I-DAC. Also, a calibration signal Q-CS is outputted from the calibration signal generation circuit I/QCU-CSG to the D/A converter Q-DAC. An A/D conversion operation is performed as follows.

Calibration signals I-CS and Q-CS are outputted to the analog circuit T-AC. In the analog circuit T-AC, the calibration signals I-CS and Q-CS undergo various conversion processings. The results of various conversion processings are outputted from the output addition unit T-OAU to be inputted to the analog circuit R-AC via the loop switch L-SW. The signals thus inputted to the analog circuit R-AC are inputted to the mixers RI-MIX and RQ-MIX where the respective signals undergo various conversion processings. As a result, an analog I signal R-IA is outputted to the A/D converter I-ADC and an analog Q signal R-QA is outputted to the A/D converter Q-ADC. The A/D converters I-ADC and Q-ADC perform A/D conversion operation and, as a result, a digital I signal R-ID and a digital Q signal R-QD are outputted to the I/Q correction unit I/QCU. The I/Q correction unit I/QCU processes the digital I signal R-ID and digital Q signal R-QD for correction and, based on the correction results, calculates correction coefficients I-I/QCUCC and Q-I/QCUCC.

(f) I/Q Correction Operation

The operation to take place when gain, phase and DC offset mismatches as described above are detected and corrected using the correction coefficients I-I/QCUCC and Q-I/QCUCC is described in the following. The operation will be referred to as "I/Q correction operation" in the following description of the present embodiment. In the present specification as a whole, the "I/Q correction operation" refers to operation to generate corrected digital signals by, using the I/Q correction coefficients calculated in I/Q correction testing, digitally correcting the digital signals received from the A/D converters.

The loop switch L-SW turns off. The calibration signal generation circuit I/QCU-CSG is disabled. The A/D conversion operation is performed as follows.

The analog circuit R-AC receives a high-frequency signal HFS via the antenna ANT and generates an analog I signal R-IA and an analog Q signal R-QA. The A/D converter I-ADC receives the analog I signal R-IA and, by subjecting the analog I signal R-IA to A/D conversion processing, generates a digital I signal R-ID. The A/D converter Q-ADC receives the analog Q signal R-QA and, by subjecting the analog Q signal R-QA to A/D conversion processing, generates a digital Q signal R-QD. The I/Q correction unit I/QCU receives the digital I signal R-ID and digital Q signal R-QD, detects gain, phase and DC offset mismatches as described above, and performs digital correction processing. Such mismatches are detected using the correction coefficients I-I/QCUCC and Q-I/QCUCC calculated in I/Q correction testing. Consequently, the I/Q correction unit I/QCU generates a corrected digital I signal CID and a corrected digital Q signal CQD. The digital processing unit DOU subjects the corrected digital I signal CID and corrected digital Q signal QID to necessary digital processing thereby generating base-band signals and transmits the base-band signals to the base-band processing unit BBU. No digital processing is performed in cases where no digital processing is necessary. In such cases, the corrected digital I signal CID and corrected digital Q signal CQD become demodulated base-band signals.

2. Operation of Communication System

The operation of a communication system including a semiconductor integrated circuit device will be described with reference to FIG. 6.

(1) Operation Sequence

An operation sequence includes an initial sequence period ISP which follows a start-up of the communication system, a no-signal period NSP which follows the initial sequence period ISP, and a receive signal processing period RSP which follows the no-signal period NSP. The receive signal processing period RSP is followed by a repetition period which is a set of a second no-signal period NSP2 and a second receive signal processing period RSP2. The repetition period is periodically repeated.

The initial sequence period ISP is a period in which calibration processing is performed, for example, to reset flip-flops included in the communication system, to activate power supplies included in the communication system, or to cancel various offsets in element circuits included in the communication system. The analog circuits R-AC and T-AC are typical circuits which perform such calibration processing. The circuits that perform calibration processing in the analog circuit R-AC or T-AC include the low-noise amplifier LNA, the filter I-FIL, the filter Q-FIL, the variable amplifier I-PGA, the variable amplifier Q-PGA, and the clock pulse generator CPG. The D/A converter I-DAC, the D/A converter Q-DAC, the low-pass filter I-LPF, the low-pass filter Q-LPF, and the power amplifier PA also perform calibration processing.

The no-signal period NSP is a period during which no high-frequency signal HFS comes in from outside.

The receive signal processing period (normal operation period) is a period in which a high-frequency signal HFS received from outside is, by down-conversion, demodulated into base-band signals.

(2) Operation Mode

The operation mode to be used is determined based on the value that is set, by the base-band processing unit BBU, in the mode setting register MRES included in the digital processing unit DOU. In each of the transmission system and the reception system, the I signal path and the Q signal path are set to a same operation mode.

The operation mode includes ADC correction mode ADC-CM, IQCU correction mode I/QCU-CM, and receive signal processing mode RSPM. The ADC correction mode ADC-CM is for calculating correction coefficients I-ADCCC and Q-ADCCC applied to A/D conversion processing. The IQCU correction mode I/QCU-CM is for calculating correction coefficients I-I/QCUCC and Q-I/QCUCC for the I/Q correction unit I/QCU. The receive signal processing mode RSPM is for demodulating a high-frequency signal HFS received from outside into base-band signals through down-conversion.

There are also other modes than the above three. Such other modes are generically represented by "OM" in FIG. 6. In the mode OM immediately following a start-up of the communication system, the flip-flops in the communication system are reset and the power supplies in the communication system are activated.

In the ADC correction mode ADC-CM, A/D conversion testing is performed. In the IQCU correction mode I/QCU-CM, A/D conversion operation is performed and I/Q correction testing is also performed. In the receive signal processing mode RSPM, A/D conversion operation is performed and I/Q correction operation is also performed.

Referring to FIG. 6, the correction mode ADC-CM is set during the initial sequence period ISP. In each of the no-signal periods NSP and NSP2, the ADC correction mode ADC-CM and the IQCU correction mode I/QCU-CM are set. In each of the receive signal processing periods RSP and RSP2, the receive signal processing mode RSPM is set.

(3) Registers

The digital processing unit DOU has the frequency setting register ADC-FSRES, the period setting register ADC-PSRES, the frequency setting register I/QC-FSRES, and the period setting register I/QC-PSRES.

In the frequency setting register ADC-FSRES, it is possible to make such settings as whether or not A/D conversion testing is performed in the initial sequence period ISP and whether A/D conversion testing is performed in every no-signal period NSP or in every Mth no-signal period NSP where M is a positive integer of 2 or larger.

In the period setting register ADC-PSRES, it is possible to make such settings as the length of A/D conversion testing to be performed in the initial sequence period ISP and the length of A/D conversion testing to be performed in the no-signal period NSP.

In the frequency setting register I/QC-FSRES, it is possible to make such settings as whether or not I/Q correction testing is performed in the initial sequence period ISP and whether I/Q correction testing is performed in every no-signal period NSP or in every Nth no-signal period NSP where N is a positive integer of 2 or larger.

In the period setting register I/QC-PSRES, it is possible to make such settings as the length of I/Q correction testing to be performed during the initial sequence period ISP and the length of I/Q correction testing to be performed in the no-signal period NSP.

In cases where both the ADC correction mode ADC-CM and the IQCU correction mode I/QCU-CM are executed in the initial sequence period ISP, always the ADC correction mode ADC-CM is executed first to be followed by execution of the IQCU correction mode I/QCU-CM. In cases where both the ADC correction mode ADC-CM and the IQCU correction mode I/QCU-CM are executed in the no-signal period NSP, always the ADC correction mode ADC-CM is executed first to be followed by execution of the IQCU correction mode I/QCU-CM.

In FIG. 6, the curve shown at the bottom represents an example of temperature and supply voltage changes with time and the second-bottom curve represents an example of changes with time of correction coefficient values for A/D converter or I/Q correction unit I/QCU.

3. Digital Correction Unit for I and Q Signals

With reference to FIG. 7, the digital correction unit for I and Q signals included in the semiconductor integrated circuit device will be described in the following.

(1) Configuration

In FIG. 7, the digital correction unit DCUI&Q is enclosed by a chain line. The digital correction unit DCUI&Q has the correction coefficient setting register I-ADCCCSRES and a digital correction unit I-DCU. The digital correction unit DCUI&Q also has the correction coefficient setting register Q-ADCCCSRES and a digital correction unit Q-DCU. The digital correction unit DCUI&Q further has an error calculation unit ECU, a dither difference unit DDU, and a correction coefficient search unit ADC-CSU. The digital correction unit I-DCU receives an A/D conversion unit output I-ADCUO from the A/D conversion unit I-ADCU. The digital correction unit I-DCU digitally corrects the A/D conversion unit output I-ADCUO based on the correction coefficient I-ADCCC stored in the correction coefficient setting register I-ADCCCSRES and outputs a digital I signal R-ID. The digital correction unit Q-DCU receives an A/D conversion unit output Q-ADCUO from the A/D conversion unit Q-ADCU. The digital correction unit Q-DCU digitally corrects the A/D conversion unit output Q-ADCUO based on the correction coefficient Q-ADCCC stored in the correction coefficient setting register Q-ADCCCSRES and outputs a digital Q signal R-QD. The error calculation unit ECU calculates the difference between the output from the digital correction unit I-DCU and the output from the digital correction unit Q-DCU. The dither difference unit DDU outputs a conversion error e obtained by subtracting $2\alpha$ from the output from the error calculation unit ECU. The correction coefficient search unit ADC-CSU receives the conversion error e from the dither difference unit DDU. The correction coefficient search unit ADC-CSU calculates correction coefficients I-ADCCC and Q-ADCCC based on the conversion error e and using a predetermined algorithm, for example, an LMS algorithm.

(2) Digital Correction Processing

The digital I signal R-ID outputted from the digital correction unit I-DCU assumes a value calculated by the following equation (1), wherein $D_i$ is an A/D conversion unit output I-ADCUO from the A/D conversion unit I-ADCU, $W_i$ is the correction coefficient I-ADCCC, i is a value in the range of 0 to N−1 representing the ith bit of the digital output signal, i.e. the A/D conversion unit output I-ADCUO, and N is a positive integer of 2 or larger representing the number of bits of the digital output signal.

$$\sum_{i=0}^{N-1} W_i \cdot D_i \quad (1)$$

Similarly, the digital Q signal R-QD outputted from the digital correction unit Q-DCU assumes a value calculated by the following equation (2), wherein Di is an A/D conversion unit output Q-ADCUO from the A/D conversion unit Q-ADCU, Ui is the correction coefficient Q-ADCCC, i is a value in the range of 0 to N−1 representing the ith bit of the digital output signal, i.e. the A/D conversion unit output Q-ADCUO, and N is a positive integer of 2 or larger representing the number of bits of the digital output signal.

$$\sum_{i=0}^{N-1} U_i \cdot D_i \quad (2)$$

In the following part of the present specification, the digital output from the A/D conversion unit I-ADCU or Q-ADCU will be referred to as the "digital output Di."

(3) A/D Conversion Testing

The operation for A/D conversion testing is performed as described in the following. A test signal ADC-TS is inputted to both the A/D conversion unit I-ADCU and the A/D conversion unit Q-ADCU via the test input terminal TIT. The digital correction unit I-DCU receives the digital output Di from the A/D conversion unit I-ADCU. The digital correction unit I-DCU digitally corrects the digital output Di based on the correction coefficient I-ADCCC stored in the correction coefficient setting register I-ADCCCSRES and outputs the digital I signal R-ID to the error calculation unit ECU. The digital correction unit Q-DCU receives the digital output Di from the A/D conversion unit Q-ADCU. The digital correction unit Q-DCU digitally corrects the digital output Di based on the correction coefficient Q-ADCCC stored in the correction coefficient setting register Q-ADCCCSRES and outputs the digital Q signal R-QD to the error calculation unit ECU. The error calculation unit ECU subtracts the digital Q signal R-QD from the digital I signal I-QD and outputs the difference to the dither difference unit DDU. The dither difference unit DDU calculates a conversion error e by subtracting 2α from the output from the error calculation unit ECU, wherein 2α=first dither signal Dither1−second Dither signal Dither2, and outputs the conversion error e to the correction coefficient search unit ADC-CSU. The correction coefficient search unit ADC-CSU calculates a new correction coefficient I-ADCCC based on the conversion error e and the correction coefficient I-ADCCC (denoted by Wi in FIG. 7) stored beforehand in the correction coefficient setting register I-ADCCCSRES and using a predetermined algorithm, for example, an LMS algorithm. The correction coefficient search unit ADC-CSU calculates a new correction coefficient Q-ADCCC based on the conversion error e and the correction coefficient Q-ADCCC (denoted by Ui in FIG. 7) stored beforehand in the correction coefficient setting register Q-ADCCCSRES and using a predetermined algorithm, for example, an LMS algorithm. The new correction coefficient I-ADCCC (denoted by Wi (NEW) in FIG. 7) is newly stored in the correction coefficient setting register I-ADCCCSRES. Also, the new correction coefficient Q-ADCCC (denoted by Ui (NEW) in FIG. 7) is newly stored in the correction coefficient setting register Q-ADCCCSRES. Subsequently, a next test signal ADC-TS is inputted to both the A/D conversion unit I-ADC and the A/D conversion unit Q-ADC via the test input terminal TIT, thereby updating the values stored in the correction coefficient setting registers I-ADCCCSRES and Q-ADCCCSRES. The updating operation described above is repeated during the A/D conversion testing.

(4) A/D Conversion Operation

The A/D conversion operation is performed as follows. From the analog circuit R-AC, an analog I signal R-IA is inputted to the A/D converter I-ADC and an analog Q signal R-QA is inputted to the A/D converter Q-ADC. An A/D conversion unit output I-ADCUO (digital output Di) is outputted from the A/D conversion unit I-ADCU and an A/D conversion unit output Q-ADCUO (digital output Di) is outputted from the A/D conversion unit Q-ADCU. The digital correction unit I-DCU receives a digital output Di from the A/D conversion unit I-ADCU. The digital correction unit I-DCU then digitally corrects the digital output Di based on a correction coefficient I-ADCCC thereby obtaining a digital I signal R-ID and outputs the digital I signal R-ID to the I/Q correction unit I/QCU. The correction coefficient I-ADCCC used in the above digital correction processing is the one obtained in A/D conversion testing and stored in the correction coefficient setting register I-ADCCCSRES. The digital correction unit Q-DCU receives a digital output Di from the A/D conversion unit Q-ADCU. The digital correction unit Q-DCU then digitally corrects the digital output Di based on a correction coefficient Q-ADCCC thereby obtaining a digital Q signal Q-ID and outputs the digital Q signal Q-ID to the I/Q correction unit I/QCU. The correction coefficient Q-ADCCC used in the above digital correction processing is the one obtained in A/D conversion testing and stored in the correction coefficient setting register Q-ADCCCSRES.

The region 71 enclosed by a chain line in FIG. 7 does not operate during the A/D conversion operation. The region 71 operates only during A/D conversion testing.

4. I/Q Correction Unit

The I/Q correction unit included in the semiconductor integrated circuit device will be described in the following with reference to FIG. 8.

(1) Configuration

In FIG. 8, the I/Q correction unit I/QCU is enclosed by a chain line. The I/Q correction unit I/QCU has a correction coefficient setting register I-I/QCUCCSRES, a digital correction unit I-I/QDCU, a correction coefficient setting register Q-I/QCUCCSRES, a digital correction unit Q-I/QDCU, and a correction coefficient search unit I/QCU-CSU. The digital correction unit I-I/QDCU digitally corrects the digital I signal R-ID received from the A/D converter I-ADC and the digital Q signal R-QD received from the A/D converter Q-ADC based on the correction coefficient I-I/QCUCC stored in the correction coefficient setting register I-I/QCUCCSRES and outputs a corrected digital I signal CID. The digital correction unit Q-I/QDCU digitally corrects the digital I signal R-ID received from the A/D converter I-ADC and the digital Q signal R-QD received from the A/D converter Q-ADC based on the correction coefficient Q-I/QCUCC stored in the correction coefficient setting register Q-I/QCUCCSRES and outputs a corrected digital Q signal CQD. Based on the corrected digital I signal CID received from the digital correction unit I-I/QDCU and the corrected digital Q signal CQD received from the digital correction unit Q-I/QDCU, the correction coefficient search unit I/QCU-CSU searches for correction coefficients I-I/QCUCC and Q-I/QCUCC using a predetermined algorithm, for example, an LMS algorithm.

The digital correction unit I-I/QDCU performs digital correction processing to detect and correct gain, phase, and DC offset mismatches of the digital I signal R-ID relative to the digital Q signal R-QD. Such mismatches can be caused over the path between the mixer RI-MIX and the variable amplifier I-PGA and over the path between the mixer RQ-MIX and the variable amplifier Q-PGA in the analog circuit R-AC. The digital correction unit Q-I/QDCU performs digital correction processing to detect and correct gain, phase, and DC offset mismatches of the digital Q signal R-QD relative to the digital I signal R-ID. Such mismatches can be caused over the path between the mixer RI-MIX and the variable amplifier I-PGA and over the path between the mixer RQ-MIX and the variable amplifier Q-PGA in the analog circuit R-AC.

(2) Digital Correction Processing

The digital correction unit I-I/QDCU digitally corrects the digital I signal R-ID and the digital Q signal R-QD based on the correction coefficient I-I/QCUCC and outputs a corrected digital I signal CID.

The digital correction unit Q-I/QDCU digitally corrects the digital I signal R-ID and the digital Q signal R-QD based on the correction coefficient Q-I/QCUCC and outputs a corrected digital Q signal CQD.

The digital I signal R-ID, digital Q signal R-QD, corrected digital I signal CID, and corrected digital Q signal CQD are related as expressed by the following equation (3).

$$\begin{pmatrix} CID \\ CQD \end{pmatrix} = \begin{pmatrix} H_{11} & H_{12} \\ H_{21} & H_{22} \end{pmatrix} \begin{pmatrix} R-ID \\ R-QD \end{pmatrix} - \begin{pmatrix} kI \\ kQ \end{pmatrix} \qquad (3)$$

In the above equation: each of $H_{11}$ and $H_{22}$ is a coefficient whose value is close to 1 and which is applied to correct an amplitude mismatch between the digital I signal R-ID and the digital Q signal R-QD; each of $H_{12}$ and $H_{21}$ is a coefficient whose value is close to 0 and which is applied to correct a phase mismatch between the digital I signal R-ID and the digital Q signal R-QD; and kI and kQ are coefficients applied to remove DC offsets of the digital I signal. R-ID and the digital Q signal R-QD, respectively.

(3) I/Q Correction Testing

The operation for I/Q correction testing is described in the following. During the I/Q correction testing, the A/D conversion operation is performed.

The digital correction unit I-I/QDCU digitally corrects the digital I signal R-ID received from the A/D converter I-ADC and the digital Q signal R-QD received from the A/D converter Q-ADC based on correction coefficients I-I/QCUCC (denoted by H11, H12 and kI in FIG. 8) stored in the correction coefficient setting register I-I/QCUCCSRES. The digital correction unit I-I/QDCU then outputs a corrected digital I signal CID to the correction coefficient search unit I/QCU-CSU.

The digital correction unit Q-I/QDCU digitally corrects the digital I signal R-ID received from the A/D converter I-ADC and the digital Q signal R-QD received from the A/D converter Q-ADC based on correction coefficients Q-I/QCUCC (denoted by H21, H22 and kQ in FIG. 8) stored in the correction coefficient setting register Q-I/QCUCCSRES. The digital correction unit Q-I/QDCU then outputs a corrected digital Q signal CQD to the correction coefficient search unit I/QCU-CSU.

The correction coefficient search unit I/QCU-CSU searches for correction coefficients I-I/QCUCC and Q-I/QCUSS using a predetermined algorithm, for example, an LMS algorithm. The search is performed based on the corrected digital I signal CID received from the digital correction unit I-I/QDCU and the corrected digital Q signal CQD received from the digital correction unit Q-I/QDCU, and correction coefficients I-I/QCUCC and Q-I/QCUCC. The correction coefficients I-I/QCUCC and Q-I/QCUCC used for the search are those stored beforehand in the correction coefficient setting register I-I/QCUCCSRES and the correction coefficient setting register Q-I/QCUCCSRES, respectively. The correction coefficients I-I/QCUCC (denoted by H1, H12 and kI (New) in FIG. 8) obtained by the search are newly stored in the correction coefficient setting register I-I/QCUCCSRES. The correction coefficients Q-I/QCUCC (denoted by H21, H22 and kQ (New) in FIG. 8) obtained by the search are newly stored in the correction coefficient setting register Q-I/QCUCCSRES.

Next, a digital I signal R-ID and a digital Q signal R-QD are inputted to both the digital correction unit I-I/QDCU and the digital correction unit Q-I/QDCU. This updates the values stored in the correction coefficient setting registers I-I/QCUCCSRES and Q-I/QCUCCSRES. This updating operation is repeated during the I/Q correction testing.

(4) I/Q Correction Operation

The I/Q correction operation is described in the following. During the I/Q correction operation, the A/D conversion operation is performed.

The digital correction unit I-I/QDCU digitally corrects the digital I signal R-ID received from the A/D converter I-ADC and the digital Q signal R-QD received from the A/D converter Q-ADC using the correction coefficients I-I/QCUCC calculated during the I/Q correction testing and stored in the correction coefficient setting register I-I/QCUCCSRES. Subsequently, the digital correction unit I-I/QDCU outputs a corrected digital I signal CID to inside the digital processing unit DOU, and the digital processing unit DOU outputs a base-band signal to the base-band processing unit BBU.

The digital correction unit Q-I/QDCU digitally corrects the digital I signal R-ID received from the A/D converter I-ADC and the digital Q signal R-QD received from the A/D converter Q-ADC using the correction coefficients Q-I/QCUCC calculated during the I/Q correction testing and stored in the correction coefficient setting register Q-I/QCUCCSRES. Subsequently, the digital correction unit Q-I/QDCU outputs a corrected digital Q signal CQD to inside the digital processing unit DOU, and the digital processing unit DOU outputs a base-band signal to the base-band processing unit BBU.

5. Summary

According to one aspect of the present embodiment, the following operations and effects can be achieved.

(1) In the ADC correction mode ADC-CM (a first mode), a test signal ADC-TS (a first test signal) is inputted to both the A/D converter I-ADC (a first A/D converter) and the A/D converter Q-ADC (a second A/D converter) and the correction coefficient I-ADCCC (a first correction coefficient) and the correction coefficient Q-ADCCC (a second correction coefficient) are calculated. The ADC correction mode (the first mode) corresponds to the first mode in foreground correction. Furthermore, in the I/Q correction mode I/QCU-CM (a third mode) or in the receive signal processing mode RSPM (a second mode), the A/D converter I-ADC (the first A/D converter) converts the analog I signal R-IA (a first analog signal) into a digital I signal R-ID (a first digital signal) by performing digital correction processing using the correction coefficient I-ADCCC (the first correction coefficient) calculated in the ADC correction mode ADC-CM (the first mode) and outputs the digital I signal R-ID (the first digital signal).

The receive signal processing mode (the second mode) corresponds to the second mode in foreground correction. Similarly, in the I/Q correction mode I/QCU-CM (the third mode) or in the receive signal processing mode RSPM (the second mode), the A/D converter Q-ADC (the second A/D converter) converts the analog Q signal R-QA (a second analog signal) into a digital Q signal R-QD (a second digital signal) by performing digital correction processing using the correction coefficient Q-ADCCC (the second correction coefficient) calculated in the ADC correction mode ADC-CM (the first mode) and outputs the digital Q signal R-QD (the second digital signal). Mode information about the first mode, the second mode and the third mode is stored in a mode setting information storage circuit (mode setting register MRES).

With the configuration or function described in (1) above provided, in the ADC correction mode (the first mode) ADC-CM, the A/D converter I-ADC (a first A/D converter) and the A/D converter Q-ADC (a second A/D converter) are used to calculate the correction coefficient I-ADCCC (the first correction coefficient) and the correction coefficient Q-ADCCC (the second correction coefficient). In the I/Q correction mode I/QCU-CM (the third mode) or in the receive signal processing mode RSPM (the second mode), the A/D converter I-ADC (the first A/D converter) and the A/D converter Q-ADC (the second A/D converter) are used to convert the analog I signal R-IA (the first analog signal) and the analog Q signal R-QA (the second analog signal) into digital signals. This makes it unnecessary to provide any additional circuit, which requires a large area, for calculating the correction coefficient I-ADCCC (the first correction coefficient) and the correction coefficient Q-ADCCC (the second correction coefficient), so that the semiconductor integrated circuit device can be kept small. With no such additional large-area circuit to operate in the correction mode ADC-CM (the first mode) incorporated, the power consumption of the semiconductor integrated circuit device can be kept small.

(2) According to the configuration or function described in (1) above, in the ADC correction mode ADC-CM (the first mode), a first dither signal Dither1 (a first predetermined voltage) is inputted to the A/D converter I-ADC (the first A/D converter) and a second dither signal Dither2 (a second predetermined voltage) is inputted to the A/D converter Q-ADC (the second A/D converter).

With the configuration or function described in (2) above provided, in the ADC correction mode ADC-CM (the first mode), the correction coefficient I-ADCCC (the first correction coefficient) and the correction coefficient Q-ADCCC (the second correction coefficient) are searched for in a state with their high-order bits differing from each other using the first dither signal Dither1 (the first predetermined voltage) and the second dither signal Dither2 (the second predetermined voltage). In this way, the correction coefficient I-ADCCC (the first correction coefficient) and the correction coefficient Q-ADCCC (the second correction coefficient) can be searched for faster without fail.

(3) According to the configuration or function as described in (1) above, in the ADC correction mode ADC-CM (the first mode), the correction coefficient I-ADCCC (the first correction coefficient) and the correction coefficient Q-ADCCC (the second correction coefficient) are calculated based on the conversion error e (difference output) that is calculated based on the difference between the output from the A/D converter I-ADC (the first A/D converter) and the output from the A/D converter Q-ADC (the second converter).

With the configuration or function described in (3) above provided, in the ADC correction mode ADC-CM (the first mode), the correction coefficient I-ADCCC (the first correction coefficient) and the correction coefficient Q-ADCCC (the second correction coefficient) are both calculated based on the conversion error e (difference output) that is calculated based on the difference between the output from the A/D converter I-ADC (the first A/D converter) and the output from the A/D converter Q-ADC (the second converter). The correction coefficient I-ADCCC (the first correction coefficient) and the correction coefficient Q-ADCCC (the second correction coefficient) are both calculated based on the common conversion error e (difference output). In the I/Q correction mode I/QCU-CM (the third mode) or in the receive signal processing mode RSPM (the second mode), the A/D converter I-ADC (the first converter) and the A/D converter Q-ADC (the second converter) perform A/D conversion operation using the correction coefficient I-ADCCC (the first correction coefficient) and the correction coefficient Q-ADCCC (the second correction coefficient). Since the correction coefficient I-ADCCC (the first correction coefficient) and the correction coefficient Q-ADCCC (the second correction coefficient) calculated based on the common conversion error e (difference output) are used, the conversion gain mismatch between the output from the A/D converter I-ADC (the first A/D converter) and the output from the A/D converter Q-ADC (the second A/D converter) is reduced.

A problem which can result from a conversion gain mismatch will be described in the following. In a quadrature modulation system, data is modulated into both an I signal and a Q signal. In a demodulation unit, a predetermined digital calculation is performed using the I signal and the Q signal in combination. When, in that case, the I signal and the Q signal differ from each other in amplitude, the amplitude of the demodulated waveform obtained as a result of the digital calculation performed involving the I and Q signals combined becomes small (generally expressed as, for example, "eye opening becomes small"). In this case, the magnitude of the amplitude corresponds to the magnitude of the gain. The demodulated waveform in this stage is yet an analog-like waveform represented by multiple bits. Also, when the I signal and the Q signal differ from each other in the magnitude of phase shift and the applied DC offset voltage, the eye opening becomes small. In evaluating the demodulated data, whether its value is positive or negative is determined when the amplitude of the demodulated waveform is maximum. Therefore, when the demodulated waveform has a small amplitude and is laden with noise with the absolute value of the noise magnitude being larger than that of the demodulated waveform amplitude and with the noise magnitude being directed oppositely to the demodulated waveform amplitude, whether the demodulated data is positive or negative is reversely determined resulting in a data evaluation error. To avoid such a data evaluation error, it is necessary to reduce the conversion gain mismatch between the output from the A/D converter I-ADC (the first A/D converter) and the output from the A/D converter Q-ADC (the second A/D converter).

When an ADC like one of those shown in reference drawings, FIGS. 1 to 4, is applied to the A/D converter I-ADC and the A/D converter Q-ADC, the conversion error e becomes different between the A/D converter for I signal and the A/D converter for Q signal causing the conversion gain mismatch to become larger. This is because the circuit used to calculate a conversion error e in the A/D converter for I signal and the circuit used to calculate a conversion error e in the A/D converter for Q signal are completely separated physically. The ADCs shown in reference drawings FIGS. 1 and 2 are provided with an A/D converter RADCU or D/A converter RDACU of high absolute accuracy, so that their conversion gain errors are small. Having the RADCU or RDACU, however, unavoidably involves a larger area for converter installation, greater power consumption, greater man-hour for design, and a cost increase. The ADCs shown in reference drawings FIGS. 3 and 4 have no circuit equivalent to the RADCU or RDACU with high absolute accuracy. Therefore, when the ADCs shown in reference drawings FIGS. 3 and 4 in particular are used as the A/D converter I-ADC and the A/D converter Q-ADC, the conversion error e becomes different between the A/D converter for I signal and the A/D converter for Q signal, resulting in a larger conversion gain mismatch.

When the relation between the I signal and the Q signal is corrected as done in the I/Q correction unit I/QCU, the amplitude of the demodulated waveform becomes adequately large, so that the possibility of data evaluation error is reduced.

According to another aspect of the present embodiment, the following operations and effects can be achieved.

(4) The semiconductor integrated circuit device has an analog circuit R-AC which receives a high-frequency signal HFS and generates an analog I signal R-IA (a first analog signal) and an analog Q signal R-QA (a second analog signal), a first A/D converter (corresponding to the A/D converter I-ADC) which receives the analog I signal R-IA and generates, by subjecting the analog I signal R-IA to digital correction processing for A/D conversion, a digital I signal R-ID, and a second A/D converter (corresponding to the A/D converter Q-ADC) which receives the analog Q signal R-QA and generates, by subjecting the analog Q signal R-QA to digital correction processing for A/D conversion, a digital Q signal R-QD. The first A/D converter and the second A/D converter perform foreground correction. The period of execution of the first mode for foreground correction is the same between the first A/D converter and the second A/D converter. Also, the period of execution of the second mode for foreground correction is the same between the first A/D converter and the second A/D converter.

With the configuration or function described in (4) above provided, the following advantages are obtained. The first A/D converter and the second A/D converter perform A/D conversion processing on the analog I signal R-IA and the analog Q signal R-QA generated by subjecting a high-frequency signal HFS to conversion processing in the analog circuit R-AC. Hence, the period of execution of the first mode and the period of execution of the second mode may be identical between the first A/D converter and the second A/D converter. With the period of execution of the first mode and the period of execution of the second mode both being identical between the first A/D converter and the second A/D converter, the first-mode setting sequence and the second-mode setting sequence can be shared, for simpler processing, by the first A/D converter and the second A/D converter. Furthermore, the correction coefficient for A/D conversion can be calculated efficiently in the first mode, and the A/D conversion processing can be performed efficiently in the second mode.

Assume a semiconductor integrated circuit device is provided with an A/D converter for temperature sensor which processes a signal from a temperature sensor and an A/D converter for radio communication which processes a signal from a radio communication antenna and assume that the semiconductor integrated circuit device performs foreground correction by having each of the A/D converter for temperature sensor and the A/D converter for radio communication perform A/D conversion processing. In this case, the signal from the temperature sensor and the signal from the radio communication antenna operate independently of each other, so that the timing of A/D conversion processing the A/D converter for temperature sensor performs for the signal from the temperature sensor completely differs from the timing of A/D conversion processing the A/D converter for radio communication performs for the signal from the radio communication antenna. Hence, the first mode and the second mode completely differ between the A/D converter for temperature sensor and the A/D converter for radio communication. According to the configuration or function described in (4) above, the analog I signal. R-IA and the analog Q signal R-QA are generated out of a same high-frequency signal HFS in the analog circuit R-AC, so that the first mode and the second mode can be made the same between the first A/D converter and the second A/D converter.

When the configuration or function described in (4) above and the configuration or function described in (1) above are combined, the following advantages can be achieved. With the first mode being identical between the A/D converter I-ADC and the A/D converter Q-ADC, a common test signal ADC-TS can be inputted to both the A/D converter I-ADC and the A/D converter Q-ADC in the first mode. In cases where the first mode and the second mode are not the same between the A/D converter I-ADC and the A/D converter Q-ADC, inputting a common test signal ADC-TS to both the A/D converter I-ADC and the A/D converter Q-ADC in the first mode makes one of the two A/D converters unable to operate in the second mode.

When the configuration or function described in (4) above and the configurations or functions described in (1) and (3) above are combined, the following advantages can be achieved. With the first mode being identical between the A/D converter I-ADC (the first A/D converter) and the A/D converter Q-ADC (the second A/D converter), both the correction coefficient I-ADCCC (a first correction coefficient) and the correction coefficient Q-ADCCC (a second correction coefficient) can be calculated in the first mode based on a conversion error e which is based on the difference between the output from the A/D converter I-ADC and the output from the A/D converter Q-ADC. In cases where the first mode and the second mode are not the same between the A/D converter I-ADC and the A/D converter Q-ADC, it is not possible to obtain a conversion error e based on the difference between the output from the A/D converter I-ADC and the output from the A/D converter Q-ADC.

(5) According to the configuration or function described in (4) above, after the correction coefficients for A/D conversion are calculated for the first A/D converter and the second A/D converter, the I/Q correction coefficients are calculated in the I/Q correction mode I/QCU-CM (the third mode) as follows. The I/Q correction unit I/QCU (a digital error correction circuit) receives a digital I signal R-ID (a first digital signal) from the first A/D converter operating in the second mode and a digital Q signal R-QD (a second digital signal) from the second A/D converter operating in the second mode and, by subjecting the digital I signal R-ID (the first digital signal) and the digital Q signal R-QD (the second digital signal) to digital correction processing, calculates a correction coefficient I-I/QCUCC (a third correction coefficient) and a correction coefficient Q-I/QCUUU (a fourth correction coefficient).

With the configuration or function described in (5) above provided, the following advantages can be achieved. Since the correction coefficient for A/D conversion are calculated in the first mode, it is possible to obtain, in the second mode, optimum correction coefficients for the first and second A/D converters. As a result, in the I/Q correction mode I/QCU-CM (the third mode), optimized outputs can be obtained from the first and second A/D converters. This makes it possible to obtain the correction coefficient I-I/QCUCC (the third correction coefficient) and the correction coefficient Q-I/QCUCC (the fourth correction coefficient) with higher correctness.

(6) According to the configuration or function described in (4) above: in the initial sequence period and also in the no-signal period, the first and second A/D converters are operable in the first mode; and the receive signal processing period (normal operation period) and the no-signal period are alternately repeated periodically. The period during which operation is performed in the first mode is also referred to as a first testing period.

With the configuration or function described in (6) above provided, the following advantages can be achieved. In the initial sequence period, the first and second A/D converters can operate in the first mode making it possible to obtain a correction coefficient for A/D conversion which reflects static variation such as process variation. In the no-signal period, too, having the first and second A/D converters operate in the first mode makes it possible to obtain an optimum correction coefficient for A/D conversion tracking temperature and supply voltage variations as shown in FIG. 6.

(7) According to the configuration or function described in (4) above: in the initial sequence period and also in the no-signal period, the I/Q correction unit I/QCU (a digital error correction circuit) is operable in the I/Q correction mode I/QCU-CM (the third mode); and the receive signal processing period (normal operation period) and the no-signal period are alternately repeated periodically. The period during which operation is performed in the third mode is also referred to as a second testing period.

With the configuration or function described in (7) above provided, the following advantages can be achieved. In the initial sequence period, the I/Q correction unit I/QCU (the digital error correction circuit) can operate in the I/Q correction mode I/QCU-CM (the third mode) making it possible to obtain a correction coefficient I-ADCCC (a first correction coefficient) and a correction coefficient Q-ADCCC (a second correction coefficient) which reflect static variation such as process variation. In the no-signal period, too, having the I/Q correction unit I/QCU (the digital error correction circuit) operate in the I/Q correction mode I/QCU-CM (the third mode) makes it possible to obtain optimum correction coefficients I-ADCCC and Q-ADCCC tracking temperature and supply voltage variations as shown in FIG. 6.

(8) According to the configuration or function described in (4) and (6) above, a frequency setting register ADC-FSRES and a period setting register ADC-PSRES are provided.

With the configuration or function described in (8) above provided, the following advantage can be achieved. Setting the frequency setting register ADC-FSRES and the period setting register ADC-PSRES in accordance with the characteristics of a communication system, for example, a mobile phone incorporating a base-band unit BBU, a semiconductor integrated circuit device RFIC and an antenna ANT makes it possible to obtain a correction coefficient for A/D conversion with accuracy and power consumption appropriate for the communication system.

(9) According to the configuration or function described in (4) and (7) above, a frequency setting register I/QC-FSRES and a period setting register I/QC-PSRES are provided.

With the configuration or function described in (9) above provided, the following advantages can be achieved. Setting the frequency setting register I/QC-FSRES and the period setting register I/QC-PSRES in according with the characteristics of a communication system, for example, a mobile phone incorporating a base-band unit BBU, a semiconductor integrated circuit device RFIC and an antenna ANT makes it possible to obtain a correction coefficient I-I/QCUCC (a third correction coefficient) and a correction coefficient Q-I/QCUCC (a fourth correction coefficient) with accuracy and power consumption appropriate for the communication system. The frequency setting register ADC-FSRES, the period setting register ADC-PSRES, the frequency setting register I/QC-FSRES, and the period setting register I/QC-PSRES are combinedly referred to as a period setting/storing circuit.

6. A/D Conversion Unit

Example 1

Figure 9:
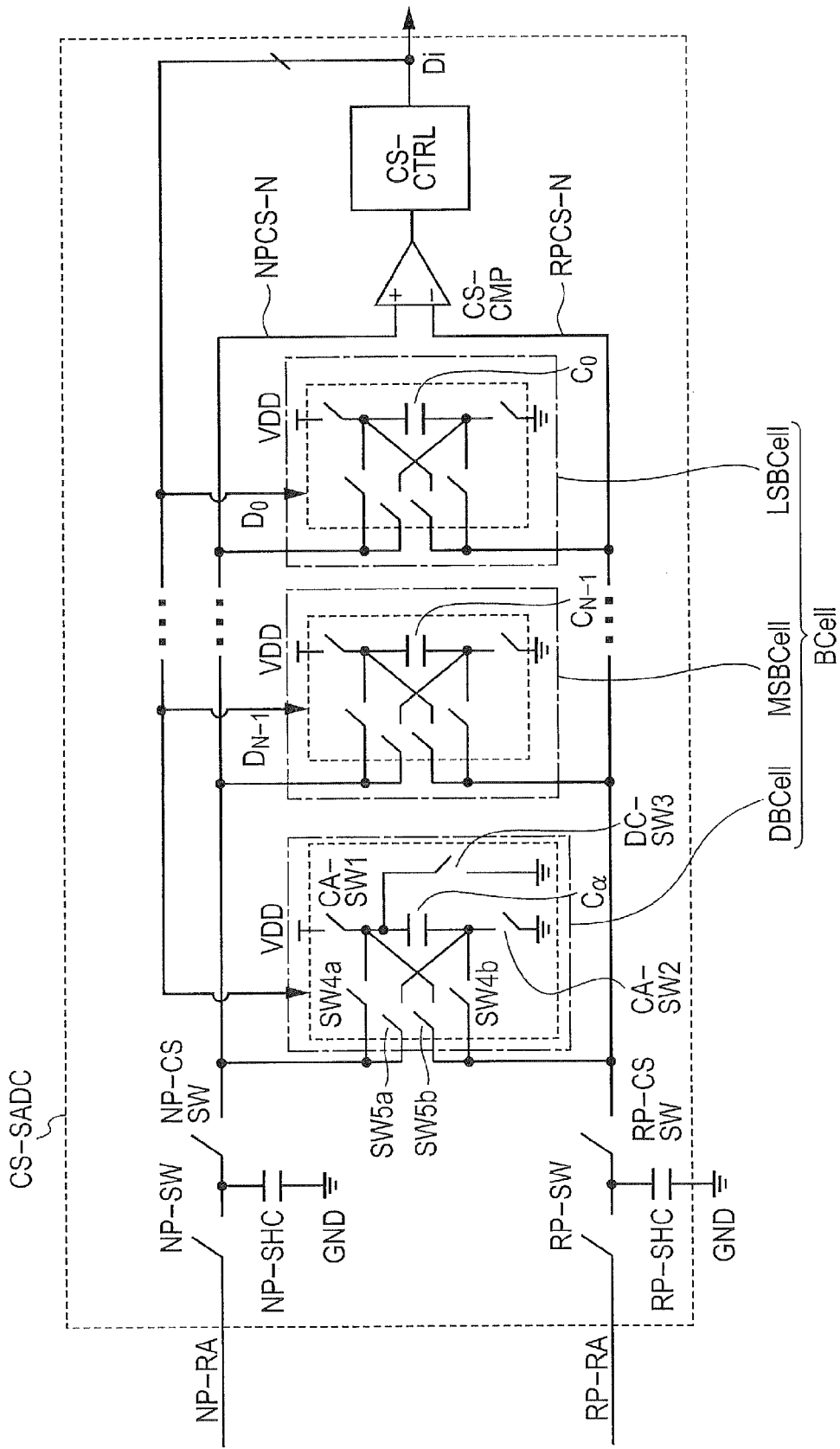
FIG. 9 is a configuration diagram showing a charge-shared type A/D converter as an example of an A/D conversion unit for I signal and an A/D conversion unit for Q signal according to the first embodiment of the present invention.

FIG. 9 shows a charge-shared type A/D conversion unit as an example of the A/D conversion unit I-ADCU as well as the A/D conversion unit Q-ADCU of the present embodiment.

Even though the communication system of the present embodiment is designed to handle single-phase signals, a communication system to handle differential signals can also be used without causing any problem. The A/D conversion unit CS-ADCU shown (enclosed by a chain line) in FIG. 9 is configured to cause each element circuit to perform differential input/output based on the assumption that the communication system of the present embodiment handles differential signals.

(1) Configuration

The A/D conversion unit CS-ADCU has a switch NP-SW, a capacitor NP-SHC, and a switch NP-CSSW. The A/D conversion unit CS-ADCU also has a switch RP-SW, a capacitor RP-SHC, and a switch RP-CSSW. Furthermore, the A/D conversion unit CS-ADCU has a comparator CS-CMP, a control unit CS-CTRL, and bit cells BCell. The A/D conversion unit CS-ADCU receives either one of the output from a variable amplifier I-PGA and the output from a variable amplifier Q-PGA. The A/D conversion unit CS-ADCU receives a differential analog receive signal made up of an analog signal NP-RA and an analog signal RP-RA which is an inversion of the analog signal NP-RA. The analog signal NP-RA is either one of the non-inverted signal outputted from the variable amplifier I-PGA and the non-inverted signal outputted from the variable amplifier Q-PGA. The analog signal RP-RA is either the inversion of the output from the variable amplifier I-PGA or the inversion of the output from the variable amplifier Q-PGA.

The switch NP-SW receives the analog signal NP-RA. The switch RP-SW receives the analog signal RP-RA. The capacitor NP-SHC samples and holds the analog signal RP-RA. The capacitor RP-SHC samples and holds the analog signal RP-RA. The switch NP-CSSW for sharing electric charges between the capacitor NP-SHC and the bit cells BCell is coupled to the capacitor NP-SHC. The switch RP-CSSW for sharing electric charges between the capacitor RP-SHC and the bit cells BCell is coupled to the capacitor RP-SHC.

A node NPCS-N is formed between the non-inverted input terminal of the comparator CS-CMP and the capacitor NP-SHC. A node RPCS-N is formed between the inverted input terminal of the comparator CS-CMP and the capacitor RP-SHC. The comparator CS-CMP compares the voltage across the node NPCS-N and the voltage across the node RPCS-N.

The control unit CS-CTRL receives the result of voltage comparison made by the comparator CS-CMP, generates a digital output Di of the A/D converter CS-ADCU and outputs the digital output Di to the digital correction unit DCUI&Q to control the bit cells BCell.

In FIG. 9, the bit cells BCell are each enclosed by a chain line. The bit cells BCell include as many bit cells as the number of bits of the digital output Di plus 1. Namely, the bit cells BCell include a bit cell DBCell for dither signal and other bit cells the number of which equals the number of bits of the digital output Di. The bit cell DBCell for dither signal has a capacitor $C_\alpha$ for dither signal, a switch CA-SW1, a switch CA-SW2, and a switch DC-SW3. The bit cell DBCell for dither signal also has two switches SW4a and SW4b and two switches SW5a and SW5b. These elements of the bit cell DBCell are coupled as shown in FIG. 9. The capacitor $C_\alpha$ for dither signal has a capacitance whose value is dependent on the voltage to be provided by the dither signal.

The other bit cells total N in number. Each of the other bit cells has a configuration basically identical to the configuration of the bit cell DBCell for dither signal, but the switch DC-SW3 is not included in the other bit cells. Furthermore, instead of the capacitor $C_\alpha$ for dither signal included in the bit cell DBCell for dither signal, a bit cell capacitor Ci is included in each of the other bit cells, and the bit cell capacitor Ci satisfies the following conditions: (i) $0 \le k \le N-1$ where k is 0 or a positive integer and N is a positive integer of 2 or larger; and (ii) the capacitance of the bit cell capacitor $C_{k+1}$ included in the (k+1)th bit cell is two times the capacitance of the bit cell capacitor $C_k$ included in the kth bit cell. The (N−1)th bit cell BCell corresponding to the most significant bit of the digital output Di is the cell MSBCell for the most significant bit, and the 0th bit cell BCELL corresponding to the least significant bit of the digital output Di is the cell LSBCell for the least significant bit. The bit cells BCell are provided with a ground voltage GND and a supply voltage VDD.

(2) Operation (a) A/D Conversion Testing

The operation performed for A/D conversion testing will be described in the following.

At a first timing, the analog signals NP-RA and RP-RA are sampled into the capacitors NP-SHC and RP-SHC, respectively. Subsequently, to charge the electric charges equivalent to the difference between the supply voltage VDD and the ground voltage GND into the bit cell capacitor Ci of every bit cell BCell, the switches CA-SW1 and CA-SW2 are turned on.

At a second timing following the first timing, the switches NP-SW and RP-SW and the switches CA-SW1 and CA-SW2 for dither signal included in the bit cell DBCell are turned off. The switches NP-CSSW and RP-CSSW and the switches SW4a and SW4b for dither signal included in the bit cell DBCell are then turned on. By controlling the switches on and off as described above, one end of the capacitor $C_\alpha$ for dither signal and one end of the capacitor NP-SHC are coupled to the node NPCS-N, whereas the other end of the capacitor $C_\alpha$ for dither signal and one end of the capacitor RP-SHC are coupled to the node RPCS-N. This causes the electric charges in the capacitor $C_\alpha$ for dither signal and the electric charges in the capacitor NP-SHC to be charge-shared and distributed into the node NPCS-N. Similarly, the electric charges in the capacitor $C_\alpha$ for dither signal and the electric charges in the capacitor RP-SHC are charge-shared and distributed into the node RPCS-N. The voltage across the node NPCS-N with the distributed electric charges and the voltage across the node RPCS-N with the distributed electric charges are compared at the comparator CS-CMP. The comparator CS-CMP outputs, for example, 1 when the result of voltage comparison is positive or 0 when the result of voltage comparison is negative. Based on the comparison result, the control unit CS-CTRL determines the (N−1)th digital output $D_{N-1}$, i.e. the output of the most significant bit.

At a third timing following the second timing, the switches of the cell MSBCell for the most significant bit are controlled based on the digital output $D_{N-1}$. When $D_{N-1}$ is 1, the switches SW5a and SW5b are turned on. This causes the amount of the electric charges in the bit cell capacitor $C_{N-1}$ included in the cell MSBCell for the most significant bit to be subtracted from the amount of the electric charges in the node NPCS-N. Furthermore, the amount of the electric charges in the bit cell capacitor $C_{N-1}$ included in the cell MSBCell for the most significant bit is subtracted from the amount of the electric charges in the node RPCS-N. When $D_{N-1}$ is 0, the switches SW4a and SW4b are turned on. This causes the amount of the electric charges in the bit cell capacitor $C_{N-1}$ included in the cell MSBCell for the most significant bit to be added to the node NPCS-N. Furthermore, the amount of the electric charges in the bit cell capacitor $C_{N-1}$ included in the cell MSBCell for the most significant bit is added to the node RPCS-N. Thus, the electric charges are distributed in each of the nodes NPCS-N and RPCS-N. The voltage across the node NPCS-N in which the electric charges have been distributed and the voltage across the node RPCS-N in which the electric charges have been distributed are compared at the comparator CS-CMP. The comparator CS-CMP, for example, outputs 1 when the result of voltage comparison is positive or 0 when the result of voltage comparison is negative. Based on the comparison result, the control unit CS-CTRL determines the (N−2)th digital output $D_{N-2}$.

The operations like those described above are repeated until the digital output $D_0$ is determined.

The dither voltage to be applied can be inverted (i.e. the second dither signal Dither2 can be applied) by turning the switches SW4a and SW4b included in the bit cell DBCell for dither signal on at the second timing.

(b) A/D Conversion Operation

Even though the A/D conversion operation is basically the same as the A/D conversion testing, the bit cell DBCell for dither signal is not used in the A/D conversion operation, so that the switches CA-SW2 and DC-SW3 are left on.

Namely, in the A/D conversion testing, A/D conversion is performed with a dither signal component superimposed and, in the A/D conversion operation, A/D conversion is performed with no dither signal component superimposed.

(3) Summary

Since each ADCU used is of a sequential comparison type, A/D conversion of up to 50 MS/s is performable with a low power consumption of up to several mW. In a sequential comparison type ADCU, unlike in a charge redistribution type ADCU (example 2) being described later, the frequency of access to a reference voltage is low, so that the reference voltage can be generated with ease.

7. A/D Conversion Unit

Example 2

Figure 10:
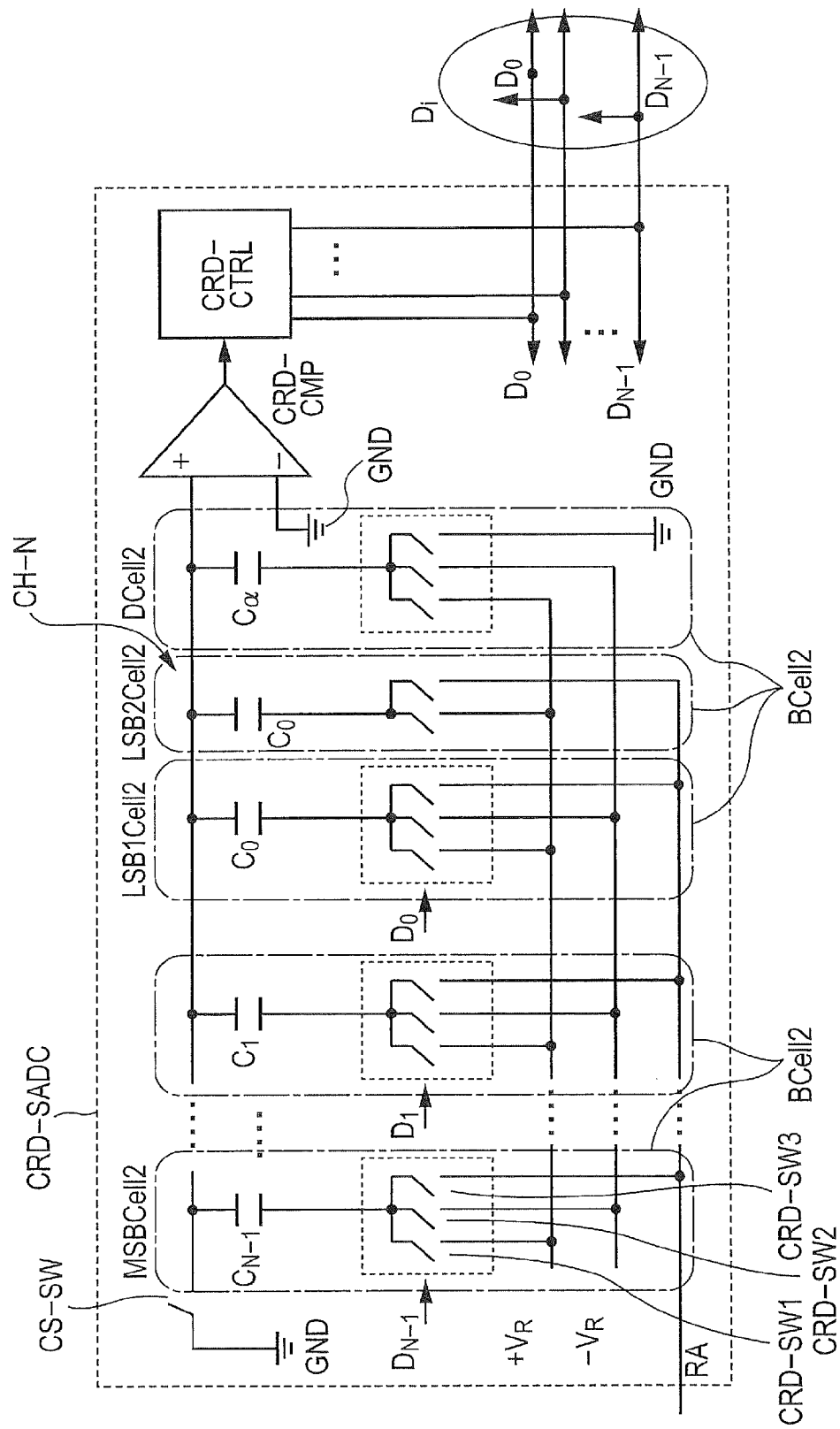
FIG. 10 is a configuration diagram showing a charge redistribution type A/D conversion unit as an example of the A/D conversion unit for I signal and the A/D conversion unit for Q signal according to the first embodiment of the present invention.

FIG. 10 shows a charge redistribution type A/D conversion unit as an example of the A/D conversion unit I-ADCU and the A/D conversion unit Q-ADCU of the present embodiment.

(1) Configuration

The A/D conversion unit CRD-ADCU has a switch CS-SW, as many as N+2 bit cells BCell2, a comparator CRD-CMP, and a control unit CRD-CTRL. The A/D conversion unit CRD-ADCU is configured to receive an analog signal RA outputted from either the variable amplifier I-PGA or the variable amplifier Q-PGA. The analog signal RA refers to either one of the analog I signal R-IA and the analog Q signal R-QA. The switch CS-SW selects whether or not to supply a ground voltage GND to the bit cell capacitor Ci of each bit cell BCell via a charge holding node CH-N. The comparator CRD-CMP compares the voltage across the charge holding node CH-N coupled to each bit cell BCell and the ground voltage GND. The control unit CRD-CTRL determines a digital output Di based on the result of the comparison made by the comparator CRD-CMP and outputs the digital output Di to the digital correction unit DCUI&Q to control each bit cell BCell.

Each bit cell BCell is configured as follows. The bit cell DBCell2 for dither signal has a capacitor $C_\alpha$ for dither signal, a first switch CRD-SW1, a second switch CRD-SW2, and a third switch CRD-SW3. The capacitor $C_\alpha$ for dither signal has a predetermined capacitance and generates a voltage a for a dither signal. The first switch CRD-SW1 selects whether or not to pass a positive reference voltage $+V_R$. The second switch CRD-SW2 selects whether or not to pass a negative reference voltage $-V_R$. The third switch CRD-SW3 selects whether or not to pass the ground voltage GND.

The switches and the capacitor included in the bit cell DBCell2 for dither signal are coupled as shown in FIG. 10.

In other respects, each bit cell BCell2 is configured to be basically the same as the bit cell DBCell2 for dither signal excepting the following differences. In the bit cell DBCell2 for dither signal, the third switch CRD-SW3 is provided to select whether or not to cause the capacitor $C_\alpha$ for dither signal to receive the ground voltage GND, whereas, in each bit cell BCell2, the third switch CRD-SW3 is provided to select whether or not to cause the bit cell capacitor Ci to receive an analog receive signal RA. Furthermore, each bit cell BCell2 is provided with the bit cell capacitor Ci instead of the capacitor $C_\alpha$ for dither signal provided in the bit cell DBCell2 for dither signal. The bit cell capacitor Ci satisfies the following conditions: (i) $0 \leq k \leq N-1$ where k is 0 or a positive integer and N is a positive integer of 2 or larger; and (ii) the capacitance of the bit cell capacitor $C_{k+1}$ included in the (k+1)th bit cell is two times the capacitance of the bit cell capacitor $C_k$ included in the kth bit cell. The bit cell corresponding to the most significant bit of the digital output Di is the cell MSBCell2 for the most significant bit. There are two bit cells that correspond to the least significant bit of the digital output Di, i.e. the cell LSB1Cell that is a first cell for the least significant bit and the cell LSB2Cell that is a second cell for the least significant bit.

Unlike the other bit cells BCell2, the cell LSB2Cell2, i.e. the second cell for the least significant bit, is provided with no second switch CRD-SW2.

(2) Operation (a) A/D Conversion Testing

The operation performed for A/D conversion testing will be described in the following.

At a first timing, for every bit cell BCell2, the switch CS-SW and the third switch CRD-SW3 are turned on. Subsequently, while sampling the analog receive signal RA into the charge holding node CH-N, the ground voltage GND is applied to the capacitor $C_\alpha$ for dither signal.

At a second timing following the first timing, the switch CS-SW and the third switch CRD-SW3 are turned off. Subsequently, while turning the first switch CRD SW1 of the cell MSBCell2 for the most significant bit on, the second switch CRD-SW2 of each of the remaining bit cells BCell2 is turned on. As a result, a voltage obtained by subtracting the voltage corresponding to the cell MSBCell2 for the most significant bit from the sum of the voltage corresponding to the analog signal RA and the voltage corresponding to the dither signal and then by inverting the sign of the resultant voltage is generated in the charge holding node CH-N. The sign of the voltage thus generated in the charge holding node CH-N is determined at the comparator CRD-CMP. Consequently, the control unit CRD-CTRL determines the most significant bit of the digital output Di as (digital output $D_{N-1}=0$) when the sign is positive or as (digital output $D_{N-1}=1$) when the sign is negative.

At a third timing following the second timing: when the digital output $D_{N-1}=1$, the control unit CRD-CTRL keeps the first switch CRD-SW1 of the cell MSBCell2 for the most significant bit on; and, when the digital output $D_{N-1}=0$, the control unit CRD-CTRL turns the first switch CRD-SW1 of the cell MSBCell2 for the most significant bit off and the second switch CRD-SW2 of the cell MSBCell2 for the most significant bit on. Next, the control unit CRD-CTRL, while turning the first switch CRD-SW1 of the (N−2)th bit cell BCell2 on, turns the second switch CRD-SW2 off. The comparator CRD-CMP determines the sign of the voltage generated in the charge holding node CH-N. The control unit CRD-CTRL determines the second-highest order bit of the digital output Di as (digital output $D_{N-2}=0$) when the sign of the voltage is positive or as (digital output $D_{N-2}=1$) when the sign of the voltage is negative. This process is repeated until the digital output Di of the least significant bit is determined. In this way, a digital output Di containing a dither signal component is generated.

(b) A/D Conversion Operation

The A/D conversion operation will be described below. The A/D conversion operation does not basically differ from the A/D conversion testing, but, in the A/D conversion operation, at the first to the third timing, the bit cell DBCell2 for dither signal is made to operate with the third switch CRD-SW3 kept on. This causes a digital output Di containing no dither signal component to be generated. Even though, in the A/D conversion testing, the bit cell DBCell2 for dither signal is used, the bit cell DBCell2 for dither signal is not used in the A/D conversion operation.

(3) Summary

With the ADCU being of a sequential comparison type, A/D conversion of up to 50 MS/s is performable with a low power consumption of up to several mW.

In example 1, only when sampling the analog signals NP-RA and RP-RA into the capacitors NP-SHC and RP-SHC, respectively, at the first timing, a buffer circuit, not shown, is used at the first timing to input the analog signals NP-RA and RP-RA to the capacitors NP-SHC and RP-SHC. Since the buffer circuit is not used neither at the second timing nor at the third timing, power consumption is reduced.

In example 2, for every bit cell BCell, the switch CS-SW and the third switch CRD-SW3 are turned on at the first timing. Subsequently, a buffer circuit, not shown, is used to apply the ground voltage GND to the capacitor $C_\alpha$ for dither signal while sampling the analog signal RA into the charge holding node CH-N. Furthermore, it is necessary to use a buffer circuit, not shown, every time a positive reference voltage $+V_R$ or negative reference voltage $-V_R$ is applied to each bit cell BCell. This makes the power consumption larger in example 2 than in example 1.

In example 1, the electric charges held at the first timing in the nodes NPCS-N and RPCS-N are not retained in the second and the third timing, so that the electric charges cannot be reused.

In example 2, the electric charges held in the charge holding node CH-N at the first timing are retained in the second and the third timing, so that the electric charges can be reused.

8. A/D Conversion Unit

Example 3

Figure 11:
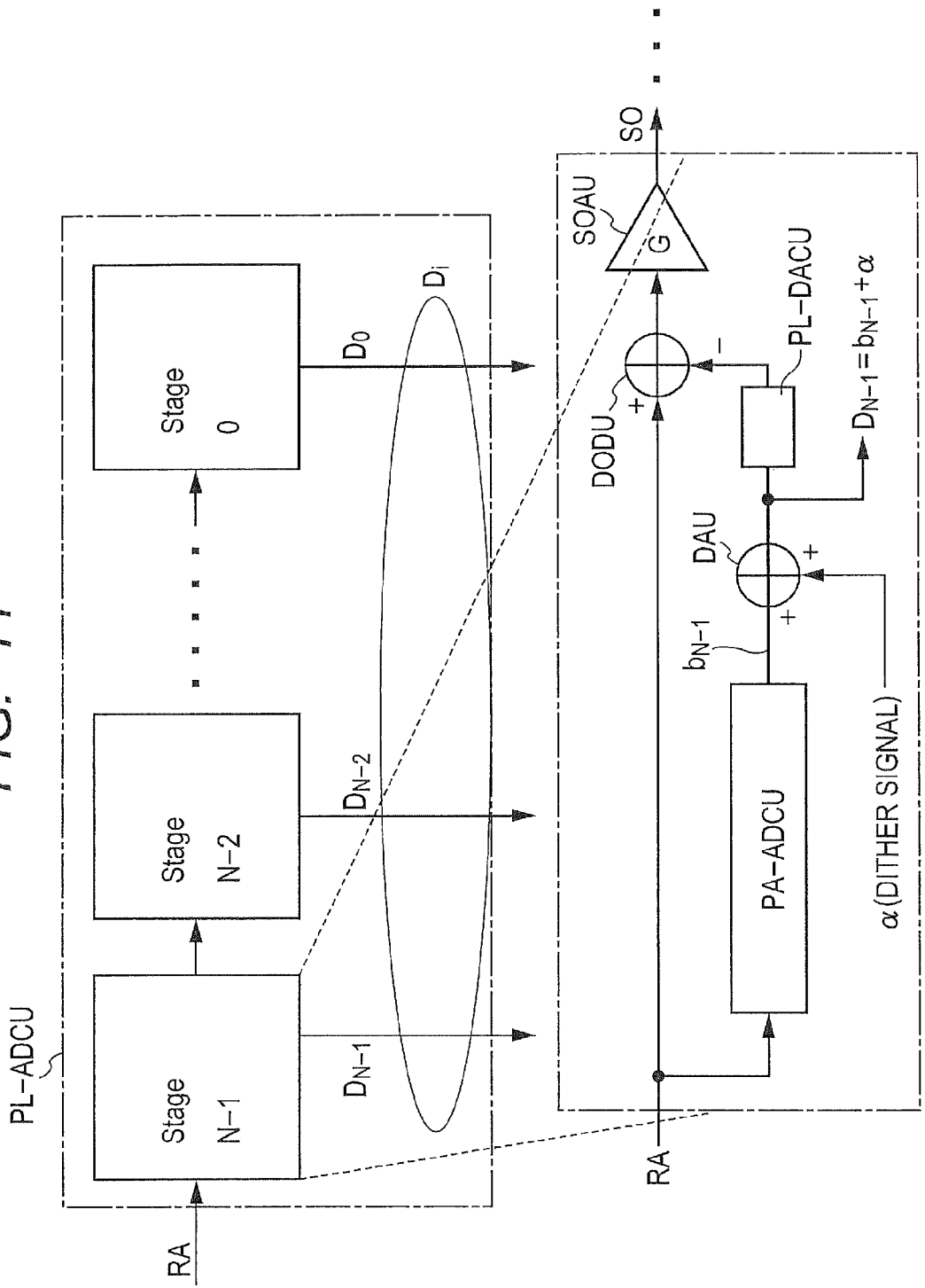
FIG. 11 is a configuration diagram showing a charge redistribution type A/D conversion unit as an example of the A/D conversion unit for I signal and the A/D conversion unit for Q signal according to the first embodiment of the present invention.

FIG. 11 shows a pipeline A/D conversion unit as an example of the A/D conversion unit I-ADCU and the A/D conversion unit Q-ADCU according to the present embodiment.

(1) Configuration

The pipeline A/D conversion unit PL-ADCU is configured as follows. The pipeline A/D conversion unit PL-ADCU receives an analog signal RA outputted from either the variable amplifier I-PGA or the variable amplifier Q-PGA. The pipeline A/D conversion unit PL-ADCU is divided into stages with the stage corresponding to the most significant bit DN−1 of the digital output Di denoted as Stage N−1. Other stages are denoted in the same manner. For example, the stage corresponding to the least significant bit $D_0$ is denoted as Stage 0. Each stage, Stage i, satisfies the following conditions: (i) 0≤k≤N−1 where k is 0 or a positive integer and N is a positive integer of 2 or larger; and (ii) the (k+1) th stage outputs stage output SO to the kth stage; and (iii) the kth stage outputs digital output $D_k$ corresponding to the kth bit. Stage N−1 has an A/D conversion unit PA-ADCU, a dither signal addition unit DAU, and a D/A conversion unit PL-DACU. Stage N−1 also has a digital output difference unit DODU and a stage output amplification unit SOAU. The A/D conversion unit PA-ADCU receives an analog signal RA and converts the analog signal RA into a ternary digital value (or alternatively into a binary digital value). The dither signal addition unit DAU adds the output from the A/D conversion unit PA-ADCU (denoted as output $b_{N-1}$) and the dither signal (α). The D/A conversion unit PL-DACU subjects the output from the dither signal addition unit DAU to D/A conversion processing. The digital output difference unit DODU subtracts the output of the D/A conversion unit PL-DACU from the analog signal RA. The stage output amplification unit SOAU amplifies the output from the digital output difference unit DODU and outputs a stage output SO to the next stage Stage N−2. The output from the dither signal addition unit DAU becomes a digital output $D_{N-1}$.

The other stages are basically the same as Stage N−1, but they each receive not an analog receive signal RA but the stage output SO from the preceding stage. Also, they have no dither signal addition unit DAU and their digital output difference unit DODU directly receives the output of the A/D conversion unit PA-ADCU. The output of the A/D conversion unit PA-ADCU becomes a digital output Di.

(2) Operation (a) A/D Conversion Testing

During A/D conversion testing, an analog receive signal RA is inputted to Stage N−1 and, with a dither signal also inputted, a stage output SO is outputted to the next stage, Stage N−2. This process is repeated until Stage 0 is reached. Consequently, a digital output Di is generated and is outputted to the digital correction unit DCUI&Q.

(b) A/D Conversion Operation

The A/D conversion operation is basically the same as the operation performed for A/D conversion testing, but, in the A/D conversion operation, no dither signal is inputted to Stage N−1.

Namely, in the A/D conversion testing, a digital output Di containing a dither signal component is generated and, in the A/D conversion operation, a digital output Di containing no dither signal component is generated.

(3) Summary

The pipeline ADCU is capable of A/D conversion ranging from 50 MS/s to several hundred MS/s. In the case of the pipeline ADCU, many types of correction coefficients, for example, those related with operational amplifier gains, non-linearity and capacitance mismatches can be used, so that application of a dither signal of a more complicated pattern is effective. Also, correction coefficient searching can be speeded up by enlarging the amplitude of a test signal.

9. Digital Correction Unit for I and Q Signals

Modification Example 1

Figure 12:
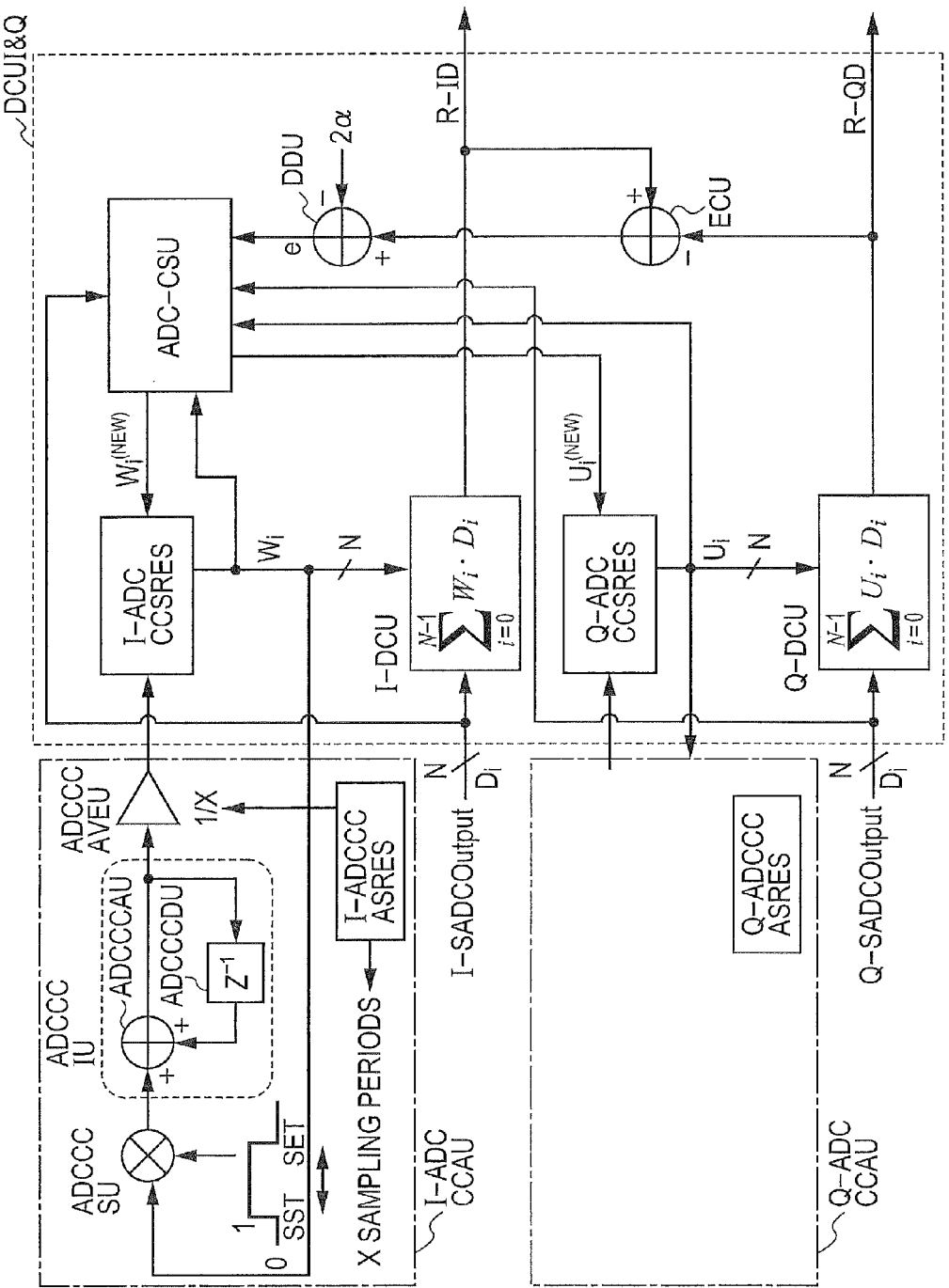
FIG. 12 is a modification example of the semiconductor integrated circuit device.

FIG. 12 shows an example of modification of the semiconductor integrated circuit device RFIC according to the present embodiment.

(1) Configuration

The semiconductor integrated circuit device RFIC shown in FIG. 12 has a correction coefficient averaging unit I-ADCCCAU for averaging correction coefficients I-ADCCC used in the digital correction unit DCUI&Q and a correction coefficient averaging unit Q-ADCCCAU for averaging correction coefficients Q-ADCCC used in the digital correction unit DCUI&Q.

The correction coefficient averaging unit I-ADCCCAU has a correction coefficient sampling unit ADCCCSU, a correction coefficient integration unit ADCCCIU, a correction coefficient averaging unit ADCCCAVEU, and a correction coefficient accuracy setting register I-ADCCCASRES. The correction coefficient sampling unit ADCCCSU multiplies the correction coefficient I-ADCCC by X sampling periods (X being a positive integer) representing the period between a sampling start time SST, i.e. the time when sampling is started, and a sampling end time SET, i.e. the time when sampling is ended. This causes the correction coefficient I-ADCCC to be sampled X times during X sampling periods while, outside the X sampling periods, the correction coefficient I-ADCCC is multiplied by 0 for masking. The correction coefficient I-ADCCC is the one stored in the correction coefficient setting register I-ADCCCSRES. The correction coefficient integration unit ADCCCIU has a correction coefficient addition unit ADCCCAU and a correction coefficient delay unit ADCCCDU and outputs the sum of the sampled values of the correction coefficient I-ADCCC sampled X times. The correction coefficient addition unit ADCCCAU adds the correction coefficient I-ADCCC from the correction coefficient sampling unit ADCCCSU and the previous correction coefficient I-ADCCC. The correction coefficient delay unit ADCCCDU outputs the correction coefficient I-ADCCC received from the correction coefficient addition unit ADCCCAU back to the correction coefficient addition unit ADCCCAU after delaying the correction coefficient I-ADCCC by one sample period. The correction coefficient averaging unit ADCCCAVEU divides the output of the correction coefficient integration unit ADCCCIU by X and outputs the average sampled value of the correction coefficient I-ADCCC sampled during X sampling periods to the correction coefficient setting register I-ADCCCSRES. The correction coefficient accuracy setting register I-ADCCCASRES sets the correction coefficient I-ADCCC calculation accuracy by setting the value of X.

The correction coefficient averaging unit Q-ADCCCAU is configured to be basically the same as the correction coefficient averaging unit I-ADCCCAU. The correction coefficient averaging unit Q-ADCCCAU, however, handles the correction coefficient Q-ADCCC instead of the correction coefficient I-ADCCC and inputs/outputs data to/from the correction coefficient setting register Q-ADCCCSRES. The correction coefficient averaging unit Q-ADCCCAU has a correction coefficient accuracy setting register Q-ADCCCASRES instead of the correction coefficient accuracy setting register I-ADCCCASRES.

(2) Operation

During A/D conversion testing, the correction coefficients I-ADCCC and Q-ADCCC are updated any time and the digital correction units I-DCU and Q-DCU in the I-signal system and the Q-signal system, respectively, perform digital correction processing using the correction coefficients I-ADCCC and Q-ADCCC stored in the digital correction units I-DCU and Q-DCU, respectively. Based on the conversion error e obtained as a result of the digital correction processing, the correction coefficient search unit ADC-CSU searches for the correction coefficients I-ADCCC and Q-ADCCC. Based on the results of searching, the correction coefficients I-ADCCC and Q-ADCCC stored in the correction coefficient setting registers I-ADCCCSRES and Q-ADCCCSRES are updated. This process is repeated as a search loop operation. In parallel with the search loop operation, the correction coefficient averaging units I-ADCCCAU and Q-ADCCCAU operate. During the search loop operation, the correction coefficient averaging units ADCCCAVEU stay inactive, so that no data is outputted to the correction coefficient setting registers I-ADCCCSRES and Q-ADCCCSRES. When the search loop operation is stopped, the correction coefficient averaging units ADCCCAVEU calculates, by performing division processing, an average correction coefficient for each A/D converter and output the averaged correction coefficients to the correction coefficient setting registers I-ADCCCSRES and Q-ADCCCSRES.

(3) Summary

When an algorithm such as an LMS algorithm is used, a control loop gain, which is the control gain of a search loop like the one described above, used to calculate each of the correction coefficients I-ADCCC and Q-ADCCC is made large so as to cause each of the correction coefficients I-ADCCC and Q-ADCCC to converge fast. Doing so, however, causes the control loop gain to widely oscillate even after convergence of the correction coefficient I-ADCCC or Q-ADCCC. The control loop gain is also caused to oscillate after convergence of the correction coefficient I-ADCCC or Q-ADCCC under effects of thermal noise and quantization noise. The effects of such control loop gain oscillation can be reduced by averaging each of the correction coefficients I-ADCCC and Q-ADCCC. Note that the search loop includes no circuits for averaging each of the correction coefficients I-ADCCC and Q-ADCCC. The correction coefficients I-ADCCC and Q-ADCCC are respectively averaged by the correction coefficient averaging units I-ADCCCAU and Q-ADCCCAU provided outside the search loop so as not to slow down the search loop operation. While the search loop operation is taking place, the correction coefficient averaging units ADCCCAVEU do not operate and no data is outputted to the correction coefficient setting registers I-ADCCCSRES and Q-ADCCCSRES. When the search loop operation is stopped, the correction coefficient averaging units ADCCCAVEU average, by performing division processing, each of the correction coefficients I-ADCCC and Q-ADCCC and outputs the averaged correction coefficients I-ADCCC and Q-ADCCC to the correction coefficient setting registers I-ADCCCSRES and Q-ADCCCSRES, respectively. In this way, each of the correction coefficients I-ADCCC and Q-ADCCC can be averaged while quickening the responses of the search loop operation.

Increasing the value of X set in each of the correction coefficient accuracy setting registers I-ADCCCASRES and Q-ADCCCASRES increases the number of samples collected for averaging each of the correction coefficients I-ADCCC and Q-ADCCC. This enhances the averaging effect and makes it possible to obtain the correction coefficient coefficients I-ADCCC and Q-ADCCC of higher accuracy. When the value of X is small, the accuracy of averaging is low, but, since the number of samples collected for averaging each of the correction coefficients I-ADCCC and Q-ADCCC is small, the time taken for averaging processing can be reduced. Also, when the value of X is limited to a power of 2, the correction coefficient averaging unit ADCCCAVEU can function by performing bit shifting operation without involving any division processing.

10. Test Signal Generation Circuit for A/D Converter

Example 4

Figure 13:
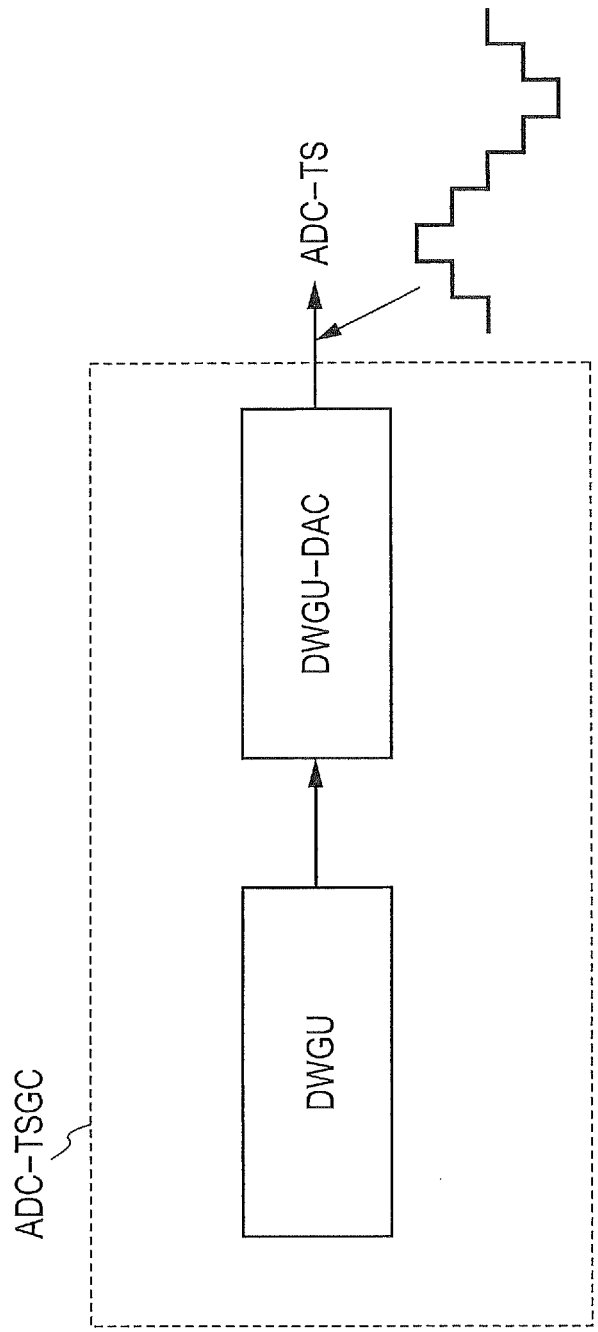
FIG. 13 shows an example of a test signal generation circuit for A/D converter.

FIG. 13 shows an example of a test signal generation circuit ADC-TSGC for generating a test signal ADC-TS for use by the semiconductor integrated circuit device RFIC according to the present embodiment.

In FIG. 13, the test signal generation circuit ADC-TSGC is enclosed by a broken line. The test signal generation circuit ADC-TSGC has a digital waveform generation circuit DWGU and a D/A converter DWGU-DAC. The D/A converter DWGU-DAC receives the output of the digital waveform generation unit DWGU and, by subjecting the received output to D/A conversion processing, generates a test signal ADC-TS. The test signal generation circuit ADC-TSGC is provided in the semiconductor integrated circuit device RFIC.

The output of the digital waveform generation unit DWGU is preferably a triangular waveform of an adequately low frequency having an amplitude close to the full scale (voltage range allowable for A/D conversion) of the A/D converter I-ADC and the A/D converter Q-ADC. Such an output of the digital waveform generation unit DWGU allows, when the test signal ADC-TS is sampled by the A/D converters I-ADC and Q-ADC, voltages of adequately diversified patterns to be sampled. This is to enable normal convergence of all searches for the correction coefficients I-ADCCC and Q-ADCCC.

The test signal ADC-TS outputted from the D/A converter DWGU-DAC may carry large noise or may be largely distorted. In digital correction processing, in order to search for the correction coefficients I-ADCCC and Q-ADCCC with high accuracy, it is important that the A/D converters I-ADC and Q-ADC sample strictly equal input voltages. Even if the test signal ADC-TS contains noise or is distorted, the A/D converters I-ADC and Q-ADC sample the test signal ADC-TS together with noise and distortion at a same time, so that the voltages sampled by the A/D converters I-ADC and Q-ADC are kept strictly equal to each other. Thus, noise and distortion caused by the D/A converter DWGU-DAC is tolerable. This makes designing the D/A converter DWGU-DAC easy.

11. Test Signal Generation Circuit for A/D Converter

Example 5

Figure 14:
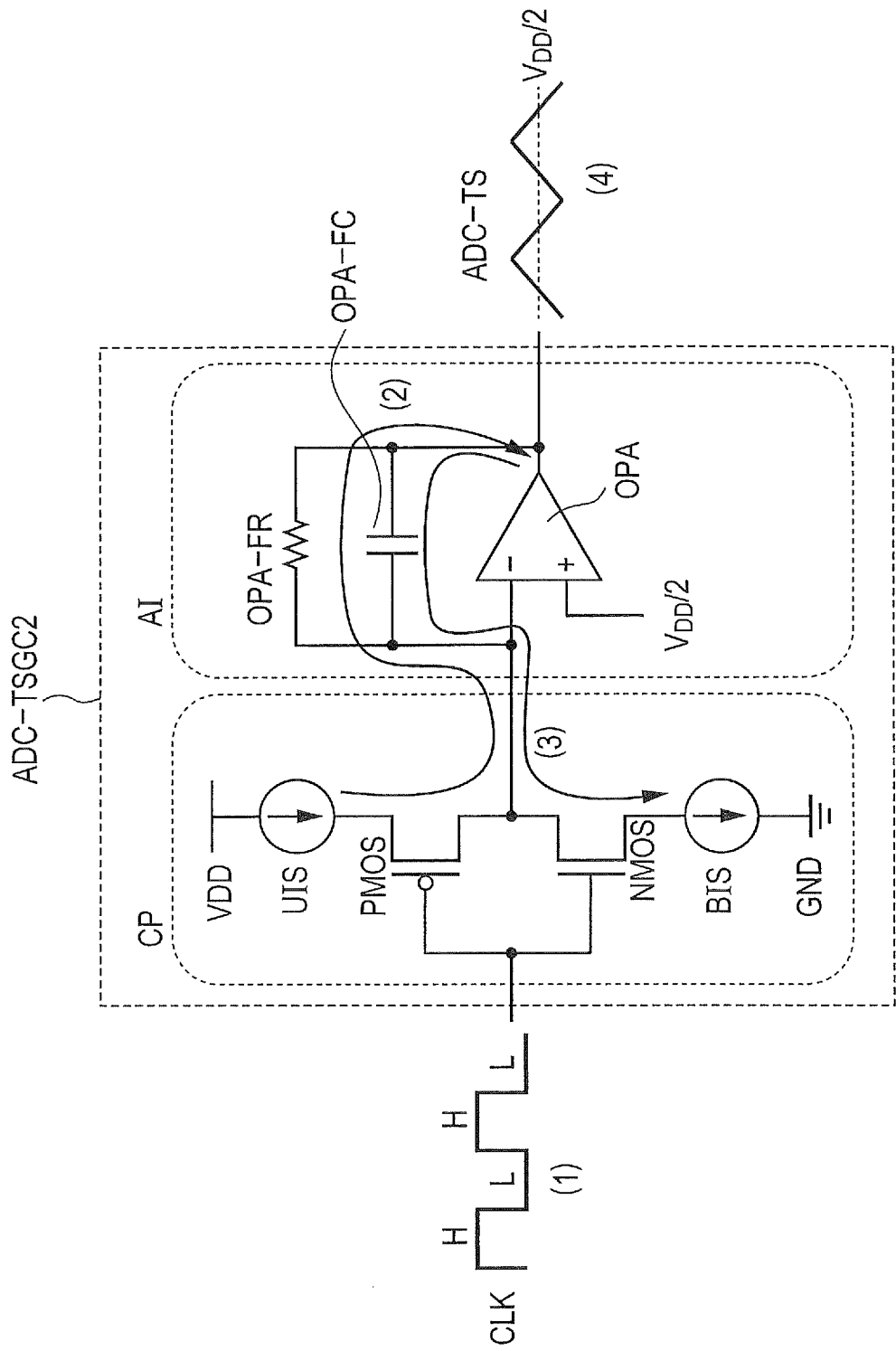
FIG. 14 shows an example of a test signal generation circuit for A/D converter.

FIG. 14 shows an example of a test signal generation circuit ADC-TSGC2 for generating a test signal ADC-TS for use by the semiconductor integrated circuit device RFIC according to the present embodiment.

(1) Configuration

In FIG. 14, the test signal generation circuit ADC-TSGC2 is enclosed by a broken line. The test signal generation circuit ADC-TSGC2 has a charge pump CP and an analog integrator AI. The charge pump CP receives a clock signal CLK denoted by (1) in FIG. 14 and outputs an electric current. The analog integrator AI receives the output of the charge pump CP and outputs a test signal ADC-TS denoted by (4) in FIG. 14. The test signal generation circuit ADC-TSGC2 is provided in the semiconductor integrated circuit device RFIC.

The charge pump CP has an upper-side current source UIS, a p-type MOS transistor PMOS, an n-type MOS transistor NMOS, and a bottom-side current source BIS. Plural constituent elements of the charge pump CP are coupled between the supply voltage VDD and the ground voltage GND as shown in FIG. 14. As shown, they are arranged, from the supply voltage VDD side toward the ground voltage GND side, in the order of the upper-side current source UIS, the p-type MOS transistor PMOS, the n-type MOS transistor NMOS, and the bottom-side current source BIS. Namely, the source terminal of the p-type MOS transistor PMOS is coupled to the upper-side current source UIS and the source terminal of the n-type MOS transistor NMOS is coupled to the bottom-side current source BIS. The drain terminal of the p-type MOS transistor PMOS and the drain terminal of the n-type MOS transistor NMOS are coupled to each other. A clock signal CLK denoted by (1) in FIG. 14 is inputted to the gate of each of the p-type MOS transistor PMOS and the n-type MOS transistor NMOS. When the clock signal CLK is at a high level, an electric current flows through the bottom-side current source BIS through a path denoted by (3) in FIG. 14. When the clock signal is at a low level, an electric current flows through the upper-side current source UIS through a path denoted by (2) in FIG. 14.

The analog integrator AI has an operational amplifier OP-A, a feedback capacitor OPA-FC, and a feedback resistor OPA-FR. A non-inverted input terminal of the operational amplifier OP-A receives a voltage equaling ½ of the supply voltage VDD. An inverted input terminal of the operational amplifier OP-A receives the output of the charge pump CP. The feedback capacitor OPA-FC is coupled in parallel between the inverted input terminal and the output terminal of the operational amplifier OP-A. The feedback resistor OPA-FR is coupled in parallel with the feedback capacitor OPA-FC.

(2) Operation

The test signal generation circuit ADC-TSGC2 operates as follows. When the test signal generation circuit ADC-TSGC2 receives the clock signal CLK, the charge pump CP operates causing an electric current to flow through the feedback capacitor OPA-FC through the paths denoted by (2) and (3) in FIG. 14. When the electric current flows through the path denoted by (2), the test signal ADC-TS changes in a decreasing direction. When the electric current flows through the path denoted by (3), the test signal ADC-TS changes in an increasing direction. This causes a test signal ADC-TS having a triangular waveform as denoted by (4) in FIG. 14 to be outputted, as the output of the analog integrator AI, from the test signal generation circuit ADC-TSGC2. The feedback resistor OPA-FR is a DC feed resistor having a high resistance. It is used to cause the test signal ADC-TS to operate with a waveform centered around one half of the supply voltage VDD. The frequency of the clock signal CLK becomes the frequency of the triangular wave used as the test signal ADC-TS.

The clock signal CLK is to have an adequately low frequency generated by dividing the frequency of the sampling clock for the A/D converters I-ADC and Q-ADC. The amplitude of the triangular wave is to be set based on the current values of the upper-side current source UIS and bottom-side current source BIS and the capacitance value of the feedback capacitor OPA-FC such that the amplitude is of a magnitude close to the full scale of the A/D converters I-ADC and Q-ADC. All this is to allow searching for the correction coefficients I-ADCCC and Q-ADCCC to converge securely. As in example 4, noise and distortion contained in the test signal ADC-TS is tolerable, so that the test signal generation circuit ADC-TSGC2 can be designed with ease.

12. Test Signal Generation Circuit for A/D Converter

Example 6

Figure 15:
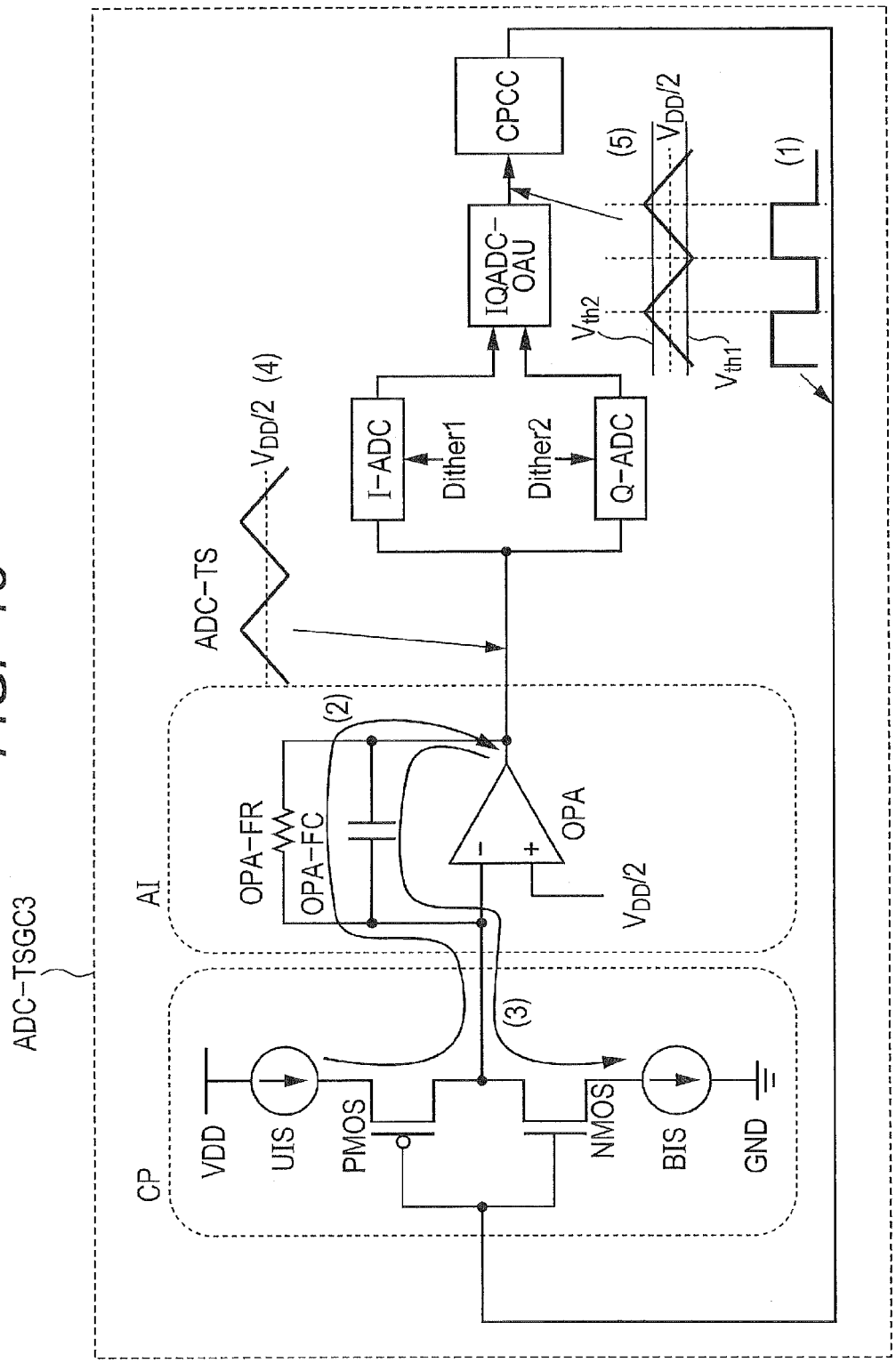
FIG. 15 shows an example of a test signal generation circuit for A/D converter.

FIG. 15 shows an example of a test signal generation circuit ADC-TSGC3 for generating a test signal ADC-TS for use by the semiconductor integrated circuit device RFIC according to the present embodiment.

(1) Configuration

In FIG. 15, the test signal generation circuit ADC-TSGC3 is enclosed by a broken line. The test signal generation circuit ADC-TSGC3 like the test signal generation circuit ADC-TSGC2 of example 5 has a charge pump CP and an analog integrator AI. In addition, the test signal generation circuit ADC-TSGC3 has an A/D converter I-ADC, an A/D converter Q-ADC, an A/D converter output averaging unit (averaging circuit) IQADC-OAU, and a charge pump control circuit CPCC. The charge pump CP receives a clock signal CLK denoted by (1) and outputs an electric current. The analog integrator AI receives the output of the charge pump CP and outputs a test signal ADC-TS denoted by (4). The A/D converters I-ADC and Q-ADC receive the output of the charge pump CP. The A/D converter output averaging unit IQADC-OAU receives the outputs of the A/D converters I-ADC and Q-ADC and outputs, after averaging the two outputs, an average value. The charge pump control circuit CPCC receives the output of the A/D converter output averaging unit IQADC-OAU and generates a clock signal CLK for input to the charge pump CP. The test signal generation circuit ADC-TSGC3 is configured with these constituent elements as a loop circuit. The test signal generation circuit ADC-TSGC3 is provided in the semiconductor integrated circuit device RFIC.

(2) Operation

The operation of the test signal generation circuit ADC TSGC performed for A/D conversion testing will be described in the following. As described in connection with example 6, an electric current flowing through the paths denoted by (2) and (3) in FIG. 15 causes a test signal ADC-TS denoted by (4) to be inputted to the A/D converters I-ADC and Q-ADC. A first dither signal Dither1 is inputted to the A/D converter I-ADC and a second dither signal Dither2 is inputted to the A/D converter Q-ADC. At the A/D converter output averaging unit IQADC-OAU, the components of the dither signals are canceled and a signal denoted by (5) is outputted from the A/D converter output averaging unit IQADC-OAU. This output signal is the test signal ADC-TS having undergone A/D conversion processing. The charge pump control circuit CPCC receives the signal (5). When the signal (5) becomes lower than a first threshold voltage Vth1, the charge pump control circuit CPCC outputs a high-level signal. When the signal (5) becomes higher than a second threshold voltage Vth2 which is higher than the first threshold voltage Vth1, the charge pump control circuit CPCC outputs a low-level signal. This causes a clock signal CLK denoted by (1) to be generated and outputted to the charge pump CP. The test signal generation circuit ADC-TSGC3 configured as a loop circuit functions as a triangle wave transmitter. The correction coefficients I-ADCCC and Q-ADCCC are generated using the triangular test signal ADC-TS.

Compared to example 5, example 6 is superior in that the amplitude of the triangular wave can be controlled using the first threshold voltage Vth1 and the second threshold voltage Vth2 making it possible to avoid possible saturation due to variations of the upper-side current source UIS, bottom-side current source BIS and feedback capacitor OPA-FC.

The frequency of the triangular wave of example 6 is determined by the first threshold voltage Vth1, the second threshold voltage Vth2, the upper-side current source UIS, the bottom-side current source BIS and the feedback capacitor OPA-FC. Unlike in example 5, it is not an integral division of the sampling clock frequency. Therefore, in example 6, the frequency of the triangular wave can be set irrelevantly to the frequency of the sampling clock for the A/D converters I-ADC and Q-ADC. This causes diversified patterns of triangular wave voltages to be sampled by the A/D converters I-ADC and Q-ADC and advantageously affects searching for the correction coefficients I-ADCCC and Q-ADCCC.

13. Other Modification Examples (1) Dither Signals

In the present embodiment, the first dither signal Dither1 inputted to the A/D conversion unit I-ADCU and the second dither signal Dither 2 inputted to the A/D converter Q-ADCU are equal in absolute value while having opposite signs. Namely, when the first dither signal Dither1 equals $\alpha$, the second dither signal Dither2 equals $-\alpha$. However, the relationship between the first dither signal Dither1 and the second dither signal Dither2 need not necessarily be like that. For example, when the first dither signal Dither1 equals $2\alpha$, the second dither signal Dither2 may equal 0; or when the first dither signal Dither1 equals 0, the second dither signal Dither2 may equal $2\alpha$. Namely, when one of the first and second dither signals equals 0, the other may equal $2\alpha$.

(2) Mismatches

In the present embodiment, it is most desirable that the I/Q correction unit I/QCU detects and corrects gain, phase and DC offset mismatches caused over the paths between the mixer RI-MIX and the variable amplifier I-PGA and between the mixer RQ-MIX and the variable amplifier Q-PGA in the analog circuit R-AC, but an alternative configuration may be used in which mismatches of at least one (or two) of gain, phase and DC offset are detected and corrected.

(3) Calibration Processing

In the present embodiment, the following circuits included in the analog circuits R-AC and T-AC are calibrated in the initial sequence period: (a) the low-noise amplifier LNA, the filter I-FIL, the filter Q-FIL, the variable amplifier I-PGA, the variable amplifier Q-PGA, and the clock pulse generator CPG in the analog circuit R-AC; and (b) the D/A converter I-DAC, the D/A converter Q-DAC, the low-pass filter I-LPF, the low-pass filter Q-LPF, and the power amplifier PA in the analog circuit T-AC. The calibration processing for these circuit components need not necessarily be performed in the initial sequence period. The calibration processing may be performed in the ADC correction mode ADC-CM. Particularly, when the calibration processing is performed in periodical no-signal periods, it is possible to obtain calibration results corresponding to temperature and source voltage variations in the circuit components, so that the accuracy of demodulation/modulation processing can be improved. Also, when and how often to perform the calibration processing may be determined individually for the respective circuit components. When an optimum frequency of calibration and optimum times for calibration are determined for each circuit component, it is possible to improve the accuracy of modulation/demodulation processing and achieve optimum power consumption. Preferably, the above circuit components, the circuit components of the analog circuit R-AC, in particular, are calibrated before the I/Q correction mode I/QC-CM. The reason is as follows. The I/Q correction unit I/QCU detects and corrects gain, phase and DC offset mismatches caused over the paths between the mixer RI-MIX and the variable amplifier I-PGA and between the mixer RQ-MIX and the variable amplifier Q-PGA in the analog circuit R-AC. In cases where offsets of various circuit components provided along the path between the mixer RI-MIX and the variable amplifier I-PGA or along the path between the mixer RQ-MIX and the variable amplifier Q-PGA are not optimally corrected, the I/Q correction unit I/QCU cannot detect and correct, with high accuracy, gain, phase and DC offset mismatches.

(4) Test Signal for I/Q Correction

In the present embodiment, the calibration signal generation circuit I/QCU-CSG is configured to output the test signal I/QC-TS to the low-pass filter I-LPF for the analog I signal T-IA and the low-pass filter Q-LPF for the analog Q signal T-QA. However, since the test signal I/QC-TS is only required to pass through the path between the mixer RI-MIX and the variable amplifier I-PGA and the path between the mixer RQ-MIX and the variable amplifier Q-PGA, an alternative configuration may be used in which the test signal I/QC-TS is directly inputted to a point between the low-noise amplifier LNA and the mixers RI-MIX and RQ-MIX. Note that the loop switch L-SW is provided at the position shown in FIG. 5 so as to allow the test signal I/QC-TS to pass through the path between the mixer RI-MIX and the variable amplifier I-PGA and the path between the mixer RQ-MIX and the variable amplifier Q-PGA. Also note that the switch circuits I-SC and Q-SC are provided at the positions shown in FIG. 5 so as to prevent the test signal I/Q-TS passing through the path between the mixer RI-MIX and the variable amplifier I-PGA and the path between the mixer RQ-MIX and the variable amplifier Q-PGA from causing the A/D conversion testing to be affected by varied offsets of the circuit components. The order in which the filter and the variable amplifier are arranged along each of the path between the mixer RI-MIX and the A/D converter I-ADC and the path between the mixer RQ-MIX and the variable amplifier Q-PGA may be reversed. Also, along each of the paths, plural filters and variable amplifiers may be alternately arranged.

(5) ADC

In the configurations or functions described in (4) to (9) under "5. Summary" above, the first A/D converter may be the A/D converter I-ADC shown in FIG. 5 and the second A/D converter may be the A/D converter Q-ADC shown in FIG. 5. The first A/D converter is provided between the analog circuit R-AC and the digital processing unit DOU and may be any one of the ADCs shown in reference drawings FIGS. 1 to 4. In this case, the analog signal (Input) to be inputted to the ADC shown in one of the reference drawings FIGS. 1 to 4 is provided by the output of the variable amplifier I-PGA for I signal, and the digital signal (Output) outputted from the ADC shown in reference drawings FIGS. 1 to 4 is inputted to the input part for receiving the digital I signal R-ID of the I/Q correction unit I/QCU. The second A/D converter is provided between the analog circuit R-AC and the digital processing unit DOU and may be any one of the ADCs shown in reference drawings FIGS. 1 to 4. In this case, the analog signal (Input) to be inputted to the ADC shown in one of the reference drawings FIGS. 1 to 4 is provided by the output of the variable amplifier Q-PGA for Q signal, and the digital signal (Output) outputted from the ADC shown in reference drawings FIGS. 1 to 4 is inputted to the input part for receiving the digital Q signal R-QD of the I/Q correction unit I/QCU. Namely, the ADC to be provided along the I signal path is to be one which receives the analog I signal R-IA, subjects, by performing digital correction processing, the analog I signal R-IA to A/D conversion processing, and consequently generates a digital I signal R-ID. Similarly, the ADC to be provided along the Q signal path is to be one which receives the analog Q signal R-QA, subjects, by performing digital correction processing, the analog Q signal R-QA to A/D conversion processing, and consequently generates a digital Q signal R-QD. When using the ADC shown in reference drawing FIG. 1, FIG. 3 or FIG. 4 as the first A/D converter, the switch circuit I-SC is to be coupled to the stage preceding the ADC so as to make the test signal inputted to the A/D converter and the output of the variable amplifier I-PGA switchable between the first mode and the second mode. When using the ADC shown in reference drawing FIG. 1, FIG. 3 or FIG. 4 as the second A/D converter, the switch circuit Q-SC is to be coupled to the stage preceding the ADC so as to make the test signal inputted to the A/D converter and the output of the variable amplifier Q-PGA switchable between the first mode and the second mode.

Second Embodiment

Figure 16:
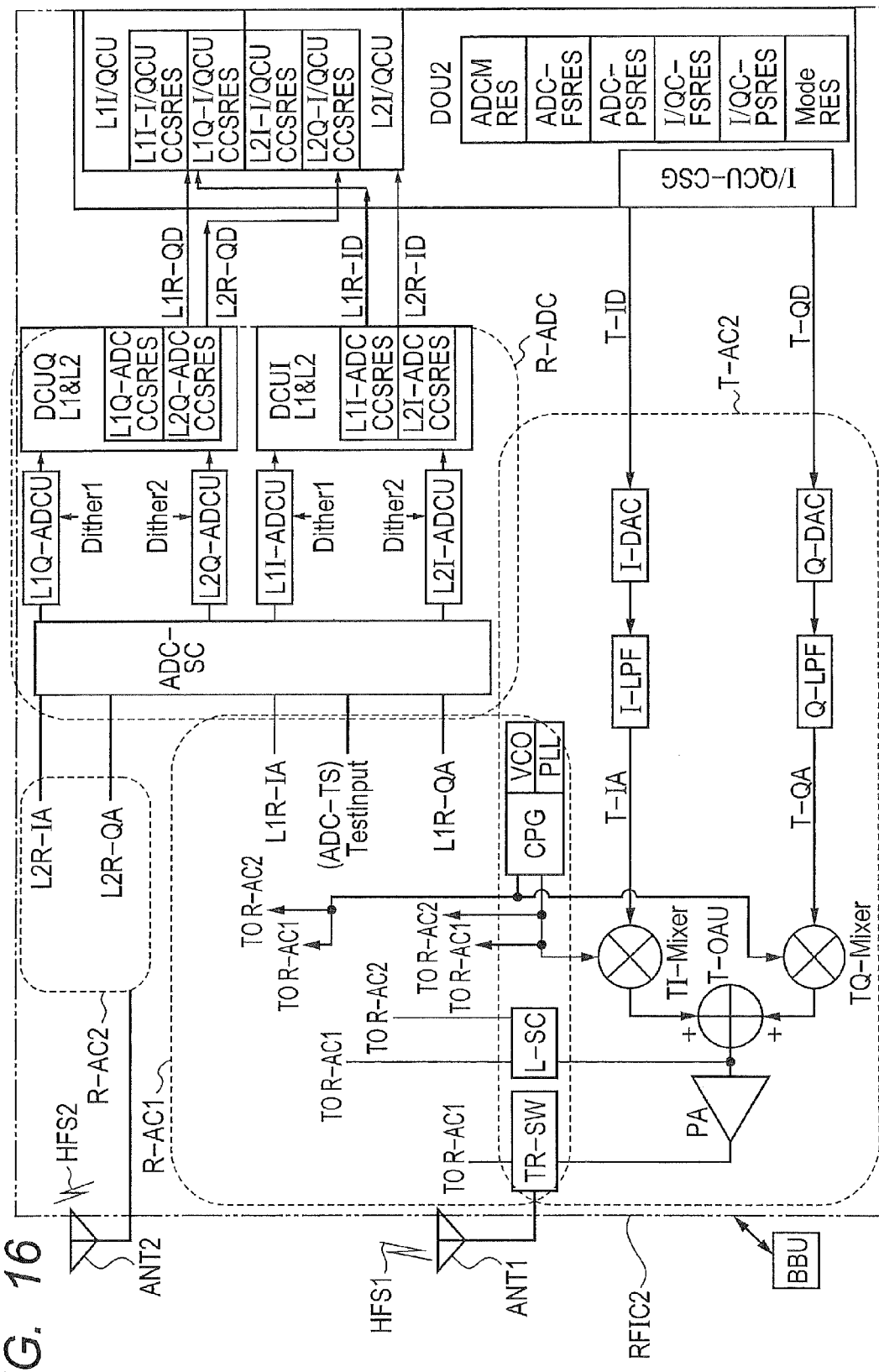
FIG. 16 is a configuration diagram of a communication system including a semiconductor integrated circuit device according to a second embodiment of the present invention.

In the following, the configuration of the semiconductor integrated circuit device according to a second embodiment of the present invention, the configuration of a communication system including the semiconductor integrated circuit device, and the semiconductor integrated circuit will be described in detail with reference to drawings. FIG. 16 shows the configuration of the communication system including the semiconductor integrated circuit device.

In the following, the second embodiment will be described centering on its aspects differing from the first embodiment.

In the present embodiment, unlike in the first embodiment in which a single antenna is used, two antennas are used corresponding to two analog circuits for reception. The A/D converter for I and Q signals provided in a stage following the analog circuits for reception is configured differently from the first embodiment. Furthermore, the digital processing unit is also configured differently from the first embodiment.

1. Communication System

The constituent elements of the communication system of the present embodiment differ from those of the communication system of the first embodiment. The communication system of the present embodiment has a first antenna ANT1, a second antenna ANT2, a semiconductor integrated circuit device RFIC2, and a base-band processing unit BBU. The first antenna ANT1 receives a first high-frequency signal HFS1 as a communication signal from outside. The second antenna ANT2 receives a second high-frequency signal HFS2 which is of the same kind as the first high-frequency signal HFS1 but is physically separated from the first high-frequency signal HFS1. The base-band processing unit BBU is the same as that used in the first embodiment.

2. Semiconductor Integrated Circuit Device (1) Configuration

The semiconductor integrated circuit device RFIC2 has a first analog circuit R-AC1, a second analog circuit R-AC2, and an A/D converter R-ADC each having constituent elements different from those of the corresponding parts of the first embodiment. The semiconductor integrated circuit device RFIC2 further has a digital processing unit DOU2 and an analog circuit T-AC2.

In FIG. 16, the first analog circuit R-AC1 is enclosed by a chain line. The first analog circuit R-AC1 receives a first high-frequency signal HFS1 via the first antenna ANT1 and generates an analog I signal L1R-IA and an analog Q signal L1R-QA which is shifted in phase 90 degrees from the analog I signal L1R-IA. The second analog circuit R-AC2 is enclosed by a chain line in FIG. 16. The second analog circuit R-AC2 receives a second high-frequency signal HFS2 via the second antenna ANT2 and generates an analog I signal L2R-IA and an analog Q signal L2R-QA which is shifted in phase 90 degrees from the analog I signal L2R-IA. The A/D converter R-ADC is enclosed by a chain line in FIG. 16. The A/D converter R-ADC receives the analog I signal L1R-IA and, by subjecting the analog I signal L1R-IA to A/D conversion processing, generates a digital I signal L1R-ID. The A/D converter R-ADC also receives the analog Q signal L1R-QA and, by subjecting the analog Q signal L1R-QA to A/D conversion processing, generates a digital Q signal L1R-QD. Furthermore, the A/D converter R-ADC receives the analog I signal L2R-IA and the analog Q signal L2R-QA and, by subjecting them to A/D conversion processing, generates a digital I signal L2R-ID and a digital Q signal L2R-QD.

Regarding the analog circuits for reception, the analog circuit R-AC of the first embodiment has the loop switch L-SW. In the present embodiment, the first analog circuit R-AC1 and the second analog circuit R-AC2 share a loop switch circuit L-SC instead of the loop switch L-SW. In the I/Q correction testing, the loop switch circuit L-SC couples the output of the output addition unit T-OAU to a reception mixer of each of the first analog circuit R-AC1 and the second analog circuit R-AC2. In the I/Q correction operation, the loop switch circuit L-SC decouples the coupling between the output addition unit T-OAU and the first and second analog circuits R-AC1 and R-AC2. The loop switch circuit L-SC and the clock pulse generator CPG are shared by the analog circuit T-AC2, the first analog circuit R-AC1 and the second analog circuit R-AC2. The transmission/reception changeover switch TR-SW is shared by the analog circuit T-AC2 and the first analog circuit R-AC1, but the second analog circuit R-AC2 does not share it. The output of the analog circuit T-AC2 is transmitted to outside from the first antenna ANT1 via the transmission/reception changeover switch TR-SW. A first mixer signal is outputted to the first analog circuit R-AC1 and the second analog circuit R-AC2. A second mixer signal is also outputted to the first analog circuit R-AC1 and the second analog circuit R-AC2. In other respects, there is not any particular difference in configuration between the analog circuit R-AC of the first embodiment and each of the first analog circuit R-AC1 and the second analog circuit R-AC2. Obviously, since the input signals differ between the first embodiment and the present embodiment as described above, the signals internally processed also differ between the first embodiment and the present embodiment.

The A/D converter R-ADC has a switch circuit ADC-SC. In the A/D conversion testing, the switch circuit ADC-SC outputs a common test signal ADC-TS to the A/D conversion units in the following stage. In the A/D conversion operation, the switch circuit ADC-SC outputs the analog I signal L1R-IA, analog Q signal L1R-QA, analog I signal L2R-IA, and analog Q signal L2R-QA to the corresponding A/D conversion units in the following stage. The A/D converter R-ADC has an A/D conversion unit L1I-ADCU, an A/D conversion unit L2I-ADCU, and a digital correction unit DCUIL1&L2. The A/D converter R-ADC also has an A/D conversion unit L1Q-ADCU, an A/D conversion unit L2Q-ADCU, and a digital correction unit DCUQL1&L2.

The digital correction unit DCUIL1&L2 has a correction coefficient setting register L1I-ADCCCSRES and a correction coefficient setting register L2I-ADCCCSRES. The correction coefficient setting register L1I-ADCCCSRES is for storing a correction coefficient for use in digitally correcting the digital output from the A/D conversion unit L1I-ADCU. The correction coefficient setting register L2I-ADCCCSRES is for storing a correction coefficient for use in digitally correcting the digital output from the A/D conversion unit L2I-ADCU.

The digital correction unit DCUQL1&L2 has a correction coefficient setting register L1Q-ADCCCSRES and a correction coefficient setting register L2Q-ADCCCSRES. The correction coefficient setting register L1Q-ADCCCSRES is for storing a correction coefficient for use in digitally correcting the digital output from the A/D conversion unit L1Q-ADCU. The correction coefficient setting register L2Q-ADCCCSRES is for storing a correction coefficient for use in digitally correcting the digital output from the A/D conversion unit L2Q-ADCU.

The digital processing unit DOU2 and the analog circuit T-AC2 will be described later.

(2) Operation (a) A/D Conversion Testing

A/D conversion testing is performed as follows. A test signal ADC-TS is inputted via the switch circuit ADC-SC to the A/D conversion units L1I-ADCU, L1Q-ADCU, L2I-ADCU, and L2Q-ADCU.

The A/D conversion unit L1I-ADCU receives, in addition to the test signal ADC-TS, a first dither signal Dither1 and, after subjecting the test signal ADC-TS and the first dither signal Dither1 to A/D conversion processing, outputs a resultant digital signal to the digital correction unit DCUIL1&L2. The A/D conversion unit L2I-ADCU receives, in addition to the test signal ADC-TS, a second dither signal Dither1 and, after subjecting the test signal ADC-TS and the second dither signal Dither1 to A/D conversion processing, outputs a resultant digital signal to the digital correction unit DCUIL1&L2.

The A/D conversion unit L1Q-ADCU receives, in addition to the test signal ADC-TS, a first dither signal Dither1 and, after subjecting the test signal ADC-TS and the first dither signal Dither1 to A/D conversion processing, outputs a resultant digital signal to the digital correction unit DCUQL1&L2. The A/D conversion unit L2Q-ADCU receives, in addition to the test signal ADC-TS, a second dither signal Dither2 and, after subjecting the test signal ADC-TS and the second dither signal Dither2 to A/D conversion processing, outputs a resultant digital signal to the digital correction unit DCUQL1&L2.

The digital correction unit DCUIL1&L2 obtains a result of digitally correcting the digital output of the A/D conversion unit L1I-ADCU and a result of digitally correcting the digital output of the A/D conversion unit L2I-ADCU. Subsequently, the digital correction unit DCUIL1&L2 determines, based on the correction results obtained, a correction coefficient L1I-ADCCC to be stored in the correction coefficient setting register L1I-ADCCCSRES and a correction coefficient L2I-ADCCC to be stored in the correction coefficient setting register L2I-ADCCCSRES, then stores the respective correction coefficients in the respective correction coefficient setting registers.

The digital correction unit DCUQL1&L2 obtains a result of digitally correcting the digital output of the A/D conversion unit L1Q-ADCU and a result of digitally correcting the digital output of the A/D conversion unit L2Q-ADCU. Subsequently, the digital correction unit DCUQL1&L2 determines, based on the correction results obtained, a correction coefficient L1Q-ADCCC to be stored in the correction coefficient setting register L1Q-ADCCCSRES and a correction coefficient L2Q-ADCCC to be stored in the correction coefficient setting register L2Q-ADCCCSRES, then stores the respective correction coefficients in the respective correction coefficient setting registers.

(b) A/D Conversion Operation

The A/D conversion operation is performed as follows. The analog I signal L1R-IA is inputted to the A/D conversion unit L1I-ADCU via the switch circuit ADC-SC. The analog I signal L2R-IA is inputted to the A/D conversion unit L2I-ADCU via the switch circuit ADC-SC. The analog Q signal L1R-QA is inputted to the A/D conversion unit L1Q-ADCU via the switch circuit ADC-SC. The analog Q signal L2R-QA is inputted to the A/D conversion unit L2Q-ADCU via the switch circuit ADC-SC.

The analog I signal L1R-IA inputted to the A/D conversion unit L1I-ADCU is converted into a digital signal and is outputted to the digital correction unit DCUIL1&L2. The analog I signal L2R-IA inputted to the A/D conversion unit L2I-ADCU is converted into a digital signal and is outputted to the digital correction unit DCUIL1&L2. The analog Q signal L1R-QA inputted to the A/D conversion unit L1Q-ADCU is converted into a digital signal and is outputted to the digital correction unit DCUQL1&L2. The analog Q signal L2R-QA inputted to the A/D conversion unit L2Q-ADCU is converted into a digital signal and is outputted to the digital correction unit DCUQL1&L2.

The digital correction unit DCUIL1&L2 digitally corrects the output from the A/D conversion unit L1I-ADCU using the correction coefficient L1I-ADCCC stored in the correction coefficient setting register L1I-ADCCCSRES and outputs a digital I signal L1R-ID as a result of A/D conversion processing performed at the A/D converter R-ADC. The digital correction unit DCUIL1&L2 digitally corrects the output from the A/D conversion unit L2I-ADCU using the correction coefficient L2I-ADCCC stored in the correction coefficient setting register L2I-ADCCCSRES and outputs a digital I signal L2R-ID as a result of A/D conversion processing performed at the A/D converter R-ADC.

The digital correction unit DCUQL1&L2 digitally corrects the output from the A/D conversion unit L1Q-ADCU using the correction coefficient L1Q-ADCCC stored in the correction coefficient setting register L1Q-ADCCCSRES and outputs a digital Q signal L1R-QD as a result of A/D conversion processing performed at the A/D converter R-ADC. The digital correction unit DCUQL1&L2 digitally corrects the output from the A/D conversion unit L2Q-ADCU using the correction coefficient L2Q-ADCCC stored in the correction coefficient setting register L2Q-ADCCCSRES and outputs a digital Q signal L2R-QD as a result of A/D conversion processing performed at the A/D converter R-ADC.

The configuration and operation of each of the above A/D conversion units are the same as those of each A/D conversion unit of the first embodiment. The internal configuration and operation of each digital correction unit are basically the same as those of each digital correction unit of the first embodiment, but the correction coefficient setting registers used for A/D conversion described above differ from those of the first embodiment. Excepting such different parts, the digital correction units of the present embodiment are basically the same as the digital correction units, described with reference to FIG. 7, of the first embodiment. Obviously, since the input signals differ between the first embodiment and the present embodiment as described above, the signals internally processed also differ between the first embodiment and the present embodiment.

3. Digital Processing Unit (1) Configuration

Unlike the digital processing unit DOU of the first embodiment, the digital processing unit DOU2 of the present embodiment has two I/Q correction units L1I/QCU and L2I/QCU. The I/Q correction unit L1I/QCU detects gain, phase and DC offset mismatches caused over the path between the mixer and the variable amplifier in the I-signal system of the analog circuit R-AC1 and the path between the mixer and the variable amplifier in the Q signal system of the analog circuit R-AC1. The I/Q correction unit L1I/QCU corrects the mismatches detected and outputs a corrected digital I signal L1-CID and a corrected digital Q signal L1-CQD. The I/Q correction unit L2I/QCU detects gain, phase and DC offset mismatches caused over the path between the mixer and the variable amplifier in the I-signal system of the analog circuit R-AC2 and the path between the mixer and the variable amplifier in the Q signal system of the analog circuit R-AC1. The I/Q correction unit L2I/QCU corrects the mismatches detected and outputs a corrected digital I signal L2-CID and a corrected digital Q signal L2-CQD. The digital processing unit DOU2 generates base-band signals by digitally processing the corrected digital signals as required and transmits the base-band signals to the base-band processing unit BBU. When the corrected digital signals require no further digital processing, the digital processing unit DOU2 does not digitally process the corrected digital signals. In such a case, the corrected digital signals are used as demodulated base-band signals.

The I/Q correction unit L1I/QCU has correction coefficient setting registers L1I-I/QCUCCSRES and L1Q-I/QCUCCSRES. The correction coefficient setting register L1I-I/QCUCCSRES stores a correction coefficient L1I-I/QCUCC for processing the digital I signal L1R-ID. The correction coefficient setting register L1Q-I/QCUCCSRES stores a correction coefficient L1Q-I/QCUCC for processing the digital Q signal L1R-QD.

The I/Q correction unit L2I/QCU has correction coefficient setting registers L2I-I/QCUCCSRES and L2Q-I/QCUCCSRES. The correction coefficient setting register L2I-I/QCUCCSRES stores a correction coefficient L2I-I/QCUCC for processing the digital I signal L2R-ID. The correction coefficient setting register L2Q-I/QCUCCSRES stores a correction coefficient L2Q-I/QCUCC for processing the digital Q signal L2R-QD.

The internal configuration and operation of each of the above I/Q correction units are basically the same as those of the I/Q correction unit of the first embodiment, but the correction coefficient setting registers used for I/Q correction described above differ from those of the first embodiment. Excepting such different parts, the I/Q correction units of the present embodiment are basically the same as the I/Q correction unit, described with reference to FIG. 8, of the first embodiment. Obviously, since the input signals differ between the first embodiment and the present embodiment as described above, the signals internally processed also differ between the first embodiment and the present embodiment.

(2) Operation

The I/Q correction testing and the I/Q correction operation performed by each I/Q correction unit of the present embodiment are basically the same as those performed by the I/Q correction unit of the first embodiment. However, as described above, the receive digital signals inputted to the I/Q correction units and the corrected digital signals outputted from the I/Q correction units of the present embodiment differ from those inputted to and those outputted from the I/Q correction unit of the first embodiment. Furthermore, the correction coefficients for I/Q correction of the present embodiment described above differ from those of the first embodiment. Obviously, since the input signals differ between the first embodiment and the present embodiment as described above, the signals internally processed also differ between the first embodiment and the present embodiment.

(3) A/D Conversion Processing Mode (a) Path ½ Correction Mode

The digital correction unit DOU2 is further provided with an A/D conversion processing mode register ADCMRES. In the present embodiment, the A/D converter R-ADC described above performs A/D conversion processing as follows. In A/D conversion testing, the A/D converter R-ADC calculates a correction coefficient for A/D conversion using an analog I signal L1R-IA that is the path-1 I signal received from the first antenna ANT1 via the first analog circuit R-AC1 and an analog I signal L2R-IA that is the path-2 I signal received from the second antenna ANT2 via the second analog circuit R-AC2. Subsequently, in A/D conversion operation, the A/D converter R-ADC generates a digital I signal L1R-ID and a digital I signal L2R-ID by performing A/D conversion processing using the correction coefficient for A/D conversion calculated during the A/D conversion testing. The A/D converter R-ADC also performs the following A/D conversion processing. Namely, in A/D conversion testing, the A/D converter R-ADC calculates a correction coefficient for A/D conversion using an analog Q signal L1R-QA that is the path-1 Q signal received from the first antenna ANT1 via the first analog circuit R-AC1 and an analog Q signal L2R-QA that is the path-2 Q signal received from the second antenna ANT2 via the second analog circuit R-AC2. Subsequently, in A/D conversion operation, the A/D converter R-ADC generates a digital Q signal L1R-QD and a digital Q signal L2R-QD by performing A/D conversion processing using the correction coefficient for A/D conversion calculated during the A/D conversion testing. In this case, the path ½ correction mode has been set in the A/D conversion processing mode register ADCMRES. Mode setting in the A/D conversion processing mode register ADCMRES is made possible by the base-band processing unit BBU.

(b) I/Q Correction Mode

When the I/Q correction mode is set in the A/D conversion processing mode register ADCMRES, the A/D converter R-ADC operates as follows. In A/D conversion testing, the A/D converter R-ADC calculates a correction coefficient for A/D conversion using an analog I signal L1R-IA that is the path-1 I signal received from the first antenna ANT1 via the first analog circuit R-AC1 and an analog Q signal L1R-QA that is the path-1 Q signal received from the first antenna ANT1 via the first analog circuit R-AC1. Subsequently, in A/D conversion operation, the A/D converter R-ADC generates a digital I signal L1R-ID and a digital Q signal L1R-QD by performing A/D conversion processing using the correction coefficient for A/D conversion calculated during the A/D conversion testing. The A/D converter R-ADC also performs the following A/D conversion processing. Namely, in A/D conversion testing, the A/D converter R-ADC calculates a correction coefficient for A/D conversion using the analog I signal L2R-IA that is the path-2 I signal received from the second antenna ANT2 via the second analog circuit R-AC2 and an analog Q signal L2R-QA that is the path-2 Q signal received from the second antenna ANT2 via the second analog circuit R-AC2. Subsequently, in A/D conversion operation, the A/D converter R-ADC generates a digital I signal L2R-ID and a digital Q signal L2R-QD by performing A/D conversion processing using the correction coefficient for A/D conversion calculated during the A/D conversion testing.

To achieve the operation to be performed with the I/Q correction mode set in the A/D conversion processing mode register ADCMRES, the correction coefficients for A/D conversion stored in the correction coefficient setting registers for signal input/output and A/D conversion are changed as follows: (i) the output of the A/D conversion unit L1I-ADCU is inputted to the digital correction unit DCUQL1&L2; (ii) the output of the A/D conversion unit L2Q-ADCU is inputted to the digital correction unit DCUIL1&L2; (iii) the correction coefficient L1I-ADCCC is stored in the correction coefficient setting register L2Q-ADCCCSRES; (iv) the correction coefficient L2Q-ADCCC is stored in the correction coefficient setting register L1I-ADCCCSRES; (v) the digital Q signal L2R-QD is outputted from the digital correction unit DCUIL1&L2 and is inputted to the I/Q correction unit L2I/QCU; (vi) the digital I signal L1R-ID is outputted from the digital correction unit DCUQL1&L2 and is inputted to the I/Q correction unit L1I/QCU. In accordance with the above changes, the correction coefficients for A/D conversion stored in the correction coefficient setting registers for signal input/output and A/D conversion are changed both in the A/D conversion testing and in the A/D conversion operation, too. Since the signal inputted to the A/D converter R-ADC are changed, the signals processed in the A/D converter R-ADC are also changed.

4. Other Remarks

The operation of a communication system including the semiconductor integrated circuit device RFIC2 of the present embodiment is basically as described with reference to FIG. 6 for the first embodiment.

As for the analog circuit T-AC2 of the present embodiment, it differs from the corresponding analog circuit of the first embodiment concerning the clock pulse generator CPG and the loop switch circuit L-SC. In other respects, the analog circuit T-AC2 of the present embodiment is basically as described with reference to FIG. 5 for the first embodiment.

5. Summary

According to the present embodiment, the following operations and effects can be achieved.

(1) In the ADC correction mode ADC-CM (corresponding to the first mode in foreground correction), a common test signal ADC-TS is inputted to the A/D conversion units L1I-ADCU, L1Q-ADCU, L2I-ADCU, and L2Q-ADCU. The digital correction unit DCUIL1&L2 calculates the correction coefficients L1I-ADCCC and L2I-ADCCC by digitally processing the outputs of the A/D conversion units L1I-ADCU and L2I-ADCU. The digital correction unit DCUQL1&L2 calculates the correction coefficients L1Q-ADCCC and L2Q-ADCCC by digitally processing the outputs of the A/D conversion units L1Q-ADCU and L2Q-ADCU. Furthermore, in the I/Q correction mode I/QCU-CM or in the receive signal processing mode RSPM (corresponding to the second mode in foreground correction), the analog I signals L1R-IA and L2R-IA are digitally processed using the correction coefficients L1I-ADCCC and L2I-ADCCC calculated in the ADC correction mode ADC-CM, thereby causing the analog I signals L1R-IA and L2R-IA to be converted into and outputted as the digital I signals L1R-ID and L2R-ID, respectively. Similarly, the analog Q signals L1R-QA and L2R-QA are digitally processed using the correction coefficients L1Q-ADCCC and L2Q-ADCCC calculated in the ADC correction mode ADC-CM, thereby causing the analog Q signals L1R-QA and L2R-QA to be converted into and outputted as the digital Q signals L1R-QD and L2R-QD, respectively.

With the configuration and function described in (1) above provided, in the ADC correction mode ADC-CM, the A/D conversion units L1I-ADCU and L2I-ADCU and the digital correction unit DCUIL1&L2 are used to calculate the correction coefficients L1I-ADCCC and L2I-ADCCC. Furthermore, in the I/Q correction mode I/QCU-CM or in the receive signal processing mode RSPM, the A/D conversion units L1I-ADCU and L2I-ADCU and the digital correction unit DCUIL1&L2 are used to convert the analog I signals L1R-IA and L2R-IA to digital signals. Similarly, in the ADC correction mode ADC-CM, the A/D conversion units L1Q-ADCU and L2Q-ADCU and the digital correction unit DCUQL1&L2 are used to calculate the correction coefficients L1Q-ADCCC and L2Q-ADCCC. Furthermore, in the I/Q correction mode I/QCU-CM or in the receive signal processing mode RSPM, the A/D conversion units L1Q-ADCU and L2Q-ADCU and the digital correction unit DCUQL1&L2 are used to convert the analog Q signals L1R-QA and L2R-QA to digital signals. This makes it unnecessary to provide any additional circuit, which requires a large area, for calculating the correction coefficients L1I-ADCCC, L2I-ADCCC, L1Q-ADCCC, and L2Q-ADCCC, so that the semiconductor integrated circuit device can be kept small. Without such an additional circuit to occupy a large area incorporated, the power consumption in the ADC correction mode ADC-CM can be kept small.

(2) According to the configuration or function as described in (1) above, in the ADC correction mode ADC-CM, the correction coefficients L1I-ADCCC and L2I-ADCC are calculated based on the conversion error that is calculated based on the difference between the output from the A/D conversion unit L1I-ADCU and the output from the A/D conversion unit L2I-ADCU. Similarly, in the ADC correction mode ADC-CM, the correction coefficients L1Q-ADCCC and L2Q-ADCC are calculated based on the conversion error that is calculated based on the difference between the output from the A/D conversion unit L1Q-ADCU and the output from the A/D conversion unit L2Q-ADCU.

With the configuration or function described in (2) above provided, in the ADC correction mode ADC-CM, the correction coefficients L1I-ADCCC and L2I-ADCCC are calculated based on the conversion error that is calculated based on the difference between the output from the A/D conversion unit L1I-ADCU and the output from the A/D conversion unit L2I-ADCU. The correction coefficients L1I-ADCCC and L2I-ADCCC are both calculated based on the common conversion error. Similarly, the correction coefficients L1Q-ADCCC and L2Q-ADCCC are both calculated based on the conversion error that is calculated based on the difference between the output from the A/D conversion unit L1Q-ADCU and the output from the A/D conversion unit L2Q-ADCU. Both the correction coefficients L1Q-ADCCC and L2Q-ADCCC are calculated based on the common conversion error. In the I/Q correction mode I/QCU-CM or in the receive signal processing mode RSPM, the A/D conversion unit R-ADC performs A/D conversion operation using the correction coefficients L1I-ADCCC and L2I-ADCCC. Similarly, the A/D conversion unit R-ADC performs A/D conversion operation using the correction coefficients L1Q-ADCCC and L2Q-ADCCC. Since the correction coefficients L1I-ADCCC and L2I-ADCCC calculated based on the common conversion error are used, the conversion gain mismatch between the digital I signal L1R-ID and the digital I signal L2R-ID is reduced. Similarly, since the correction coefficients L1Q-

ADCCC and L2Q-ADCCC calculated based on the common conversion error are used, the conversion gain mismatch between the digital Q signal L1R-QD and the digital Q signal L2R-QD is reduced.

(3) According to the configuration or function described in (2) above, when the path ½ correction mode is set in the A/D conversion processing mode register ADCMRES, operation takes place based on the configuration and function as described in (1) and (2) above. When the I/Q correction mode is set in the A/D conversion processing mode register ADCMRES, the correction coefficients for A/D conversion stored in the correction coefficient setting register for signal input/output and A/D conversion are changed as described in (3) (b) (i) to (3) (b) (vi) above. Also, the I/Q correction units L1I/QCU and L2I/QCU are provided.

With the configuration or function described in (3) above provided, the following conditions are realized. (i) The I/Q correction unit L1I/QCU detects gain, phase and DC offset mismatches caused over the path between the mixer and the variable amplifier in the I-signal system of the analog circuit R-AC1 and the path between the mixer and the variable amplifier in the Q signal system of the analog circuit R-AC1. As a result, such mismatches are adequately reduced. (ii) The I/Q correction unit L2I/QCU detects gain, phase and DC offset mismatches caused over the path between the mixer and the variable amplifier in the I-signal system of the analog circuit R-AC2 and the path between the mixer and the variable amplifier in the Q signal system of the analog circuit R-AC2. As a result, such mismatches are adequately reduced. (iii) The conversion gain mismatch between the digital I signal L1R-ID and the digital I signal L2R-ID and the conversion gain mismatch between the digital Q signal L1R-QD and the digital Q signal L2R-QD hinder improvement of the accuracy of demodulation operation for generating base-band signals. When the conditions like (i) to (iii) above are present, it is possible to set the path ½ correction mode in the A/D conversion processing mode register ADCMRES.

When the conversion gain mismatch is not adequately reduced by operation of the I/Q correction unit L1I/QCU or L2I/QCU, setting the I/Q correction mode in the A/D conversion processing mode register ADCMRES makes it possible to reduce the conversion gain mismatch between the digital I signal L1R-ID and the digital Q signal L1R-QD and between the digital I signal L2R-ID and the digital Q signal L2R-QD and to improve the accuracy of demodulation operation for generating base-band signals.

Note that the A/D conversion units of examples 1 to 3 of the first embodiment can be appropriately applied to the second embodiment. Also, even though the communication system of the second embodiment is assumed to handle single-phase signals, making it a communication system to handle differential signals does not cause any problem. Furthermore, the correction coefficient averaging units for A/D converter of modification example 1 of the first embodiment may be appropriately used as circuits to be coupled to the digital correction units DCUIL1&L2 and DCUQL1&L2. Still furthermore, the test signal generation circuit ADC-TSGC of examples 4 to 6 of the first embodiment may be appropriately used as a circuit for generating a test signal ADC-TS for the second embodiment.

The invention made by the present inventors has been described in detail based on embodiments, but the invention is not limited to the embodiments and, obviously, the invention can be modified in various ways without departing from the scope of the invention.

What is claimed is:

1. A semiconductor integrated circuit device comprising:
   a first analog circuit which outputs a first analog signal and a second analog signal differing in phase from the first analog signal;
   a first A/D converter which receives the first analog signal from the first analog circuit and outputs a first digital signal;
   a second A/D converter which receives the second analog signal from the first analog circuit and outputs a second digital signal;
   a digital processing circuit which receives the first and second digital signals from the first and second A/D converters and digitally processes the first and second digital signals received;
   a mode setting information storing circuit for storing mode information; and
   a correction coefficient storing circuit which stores correction coefficients for the first and second A/D converters,
   wherein, when a first mode is set in the mode setting information storing circuit, a first correction coefficient for a first digital correction processing and a second correction coefficient for a second digital correction processing are calculated by having a first test signal inputted to both the first and second A/D converters, and
   wherein, when a second mode is set in the mode setting information storing circuit, the first and second analog signals are outputted from the first analog circuit, the first A/D converter converts the first analog signal into the first digital signal by subjecting the first analog signal to the first digital correction processing using the first correction coefficient stored in the correction coefficient storing circuit, and the second A/D converter converts the second analog signal into the second digital signal by subjecting the second analog signal to the second digital correction processing using the second correction coefficient stored in the correction coefficient storing circuit.

2. The semiconductor integrated circuit device according to claim 1, wherein, in the first mode, a first predetermined voltage is applied to the first A/D converter in addition to the first test signal and a second predetermined voltage is applied to the second A/D converter in addition to the first test signal.

3. The semiconductor integrated circuit device according to claim 1, further comprising:
   a first switch circuit which receives the first analog signal and the first test signal and makes switching for output between the first analog signal and the first test signal, and
   a second switch circuit which receives the second analog signal and the first test signal and makes switching for output between the second analog signal and the first test signal,
   wherein the first analog circuit receives a communication signal from outside and outputs the first and second analog signals,
   wherein the first A/D converter includes a first A/D conversion unit to which the first analog signal is inputted and which outputs a third digital signal and a first digital correction unit which receives the third digital signal and outputs the first digital signal,
   wherein the second A/D converter includes a second A/D conversion unit to which the second analog signal is inputted and which outputs a fourth digital signal and a second digital correction unit which receives the fourth digital signal and outputs the second digital signal,
   wherein, in the first mode, the first test signal is outputted from each of the first and second switch circuits and is inputted to each of the first and second A/D converters, causing a difference output to be calculated based on a difference between the first digital signal from the first digital correction unit and the second digital signal from the second digital correction unit, and causing the first correction coefficient for the first digital correction unit and the second correction coefficient for the second digital correction unit to be calculated based on the difference output, and wherein, in the second mode, the first analog signal is outputted from the first switch circuit, the second analog signal is outputted from the second switch circuit, the first digital correction unit subjects the third digital signal to the first digital correction processing using the first correction coefficient and outputs the first digital signal, and the second digital correction unit subjects the fourth digital signal to the second digital correction processing using the second correction coefficient and outputs the second digital signal.

4. The semiconductor integrated circuit device according to claim 3, wherein the first analog signal is an I signal, the second analog signal is a Q signal, the communication signal is a modulated high-frequency signal received from outside, the first analog circuit generates the I signal by subjecting the high-frequency signal to a first conversion processing, and the first analog circuit generates the Q signal by subjecting the high-frequency signal to a second conversion processing.

5. The semiconductor integrated circuit device according to claim 4, wherein the first analog circuit includes:
a first amplifier which receives and amplifies the high-frequency signal;
a first mixer which mixes a first output from the first amplifier and a first high-frequency signal of a predetermined frequency thereby to perform down-converting;
a first filter which passes for output a first frequency range of a second output of the first mixer;
a first variable amplifier which amplifies a third output of the first filter at a variable magnification and outputs the I signal;
a second mixer which mixes the first output of the first amplifier and a second high-frequency signal having the predetermined frequency and shifted in phase 90 degrees from the first high-frequency signal, thereby to perform down-converting;
a second filter which passes for output a predetermined second frequency range of a fourth output of the second mixer;
a second variable amplifier which amplifies a fifth output of the second filter at a variable magnification and outputs the Q signal; and
an oscillator circuit which generates the first and second high-frequency signals,
wherein the first switch circuit is provided between the first variable amplifier and the first A/D converter and the second switch circuit is provided between the second variable amplifier and the second A/D converter.

6. The semiconductor integrated circuit device according to claim 4, wherein an initial sequence period in which initial settings are made on the semiconductor integrated circuit device and in which the first analog circuit is calibrated is followed by a normal operation period which corresponds to the second mode and in which the high-frequency signal is converted into a base-band signal.

7. The semiconductor integrated circuit device according to claim 6, wherein a testing period corresponding to the first mode in which the first test signal is inputted to both the first and second A/D conversion units is allocated to the initial sequence period, and
wherein the normal operation period is provided to follow the initial sequence period.

8. The semiconductor integrated circuit device according to claim 7, wherein the testing period is also allocated to a no-signal period during which the high-frequency signal from outside is not inputted, and
wherein the no-signal period and the normal operation period are periodically alternated.

9. The semiconductor integrated circuit device according to claim 4, further comprising:
a coefficient search unit which calculates the first and second correction coefficients based on the difference output;
a first correction coefficient averaging circuit which, when the first mode is set in the mode setting information storing circuit, receives a plurality of third correction coefficients for the first A/D converter outputted at different times from the coefficient search unit and outputs the first correction coefficient generated by averaging the third correction coefficients; and
a second correction coefficient averaging circuit which, when the first mode is set in the mode setting information storing circuit, receives a plurality of fourth correction coefficients for the second A/D converter outputted at different times from the coefficient search unit and outputs the second correction coefficient generated by averaging the fourth correction coefficients.

10. The semiconductor integrated circuit device according to claim 4, further comprising: a digital waveform generation circuit which outputs a predetermined digital waveform; and a first D/A converter which receives the predetermined digital waveform and outputs the first test signal generated by subjecting the predetermined digital waveform to D/A conversion processing.

11. The semiconductor integrated circuit device according to claim 4, further comprising: a charge pump which receives a predetermined clock signal and outputs a predetermined drive signal; and an analog integrator which receives the predetermined drive signal and outputs the first test signal that has a triangular waveform.

12. The semiconductor integrated circuit device according to claim 11:
wherein the charge pump has:
a first current source which receives a supply voltage at one end thereof;
a PMOS having a first source terminal and a first drain terminal, the first source terminal being coupled with the other end of the first current source;
an NMOS having a second source terminal and a second drain terminal, the second drain terminal being coupled with the first drain terminal; and
a second current source one end of which is coupled with the second source terminal and which receives a ground voltage at the other end thereof,
wherein, when a predetermined clock signal is inputted to a gate of each of the PMOS and the NMOS, the predetermined drive signal is outputted from each of the first and second drain terminals, and wherein the analog integrator has:
an operational amplifier to a first input terminal of which a predetermined voltage is inputted, to a second input terminal of which the predetermined drive signal is inputted, and which outputs the first test signal having a triangular waveform;
a predetermined capacitor one end of which is coupled with the second input terminal of the operational amplifier and the other end of which is coupled with an output terminal of the operational amplifier; and
a predetermined resistor parallel-coupled with the predetermined capacitor.

13. The semiconductor integrated circuit device according to claim 12, further comprising a first loop circuit, the first loop circuit including:
the charge pump that receives the predetermined clock signal and outputs the predetermined drive signal;
the analog integrator that receives the predetermined drive signal and outputs the first test signal having a triangular waveform;
the first A/D converter that receives the first test signal and outputs the first predetermined digital signal;
the second A/D converter that receives the first test signal and outputs the second predetermined digital signal;
an averaging circuit that receives the first and second predetermined digital signals, generates an averaged output signal by averaging the first and second predetermined digital signals, and outputs the averaged output signal; and
a charge pump control circuit that receives the averaged output signal, generates, when the averaged output signal reaches a first threshold, a first level signal, generates, when the averaged output signal reaches a second threshold different from the first threshold, a second level signal different from the first level signal, and generates the predetermined clock signal so as to cause the averaged output signal to remain between the first threshold and the second threshold.

14. A semiconductor integrated circuit device comprising:
a first A/D converter which receives a first analog signal and, after subjecting the first analog signal to a first digital correction processing, outputs a first digital signal;
a second A/D converter which receives a second analog signal differing in phase from the first analog signal and, after subjecting the second analog signal to a second digital correction processing, outputs a second digital signal;
a first correction coefficient storing circuit for storing correction coefficients for the first and second A/D converters;
a digital error correction circuit which receives the first and second digital signals and, based on phase, gain and DC offset mismatches between the first analog signal and the second analog signal, generates a first digital demodulated signal by correcting the first digital signal and generates a second digital demodulated signal by correcting the second digital signal; and
a mode setting information storing circuit for storing mode information,
wherein, when a first mode is set in the mode setting information storing circuit, a first correction coefficient for the first digital correction processing and a second correction coefficient for the second digital correction processing are calculated by having a first test signal inputted to both the first and second A/D converters, and wherein, when a second mode is set in the mode setting information storing circuit, the first A/D converter converts the first analog signal into the first digital signal using the first correction coefficient stored in the first correction coefficient storing circuit and the second A/D converter converts the second analog signal into the second digital signal using the second correction coefficient stored in the first correction coefficient storing circuit.

15. The semiconductor integrated circuit device according to claim 14,
wherein the digital error correction circuit is provided with the second correction coefficient storing circuit,
wherein, when a third mode is set in the mode setting information storing circuit, a third correction coefficient for use in the digital error correction circuit to subject the first digital signal to a first error correction and a fourth correction coefficient for use in the digital error correction circuit to subject the second digital signal to a second error correction are generated and stored in the second correction coefficient storing circuit, and
wherein, when the second mode is set in the mode setting information storing circuit, the first and second digital demodulated signals are generated by having the third and fourth correction coefficients used in the digital error correction circuit.

16. The semiconductor integrated circuit device according to claim 14, further comprising:
an I/Q signal generation circuit which receives a modulated high-frequency signal from outside and outputs an I signal as the first analog signal and a Q signal as the second analog signal;
a first switch circuit which receives the I signal and the first test signal and makes switching for output between the I signal and the first test signal; and
a second switch circuit which receives the Q signal and the first test signal and makes switching for output between the Q signal and the first test signal,
wherein the first A/D converter has: a first A/D conversion unit which receives the I signal and outputs a third digital signal; and a first digital correction circuit which receives the third digital signal and, by subjecting the third digital signal to the first digital correction processing, outputs the first digital signal,
wherein the second A/D converter has: a second A/D conversion unit which receives the Q signal and outputs a fourth digital signal; and a second digital correction circuit which receives the fourth digital signal and, by subjecting the fourth digital signal to the second digital correction processing, outputs the second digital signal,
wherein, when the first mode is set in the mode setting information storing circuit, the first test signal is outputted from each of the first and second switch circuits to be inputted to each of the first and second A/D conversion units, causing a difference output to be calculated based a difference between the first digital signal outputted from the first digital correction unit and the second digital signal outputted from the second digital correction unit, and causing the first correction coefficient for the first digital correction circuit and the second correction coefficient for the second digital correction circuit to be calculated based on the difference output, and
wherein, when the second mode is set in the mode setting information storing circuit, the I signal is outputted from and first switch circuit and the Q signal is outputted from the second switch circuit.

17. The semiconductor integrated circuit device according to claim 16,
- wherein a first testing period corresponding to the first mode is allocated to an initial sequence period in which initial settings are made on the semiconductor integrated circuit device and the I/Q signal generation circuit is calibrated,
- wherein a normal operation period corresponding to the second mode in which the high-frequency signal is converted into a base-band signal is provided to follow the initial sequence period, and
- wherein a plurality of second testing periods, each corresponding to the third mode, are provided to precede a plurality of the normal operation periods, respectively.

18. The semiconductor integrated circuit device according to claim 17,
- wherein the first and second testing periods are also allocated to a no-signal period during which the high-frequency signal from outside is not inputted,
- wherein the no-signal period and the normal operation period are periodically alternated, and
- wherein the second testing period is provided between the first testing period and the normal operation period.

19. The semiconductor integrated circuit device according to claim 18, further comprising a period setting storing circuit which sets a frequency and length of each of the first and second testing periods.

20. The semiconductor integrated circuit device according to claim 19,
- wherein the period setting storing circuit can set a length of the first testing period in the initial sequence period, set whether the first testing period is provided in each no-signal period or in every Nth (N being a positive integer of 2 or larger) no-signal period, set a length of the first testing period in the no-signal period, set whether the second testing period is provided in each no-signal period or in every Nth no-signal periods, and set a length of the second testing period in the no-signal period.

* * * * *